(12) United States Patent
Kasakura et al.

(10) Patent No.: US 8,410,714 B2
(45) Date of Patent: Apr. 2, 2013

(54) ILLUMINATING DEVICE

(75) Inventors: Akeo Kasakura, Tokyo (JP); Yoshihito Satou, Ibaraki (JP)

(73) Assignee: Mitsubishi Chemical Corporation, Tokyo (JP)

( * ) Notice: Subject to any disclaimer, the term of this patent is extended or adjusted under 35 U.S.C. 154(b) by 181 days.

(21) Appl. No.: 12/742,515

(22) PCT Filed: Nov. 12, 2008

(86) PCT No.: PCT/JP2008/070607
§ 371 (c)(1),
(2), (4) Date: Aug. 11, 2010

(87) PCT Pub. No.: WO2009/063915
PCT Pub. Date: May 22, 2009

(65) Prior Publication Data
US 2010/0295464 A1    Nov. 25, 2010

(30) Foreign Application Priority Data

Nov. 12, 2007  (JP) ............................... P2007-293602
Mar. 6, 2008   (JP) ............................... P2008-056336

(51) Int. Cl.
*H05B 41/24* (2006.01)
*H05B 37/02* (2006.01)
*F21V 9/00* (2006.01)

(52) U.S. Cl. .......................... 315/287; 315/294; 362/235

(58) Field of Classification Search .................. None
See application file for complete search history.

(56) References Cited

U.S. PATENT DOCUMENTS

2003/0189665 A1  10/2003  Yamada
2004/0183380 A1   9/2004  Otake
(Continued)

FOREIGN PATENT DOCUMENTS

EP          1 867 695 A1    12/2007
JP          7-73711         3/1995
(Continued)

OTHER PUBLICATIONS

Mayuko Uno, "Sharp Prototypes Led Module Which Can Reproduce Various Natural Light", http://techon.nikkeibp.co.jp/article/NEWS/20070704/135373, Articles on Tech-on in Nikkei BPnet, Electronic Parts, 21:43, Jul. 4, 2007, 5 pages (with unedited computer-generated English translation).

(Continued)

*Primary Examiner* — Crystal L Hammond
(74) *Attorney, Agent, or Firm* — Oblon, Spivak, McClelland, Maier & Neustadt, L.L.P.

(57) ABSTRACT

An illuminating device comprising semiconductor light-emitting devices employing a semiconductor light-emitting element, wherein outputted light is stably combined, separation of light is inhibited, and color tone is variable. Control for operating the light-emitting devices is as simple as possible. It is an illuminating device comprising a light-emitting part comprising a plurality of kinds of semiconductor light-emitting devices which differ in emission color are integrated and arranged, the semiconductor light-emitting devices comprising a semiconductor light-emitting element and a phosphor, and wherein the semiconductor light-emitting devices emit light outward on the basis of an emission from the semiconductor light-emitting element and an emission from the phosphor which is excited by said emission from the semiconductor light-emitting element to fluoresce or on the basis of an emission from the phosphor which is excited by an emission from the semiconductor light-emitting element to fluoresce, wherein the semiconductor light-emitting devices each have an emission color, the deviation duv of which from a blackbody radiation locus being within a range of $-0.02 \leq duv \leq 0.02$, in the uv chromaticity diagram according to UCS (u,v) color system (CIE 1960), and outputted lights from the light-emitting part in which the plurality of kinds of the semiconductor light-emitting devices are integrated and arranged, are mixed together and emitted outward.

26 Claims, 28 Drawing Sheets

U.S. PATENT DOCUMENTS

| | | |
|---|---|---|
| 2005/0030744 A1 | 2/2005 | Ducharme et al. |
| 2005/0052378 A1 | 3/2005 | Hacker |
| 2006/0245188 A1 | 11/2006 | Takenaka |
| 2009/0002604 A1 | 1/2009 | Morimoto |

FOREIGN PATENT DOCUMENTS

| | | | | |
|---|---|---|---|---|
| JP | 11-73923 | | | 3/1999 |
| JP | 2003-299109 | | | 10/2003 |
| JP | 2004-274872 | | | 9/2004 |
| JP | 2004274872 | A | * | 9/2004 |
| JP | 2005-57272 | | | 3/2005 |
| JP | 2005-100799 | | | 4/2005 |
| JP | 2005100799 | A | * | 4/2005 |
| JP | 2006-4839 | | | 1/2006 |
| JP | 2006-310613 | | | 11/2006 |
| JP | 2007-27310 | | | 2/2007 |
| JP | 2007-59260 | | | 3/2007 |
| JP | 2007-80880 | | | 3/2007 |
| JP | 2007080880 | A | * | 3/2007 |
| JP | 2007-122950 | | | 5/2007 |
| JP | 2007-265818 | | | 10/2007 |
| JP | 2007-266314 | | | 10/2007 |
| JP | 2007-291353 | | | 11/2007 |
| JP | 2007-299590 | | | 11/2007 |
| JP | 2007291353 | A | * | 11/2007 |
| JP | 2008-218485 | | | 9/2008 |
| JP | 2008-283155 | | | 11/2008 |
| WO | WO 2007/114614 A1 | | | 10/2007 |

OTHER PUBLICATIONS

Chinese Office Action issued Oct. 14, 2011 in patent application No. 200880115695.0 (with English-language translation).

Office Action issued Aug. 3, 2012 in Chinese Patent Application No. 200880115695.0 with English language translation.

Office Action issued Nov. 23, 2012, in Australian patent application No. 2008321873 filed Nov. 12, 2008.

* cited by examiner

| W1 | W3 | W2 |
|----|----|----|
| W2 | W1 | W3 |
| W3 | W2 | W1 |

W1=3
W2=3
W3=3

(b)

| W1 | W2 | W1 |
|----|----|----|
| W2 | W3 | W2 |
| W1 | W2 | W1 |

W1=4
W2=4
W3=1

(c)

| W2 | W1 | W3 |
|----|----|----|
| W1 | W2 | W1 |
| W3 | W1 | W2 |

W1=4
W2=3
W3=2

(d)

| W1 | W2 | W1 |
|----|----|----|
| W3 | W1 | W3 |
| W1 | W2 | W1 |

| W1 | W2 | W3 |
|----|----|----|
| W1 | W2 | W3 |
| W1 | W2 | W3 |

W1=3
W2=3
W3=3

(b)

| W1 | W3 | W2 |
|----|----|----|
| W2 | W3 | W1 |
| W1 | W3 | W1 |

W1=3
W2=3
W3=3

(c)

| W1 | W3 | W2 |
|----|----|----|
| W2 | W1 | W3 |
| W3 | W2 | W1 |

W1=3
W2=3
W3=3

(d)

| W3 | W2 | W1 |
|----|----|----|
| W2 | W1 | W3 |
| W3 | W2 | W1 |

W1=3
W2=3
W3=3

FIG. 7
(a)
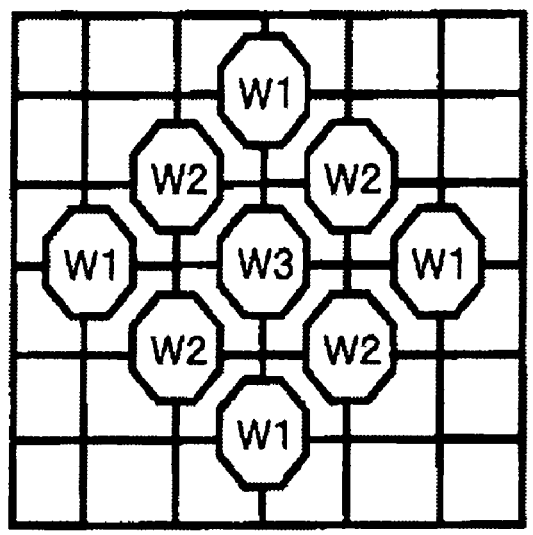
(b)
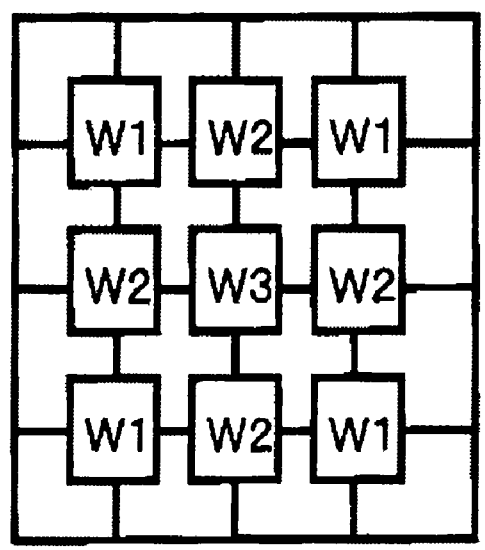

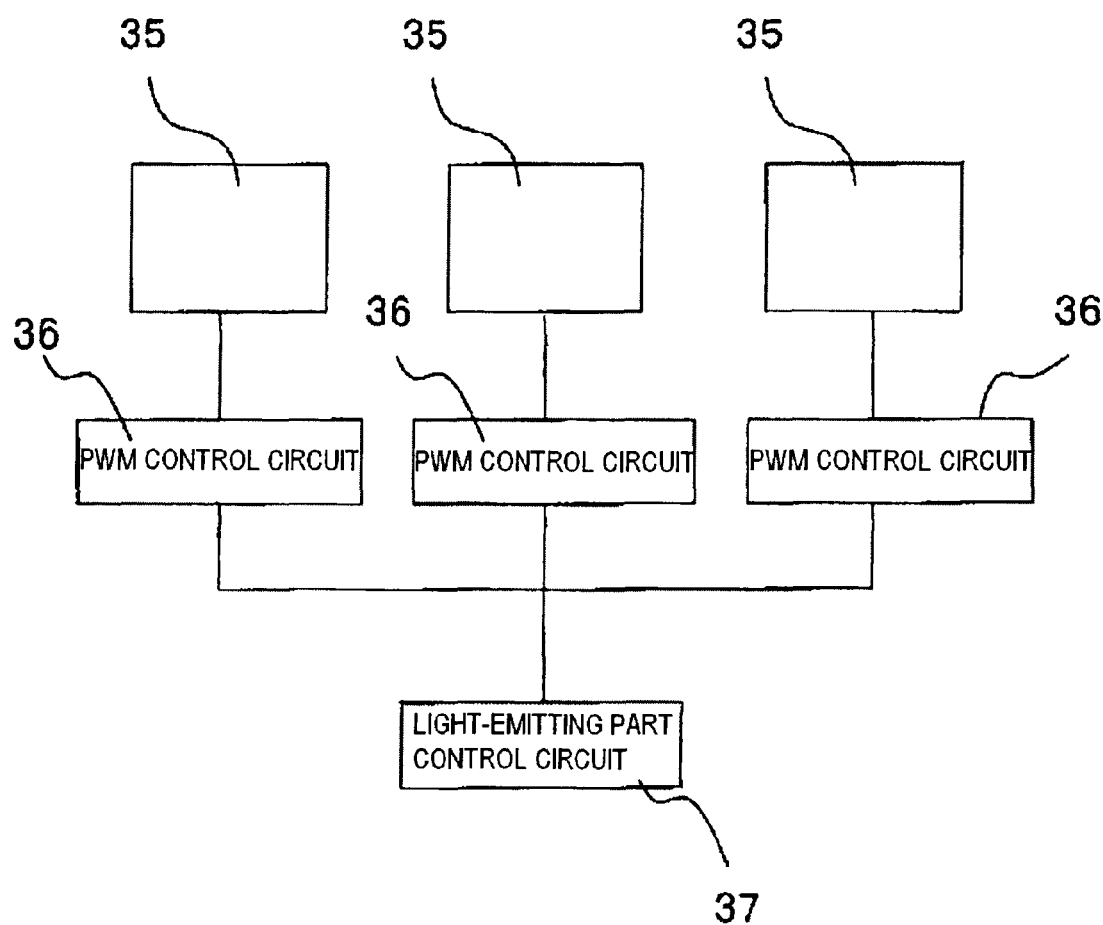

FIG. 17
(a)
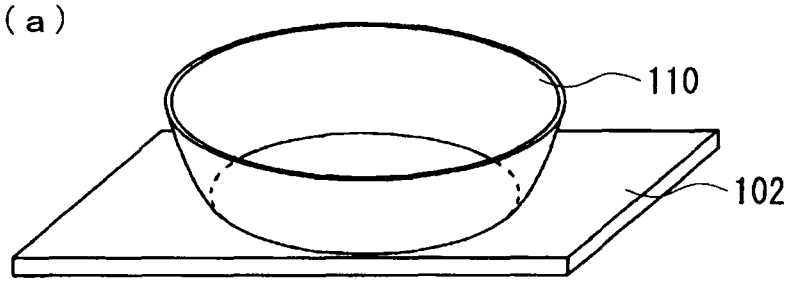
(b)
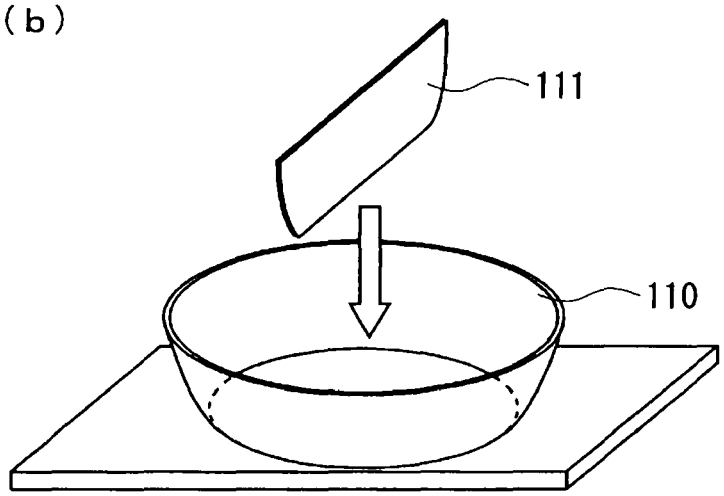
(c)
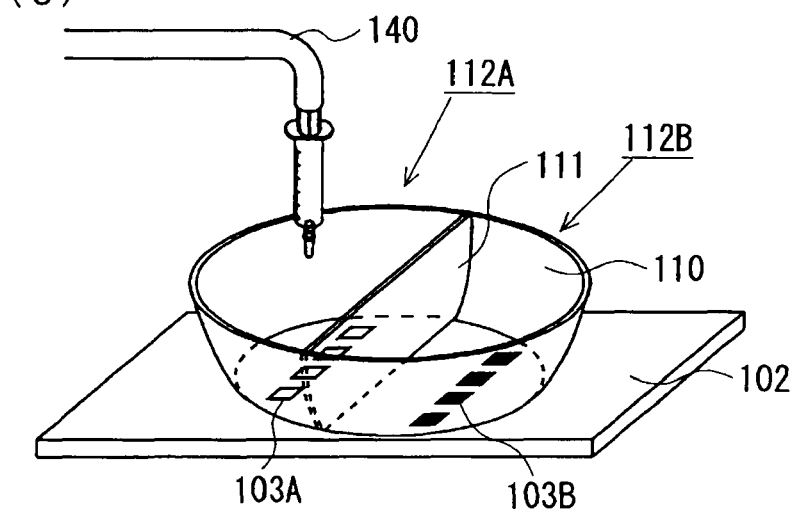

FIG. 18
(a)
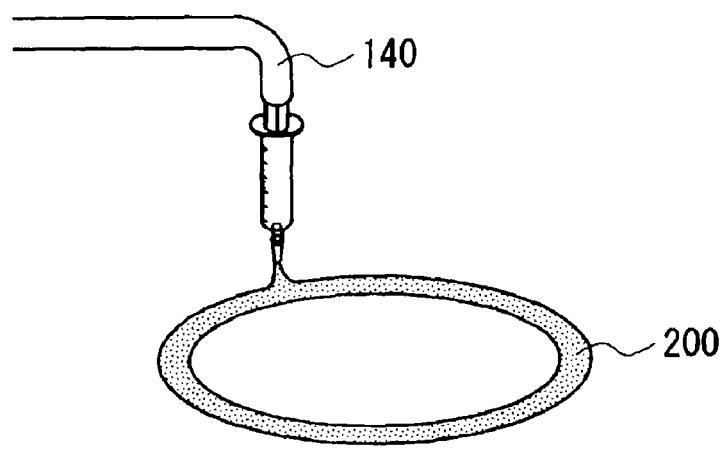
(b)
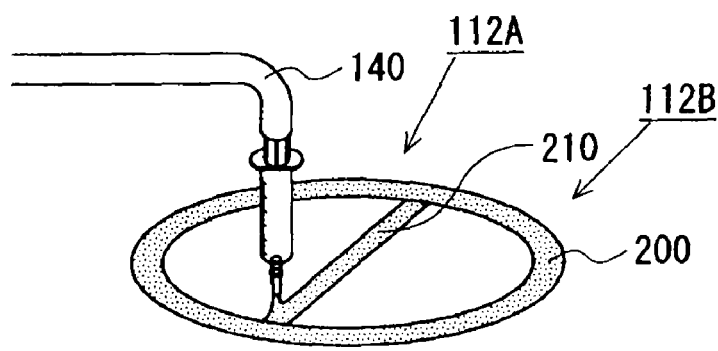
(c)
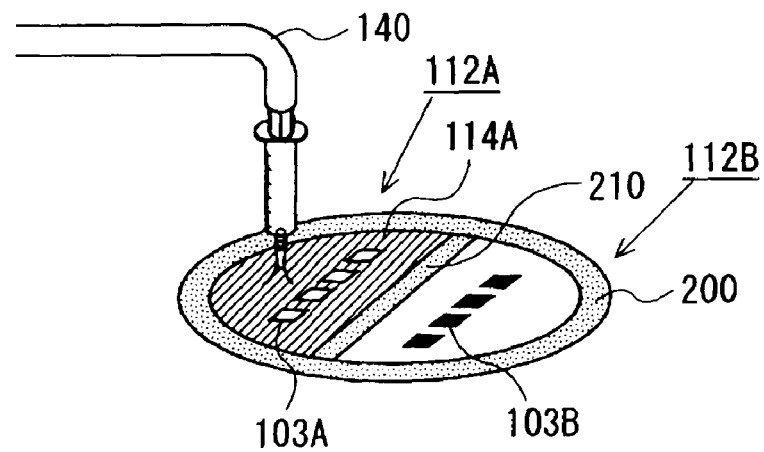

FIG. 21
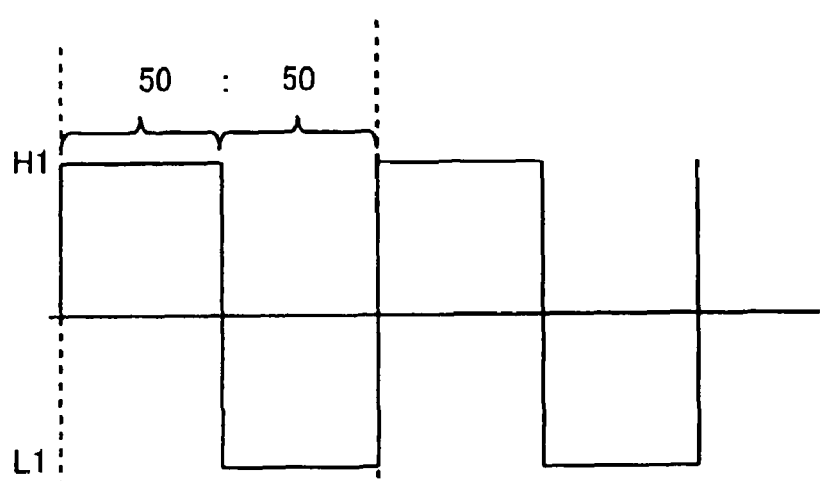
(a)
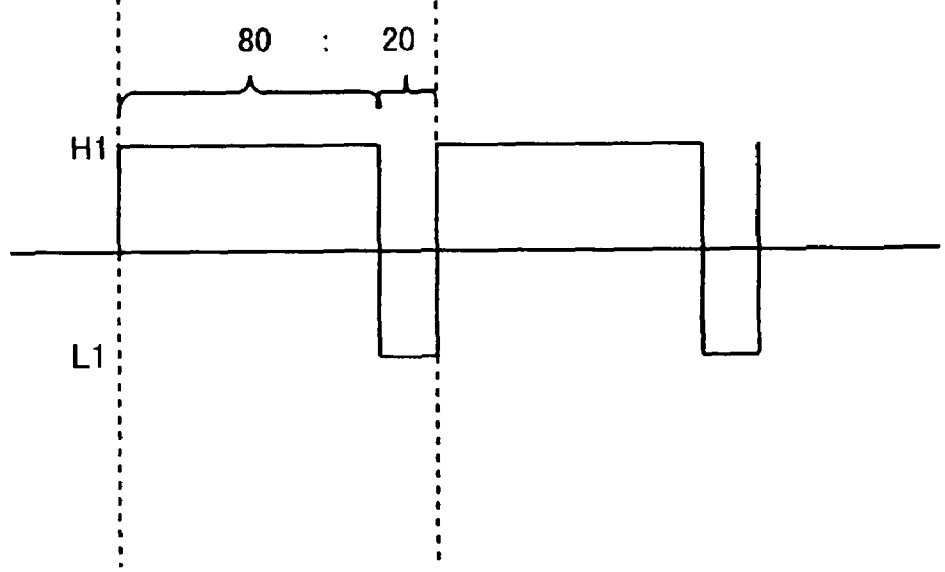
(b)

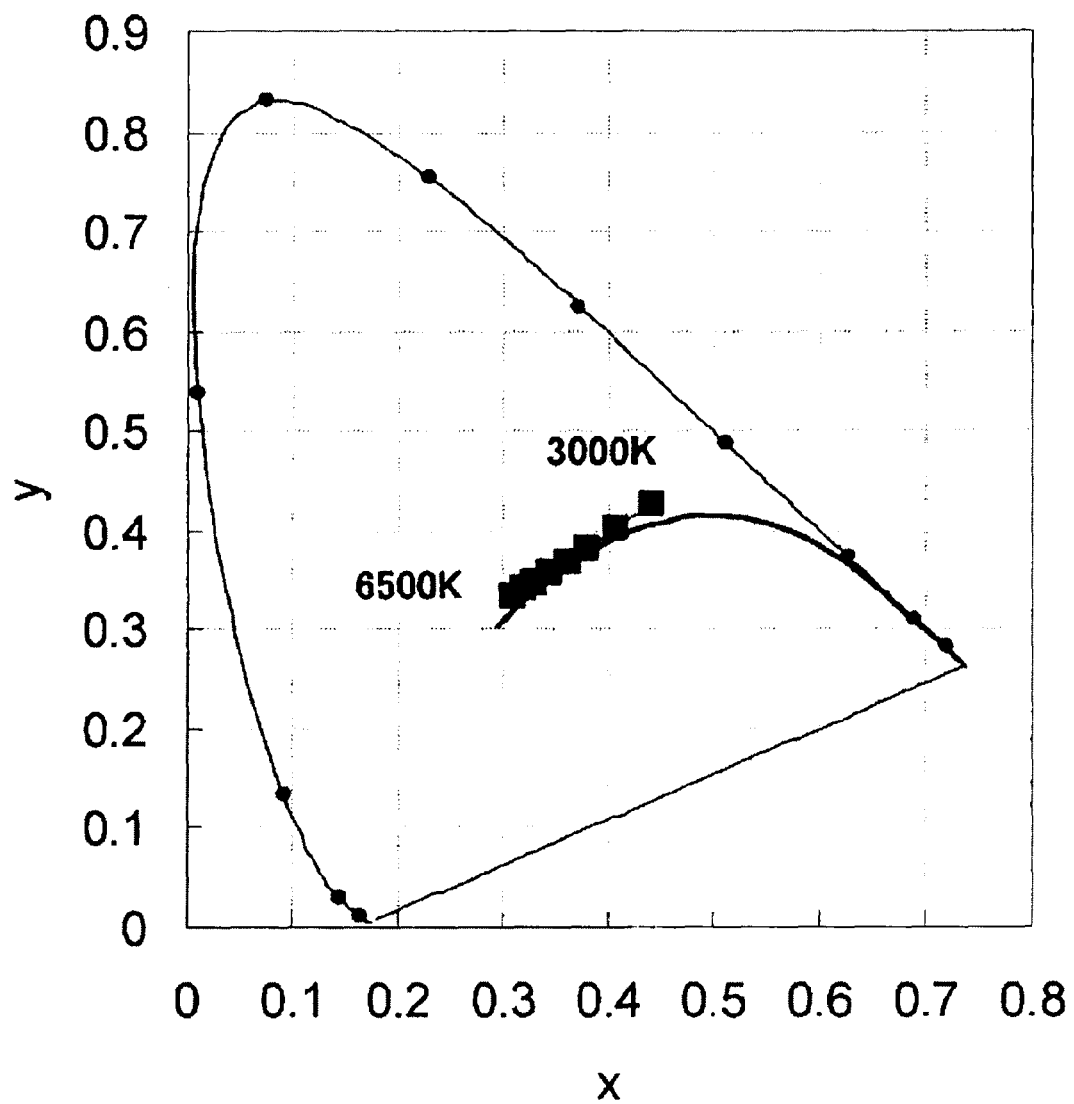

ILLUMINATING DEVICE

TECHNICAL FIELD

The present invention relates to an illuminating device comprising semiconductor light-emitting devices which emit light outward on the basis of emission from semiconductor light-emitting elements.

BACKGROUND ART

Various kinds of illuminating devices comprising phosphors have conventionally been used as illuminating devices emitting white light. In recent years, however, new light sources comprising inorganic EL (electro luminescence), organic EL (OLED (organic light emitting diode)), and semiconductor light-emitting elements such as light-emitting diodes have been developed, and illuminating devices employing these light sources are also being developed.

For example, patent document 1 discloses an illuminating device which comprises three kinds of light-emitting diodes, as light-emitting devices, that emit light of blue, green, and red colors respectively and in which white light is obtained by mixing the light emitted from the three kinds of light-emitting diodes. The illuminating device disclosed in patent document 1 further comprises a current regulation circuit with which values of operating current to be supplied to the three kinds of light-emitting diodes are changed according to forward voltages applied to the three kinds of light-emitting diodes. This illuminating device has been configured so that a white balance can be regulated according to the characteristics of each light-emitting diode.

However, light-emitting diodes have a relatively narrow emission spectrum width and, hence, illuminating devices employing light-emitting diodes as light-emitting devices disadvantageously have reduced color rendering properties, which are important in general illumination.

Patent document 2 discloses an illuminating device employing light-emitting devices in which light from a light-emitting diode is changed in wavelength with a phosphor. Specifically, patent document 2 shows an example of an illuminating device which comprises (a) a blue-light-emitting device comprising a blue-light-emitting diode, (b) a green-light-emitting device based on a combination of a blue-light-emitting diode and a green phosphor which is excited by blue light from the blue diode to emit green light, and (c) a red-light-emitting device based on a combination of a blue-light-emitting diode and a red phosphor which is excited by blue light from the blue-light-emitting diode to emit red light. By thus converting the emission from a light-emitting diode in wavelength with a phosphor, color rendering properties are improved. Patent document 2 further describes changing emission color by regulating the output of the light-emitting devices for the respective colors.

LEDs are expected to be used also as light sources for tone-variable illumination, which has been difficult to realize with conventional light sources. Disclosed as one example thereof is an illuminating device in which a red LED, a green LED, and a blue LED have been configured to form one package to thereby output white light (see, for example, patent document 3). This technique includes a contrivance in which an operating current to be supplied to the three kinds of LEDs is regulated according to a forward voltage applied to each LED to thereby keep the emission efficiency of each LED constant and stabilize the luminance of white light and to thereby emit light having various color tones.

As an illumination technique utilizing LEDs, a technique has been disclosed in which semiconductor light-emitting devices emitting red, blue, and green light using blue LEDs and phosphors for emitting red and green light are used in combination and the output of the LEDs is controlled to thereby trace a blackbody radiation locus and emit white light akin to natural light (see, for example, patent documents 3 to 5, non-patent document 1, etc.). In patent documents 6 to 10 also, illuminating devices employing various LEDs are proposed.

Patent Document 1: JP-A-2006-4839
Patent Document 2: JP-A-2007-122950
Patent Document 3: JP-A-2007-59260
Patent Document 4: JP-A-2007-265818
Patent Document 5: JP-A-2007-299590
Patent Document 6: JP-A-2007-27310
Patent Document 7: JP-A-2005-57272
Patent Document 8: JP-A-2006-310613
Patent Document 9: JP-A-2007-80880
Patent Document 10: JP-A-2007-266314
Non-Patent Document 1: http://techon.nikkeibp.co.jp/article/NEWS/20070704/135373/(articles on Tech-on in Nikkei BPnet)

DISCLOSURE OF THE INVENTION

Problems that the Invention is to Solve

As described above, the illuminating devices disclosed in patent documents 1 and 2 include light-emitting devices of three colors, and white light is obtained by mixing these three colors. Because of this, although the illuminating light obtained by color mixing is white, the light of blue, green, and red colors which has not been mixed together is observed when the light-emitting part of the illuminating device is directly viewed. Namely, the viewer feels a sense of uncomfortableness. In these illuminating devices, the three kinds of outputted light from the semiconductor light-emitting elements are combined to thereby emit light such as, e.g., white light. However, since semiconductor light-emitting elements generally have a narrow orientation angle, it is difficult to combine the respective kinds of outputted light from semiconductor light-emitting elements and there are cases where light separation occurs at surfaces irradiated with the synthesized light. Consequently, when an object is illuminated, the resultant shadow is accompanied, around the periphery thereof, with blue, green, and red shadows depending on the positions of the respective light-emitting elements. This case also gives a sense of uncomfortableness as compared with the case where the object is illuminated with a single white-light source.

Furthermore, although the illuminating devices disclosed in patent documents 1 and 2 are changed in emission color by regulating the output of each light-emitting device, complicated control is necessary for mixing blue light, green light, and red light to change the light of the three colors so as to have a desired emission color. For example, in an illuminating device in which a red semiconductor light-emitting element, a green semiconductor light-emitting element, and a blue semiconductor light-emitting element are directly used as light sources, it is necessary for obtaining desired outputted light that the voltage and current to be supplied to each semiconductor light-emitting element should be delicately controlled while taking account of the characteristics of each semiconductor light-emitting element, because the semiconductor light-emitting elements differ in operating voltage.

In the case where the color temperature of light from an illuminating device is to be controlled with conventional techniques, emission efficiency fluctuates relatively largely with changing color temperature. Consequently, also for obtaining stable outputted light, it is required to control the operation of the semiconductor light-emitting elements in a complicated manner.

In view of the problems described above, an object of the invention is to provide a semiconductor light-emitting device which is an illuminating device comprising semiconductor light-emitting devices employing a semiconductor light-emitting element and in which outputted light is stably combined to inhibit light separation, color tone is changeable, and control for operating the light-emitting devices is as simple as possible.

Means for Solving the Problems

In order to eliminate the problems, the invention first provides an illuminating device comprising a light-emitting part in which a plurality of kinds of semiconductor light-emitting devices, which differ in emission color, are integrated and arranged, the semiconductor light-emitting devices comprising a semiconductor light-emitting element and a phosphor, and wherein the semiconductor light-emitting device emit light outward on the basis of an emission from the semiconductor light-emitting element and an emission from the phosphor which is excited by said emission from the semiconductor light-emitting element to fluoresce or on the basis of an emission from the phosphor which is excited by an emission from the semiconductor light-emitting element to fluoresce, wherein the semiconductor light-emitting devices each have an emission color, the deviation duv of which from a blackbody radiation locus being within a range of $-0.02 \leq duv \leq 0.02$, in the uv chromaticity diagram according to UCS (u,v) color system (CIE 1960), and wherein outputted lights from the light-emitting part in which the plurality of kinds of the semiconductor light-emitting devices are integrated and arranged, are mixed together and emitted outward.

The deviation duv from a blackbody radiation locus in the invention is in accordance with the definition shown in the remarks given in item 5.4 of JIS Z8725 (Method of Measuring Distribution Temperature of Light Source and Color Temperature/Correlated Color Temperature). The plurality of kinds of semiconductor light-emitting devices differ in emission color. This, in other words, means that the semiconductor light-emitting devices differ in the color temperature of outputted light. The deviation duv for each semiconductor light-emitting device is set at such a value, and the light-emitting part in which the plurality of kinds of the semiconductor light-emitting devices are integrated and arranged is made to emit light. As a result, in the illuminating device according to the invention, the color temperature of white light can be stably regulated by easy control of power supply.

In the illuminating device, the semiconductor light-emitting elements may have an emission peak wavelength in the range of 350 nm or more and 430 nm or less. Namely, the semiconductor light-emitting elements may be ones having an emission region belonging to the so-called near-ultraviolet region or ultraviolet region. Semiconductor light-emitting elements having an emission region belonging to the near-ultraviolet region or ultraviolet region tend to have such physical properties that light outputted through a phosphor has luminance which is stable to color temperature. Consequently, it is possible to regulate the color tone of light outputted by the semiconductor light-emitting devices while keeping the luminance thereof stable by easily controlling electric power to be supplied to each semiconductor light-emitting element.

In the illuminating device described above, at least one kind of the semiconductor light-emitting device among the plurality of kinds of semiconductor light-emitting devices may have a positive value of the deviation duv from a blackbody radiation locus. This is an example of the deviation duv and no limitation is intended.

The illuminating device described above may comprise an emission intensity control part which controls electric power to be supplied to each of the plurality of kinds of the semiconductor light-emitting devices and thereby controls the emission color of the outputted light from the light-emitting part. Namely, the emission intensity control part controls electric power to be supplied to each of the semiconductor light-emitting devices differing in emission color, whereby the emission color of outputted light from this illuminating device is controlled. This configuration makes it easy to control the emission color of light from the illuminating device.

The emission intensity control part may control the correlated color temperature of the emission color of light from the light-emitting part by changing a reciprocal correlated color temperature of the emission color of the semiconductor light-emitting device by a given amount. The reciprocal correlated color temperature in the invention is defined as a reciprocal of correlated color temperature of light outputted by a semiconductor light-emitting device. The applicant directed attention to the fact that fluctuations in correlated color temperature of light outputted by a semiconductor light-emitting device are not proportionally reflected in human vision, and utilized reciprocal correlated color temperature as a parameter for control made by the emission intensity control part. As a result, color temperature control based on human vision, or color temperature control according to human sense, can be easily attained.

At least one of the plurality of kinds of the semiconductor light-emitting devices may be set so that the emission color of the semiconductor light-emitting device has a reciprocal correlated color temperature within a given range where a change in electric power supplied to the semiconductor light-emitting device causes a change in the correlated color temperature thereof by at least a given amount. The applicant directed attention to the fact that when reciprocal correlated color temperature changes in a small amount, i.e., in an amount smaller than the given amount, it is difficult for a human being to notice the change in correlated color temperature of emission color because of the nature of human vision. The applicant hence set the reciprocal correlated color temperature of the emission color of the semiconductor light-emitting device to a value within the given range. As a result, the correlated color temperature of the emission color of light from the illuminating device can be effectively controlled.

In the illuminating device described above, the emission intensity control part may control the electric power to be supplied to a plurality of kinds of the semiconductor light-emitting devices on the basis of the reciprocal correlated color temperature of the emission color of each semiconductor light-emitting device. When the illuminating device comprises a request reception part which receives a request from a user for regulation of the correlated color temperatures of the emission colors of the semiconductor light-emitting devices through a change in a given parameter amount associated with the correlated color temperatures, the emission intensity control part may control the electric power to be supplied to the semiconductor light-emitting devices on the basis of reciprocal correlated color temperatures so that the given parameter in the request for regulation received by the request reception part changes in proportion to a change in the correlated color temperatures of the emission colors of the semiconductor light-emitting devices. Namely, in order that the request from a user regarding the correlated color temperatures might vary in proportion to the correlated color temperatures of the emission colors of the semiconductor light-emitting devices, the emission intensity control part controls power supply on the basis of reciprocal correlated color temperatures while taking account of the nature of correlated color temperature, that is, in view of the fact that fluctuations in correlated color temperature are not proportionally reflected in human vision. As a result, the correlated color temperature of the emission color of light from the illuminating device can be easily controlled even when the user himself does not know the nature of correlated color temperature.

In the illuminating device described above, the emission intensity control part may control each of a plurality of kinds of the semiconductor light-emitting devices to regulate the emission color of the outputted light from the light-emitting part so as to result in a chromaticity point, which is located on straight lines connecting a plurality of chromaticity points respectively corresponding to the emission colors of light from a plurality of kinds of the semiconductor light-emitting devices, or which is located within a polygon formed by the straight lines. Namely, since power supply to each of the semiconductor light-emitting devices can be controlled by the emission intensity control part in the illuminating device according to the invention, outputted light from the semiconductor light-emitting devices can be easily regulated so as to result in a chromaticity point which is located on straight lines connecting the chromaticity points or located within a polygon formed by the straight lines.

In the illuminating device described above, the emission intensity control part may supply the electric power to the plurality of kinds of the semiconductor light-emitting devices with PWM control to control the correlated color temperature of the emission color of light emitted from the light-emitting part. The proportion of quantity of light outputted by each semiconductor light-emitting device per unit time period is regulated by performing PWM (pulse width modulation) control, and the color temperature of light outputted by the semiconductor light-emitting devices is thereby regulated.

Another manner of controlling power supply to the semiconductor light-emitting devices is as follows. When the illuminating device comprises a circuit in which two kinds of the semiconductor light-emitting devices, which differ in the correlated color temperature of the emission color, are parallel-connected so as to have normal bias directions opposite from each other, the emission intensity control part may apply an alternating-current voltage having a square waveform to the circuit and control a duty ratio of the alternating-current voltage having a square waveform. With the circuit, control of power supply to each semiconductor light-emitting device is rendered highly simple.

In the illuminating device described above, the semiconductor light-emitting devices may comprise, as the phosphors, a blue phosphor, which emits a blue florescence upon excitation by an emission from the semiconductor light-emitting element, a green phosphor, which emits a green florescence upon excitation by an emission from the semiconductor light-emitting element, and a red phosphor, which emits a red florescence upon excitation by an emission from the semiconductor light-emitting element.

The semiconductor light-emitting devices may further comprise a light-transmitting material which encapsulates the semiconductor light-emitting element and the phosphors. The light-transmitting material may be a silicon-containing compound as an example.

The semiconductor light-emitting devices described above can be ones which have an emission color having a correlated color temperature in the range of 2,000K or more and 50,000K or less.

The illuminating device described above may be configured as shown below, from another viewpoint. An illuminating device comprising a light-emitting part in which a plurality of kinds of solid-state light-emitting devices, which differ in emission color, are integrated and arranged, wherein the solid-state light-emitting devices each have an emission color which, in the xy chromaticity diagram according to the XYZ color system (CIE 1931), has a deviation $\Delta uv$ from a blackbody radiation locus in the range of $-0.02 \leq \Delta uv \leq 0.02$. The technical features disclosed hereinabove are applicable also to this illuminating device.

Incidentally, that a solid-state light-emitting device has an emission color "which, in an xy chromaticity diagram according to the XYZ color system (CIE 1931), has a deviation $\Delta uv$ from a blackbody radiation locus in the range of $-0.02 \leq \Delta uv \leq 0.02$" has the same meaning as that a solid-state light-emitting device has an emission color "which, in a uv chromaticity diagram according to the UCS (u,v) color system (CIE 1960), has a deviation duv from a blackbody radiation locus within the range of $-0.02 \leq duv \leq 0.02$".

Next, the invention is described from another viewpoint. A semiconductor light-emitting device, according to this viewpoint, which comprises a package comprising semiconductor light-emitting elements mounted therein and which emits light outward on the basis of an emission from the package is configured so that the light output face for emitting light from the package is separated into a plurality of sections each including, arranged therein, a semiconductor light-emitting element and a fluorescent part corresponding to each other and that such two or more fluorescent parts differ in the spectrum of light outputted thereby. Namely, one package comprises fluorescent parts disposed for the respective sections, and this configuration enables outputted light to be stably synthesized. In addition, since the emission from the light-emitting device is regulated mainly with two fluorescent parts differing in spectrum, operation of the semiconductor light-emitting elements also is simple.

Specifically, the invention provides a semiconductor light-emitting device which comprises at least a package, a semiconductor light-emitting elements and a phosphor, and wherein the semiconductor light-emitting device emits light outward on the basis of an emission from the semiconductor light-emitting element and an emission from the phosphor, which is excited by said emission from the semiconductor light-emitting element to fluoresce or on the basis of an emission from the phosphor which is excited by an emission from the semiconductor light-emitting elements to fluoresce. In the semiconductor light-emitting device, the package has an opening which is open in an emission direction for the semiconductor light-emitting device and a plurality of divided regions demarcated by partitioning the inside of the package, each of the divided regions being open at a divided opening which is a part of said opening. Furthermore, each of the plurality of the divided regions comprises one or more of the semiconductor light-emitting elements, a power supply part which supplies electric power to the semiconductor light-emitting elements, and a fluorescent part comprising the phosphor and a light-transmitting material, which fills up the divided region. Among the plurality of divided regions, at least one divided region is different from the other divided region(s) in a spectrum of light outputted from the fluorescent part.

In the semiconductor light-emitting device, the inside of the package is partitioned into divided regions so that the opening for emitting light outputted by the device is separated into a plurality of sections. The open parts of these divided regions are defined as the divided openings, and each of these divided openings occupies part of the opening of the light-emitting device main body. Each divided region comprises a semiconductor light-emitting element, a power supply part corresponding to the element, and a fluorescent part comprising a phosphor and a light-transmitting material. Consequently, outputted light from each semiconductor light-emitting element excites the phosphor to fluoresce, thereafter passes through the light-transmitting material together with light emitted by the phosphor, and reaches the outside through the divided opening of the corresponding divided region.

As described above, in the semiconductor light-emitting device, one divided region comprises a combination of one or more semiconductor light-emitting elements, a power supply part corresponding to the element(s), and a fluorescent part, and a plurality of such combinations have been packaged. Since light outputted by the fluorescent parts is outputted in emission directions from the respective divided openings, the outputted light is apt to be moderately scattered and the outputted light is stably combined together. As a result, the synthesized light obtained by combining outputted light emitted through the divided openings is inhibited from suffering light separation on illuminated surfaces outside the semiconductor light-emitting device.

In the semiconductor light-emitting device, outputted light from one divided region and outputted light from another divided region differ from each other in the spectrum of the outputted light. Consequently, the light synthesized from lights having at least two kinds of spectra reaches an illuminated surface present outside the semiconductor light-emitting device. It is therefore possible to utilize the lights having at least two kinds of spectra to regulate outputted light from the semiconductor light-emitting device.

In each of the plurality of divided regions of the semiconductor light-emitting device described above, the semiconductor light-emitting element may be one which has an emission region located in the near-ultraviolet region or ultraviolet region. For example, the semiconductor light-emitting element may have an emission peak wavelength in the range of 350 nm or more and 430 nm or less. Semiconductor light-emitting elements having an emission region in the near-ultraviolet region or ultraviolet region tend to have such physical properties that light outputted through a phosphor has luminance which is stable to color temperature. Consequently, it is possible to regulate the color tone of light outputted by the semiconductor light-emitting device while keeping the luminance thereof stable by easily controlling electric power to be supplied to each semiconductor light-emitting element.

In each of the plurality of divided regions of the semiconductor light-emitting device, light outputted by the fluorescent part may have an emission color, the deviation duv of which from a blackbody radiation locus being within the range of $-0.02 \leqq duv \leqq 0.02$, in a uv chromaticity diagram according to the UCS (u,v) color system (CIE 1960). Incidentally, the deviation duv from a blackbody radiation locus in the invention is in accordance with the definition shown in the remarks given in item 5.4 of JIS Z8725 (Method of Measuring Distribution Temperature of Light Source and Color Temperature/Correlated Color Temperature). As a result, in the semiconductor light-emitting device according to the invention, the color temperature of white light can be stably regulated by easy control of power supply.

The semiconductor light-emitting device may further comprise an emission intensity control part which controls, through the power supply part, the electric power to be supplied to the semiconductor light-emitting element in each of the plurality of divided regions and thereby independently controls the emission intensity of outputted light from each of the divided regions. In the semiconductor light-emitting device, each of the divided regions comprises a combination of one or more semiconductor light-emitting elements and a fluorescent part corresponding thereto. Consequently, the emission intensity control part can independently control, for various purposes, electric power to be supplied to the semiconductor light-emitting element(s) of each divided region through the power supply part and thereby regulate outputted light from each divided region. As a result, outputted light from the semiconductor light-emitting device can be controlled.

In particular, the emission intensity of outputted lights differing in spectrum can be regulated by controlling power supply to the semiconductor light-emitting element(s) in the said one divided region and that (those) in another divided region. As a result, the spectrum of outputted light from the semiconductor light-emitting device can be regulated at least within a spectral range determined by the two kinds of spectra.

From the standpoint of facilitating the control of the emission intensity of outputted light from the divided regions, it is preferred that all the semiconductor light-emitting elements in the divided regions should be of the same kind. The semiconductor light-emitting elements consequently have the same physical properties, in particular, the same correlation between supplied electric power and emission intensity. This configuration hence contributes to facilitation of the control. In this configuration, with respect to the spectrum of outputted light from each divided region, the spectrum of outputted light from each divided region can be regulated by selecting the kind of the fluorescent part in each region. As a result, different kinds of outputted lights which can be stably combined together can be obtained while facilitating control of power supply. The configuration described above is not intended to inhibit semiconductor light-emitting elements of different kinds from being employed in the semiconductor light-emitting device according to the invention.

The emission intensity control part may control the correlated color temperatures of the emission color of light from the light-emitting parts by changing the reciprocal correlated color temperature of the emission color of the semiconductor light-emitting device by a given amount. Furthermore, the emission intensity control part may control the electric power to be supplied to the semiconductor light-emitting element in each of the plurality of divided regions on the basis of the reciprocal correlated color temperatures of the emission colors of light from the plurality of the divided regions. When the semiconductor light-emitting device comprises a request reception part which receives a request from a user for regulation of the correlated color temperatures of the emission colors of light from the plurality of the divided regions through a change in a given parameter amount associated with the correlated color temperatures, then the emission intensity control part may control the electric power to be supplied to the semiconductor light-emitting element in each of the plurality of divided regions on the basis of the reciprocal correlated color temperatures so that the given parameter in the request for regulation received by the request reception part changes in proportion to a change in the correlated color temperatures of the emission color of light from the plurality of the divided regions. Such control by the emission intensity control part on the basis of reciprocal correlated color temperatures is as described hereinabove.

An explanation is given here on power supply to each semiconductor light-emitting element within the semiconductor light-emitting device described above. First, the power supply parts may comprise a plurality of wiring lines for supplying the electric power to the semiconductor light-emitting elements included in the plurality of the divided regions, and the emission intensity control part may control, through the plurality of the wiring lines, the electric power to be supplied to the semiconductor light-emitting element, the power supply for each of the divided regions being independently controlled. Namely, the emission intensity control part independently controls power supply to each semiconductor light-emitting element by means of the wiring line corresponding to the semiconductor light-emitting element.

In the semiconductor light-emitting device, the semiconductor light-emitting element may comprise paired input electrodes (e.g., a p-electrode and an n-electrode) having a polarity in the supplied electric power, the power supply part may comprise a pair of wiring lines to which the paired input electrodes are respectively connected to supply the electric power. The connection of the semiconductor light-emitting element in a part of the plurality of the divided regions, comprising the said one divided region among the plurality of divided regions, to the wiring lines may be in a polarity-inverted state with respect to the connection of the semiconductor light-emitting element in the remaining part of the divided regions, comprising said other divided region(s), to the wiring lines, and the emission intensity control part may supply an alternating-current power to the pair of wiring lines.

Since the semiconductor light-emitting elements comprise paired input electrodes having polarity, each element emits light when the direction of electric voltage applied to the input electrodes is the forward direction (plus voltage to the p-electrode of the semiconductor light-emitting element and minus voltage to the n-electrode of the element), and does not emit light when the direction is backward. Furthermore, the connection of each semiconductor light-emitting element within the said part of the divided regions is in a polarity-inverted state with respect to the connection of each semiconductor light-emitting element within the said remaining part of the divided regions. As a result, when the emission intensity control part supplies alternating-current electric power to a pair of power supply lines, then the semiconductor light-emitting elements within the said part of the light-emitting regions and the semiconductor light-emitting elements within the said remaining part of the light-emitting regions emit light alternately. Because of this, the emission intensity of outputted light from the semiconductor light-emitting device can be easily regulated and the color tone can be variable, by merely making the emission intensity control part to control the alternating-current electric power.

As an example of such control of alternating-current electric power by the emission intensity control part, the emission intensity control part may apply an alternating-current voltage having a square waveform to the pair of wiring lines and may control a duty ratio of the alternating-current voltage having a square waveform. Namely, the emission intensity control part performs the so-called PWM (pulse width modulation) control of a square wave voltage applied to a pair of wiring lines. The emission intensity control part thereby regulates the proportion of the quantity of light outputted from the said part of the divided regions per unit time period to the quantity of light outputted from the said remaining part of the divided regions per unit time period. As a result, the color tone of outputted light from the semiconductor light-emitting device is regulated. In particular, since the said one divided region is included in the said part of the divided regions and the said another divided region is included in the said remaining part of the divided regions, the proportion of outputted light quantity per unit time period between the lights differing in spectrum and outputted can be easily regulated and color tone is variable.

In each of the plurality of divided regions of the semiconductor light-emitting device described above, the emission intensity control part may control each of the plurality of the divided regions to regulate the emission color of outputted light from the semiconductor light-emitting device so as to result in a chromaticity point, which is located on straight lines connecting a plurality of chromaticity points respectively corresponding to the emission colors of light from the plurality of the divided regions, or which is located within a polygon formed by the straight lines. Namely, in the semiconductor light-emitting device according to the invention, since the semiconductor light-emitting elements of each divided region can be independently controlled, outputted light from the semiconductor light-emitting device can be easily regulated so as to result in a chromaticity point which is located on straight lines connecting the chromaticity points or located within a polygon formed by the straight lines.

In the illuminating device described above, the light-transmitting material may be a silicon-containing compound. The emission colors of the divided regions described above may have a correlated color temperature in a range of 2,000K or more and 50,000K or less.

Furthermore, in the semiconductor light-emitting device, when light emitted from the semiconductor light-emitting device changes in the correlated color temperature from 3,000K to 6,500K, the semiconductor light-emitting device may give an emission spectra in which an absolute value of a percentage change in the emission intensity is 10% or less in the wavelength range of 540 to 560 nm.

Effects of the Invention

An illuminating device comprising semiconductor light-emitting devices employing a semiconductor light-emitting element is configured so that outputted light is stably synthesized to inhibit light separation and color tone is variable. Furthermore, control for operating the light-emitting devices can be made as simple as possible.

BRIEF DESCRIPTION OF THE DRAWINGS

FIGS. 4(a) to (d) are diagrammatic views illustrating examples of the arrangement of solid-state light-emitting devices within an illuminating device of the invention.

FIGS. 5(a) to (d) are diagrammatic views illustrating examples of the arrangement of solid-state light-emitting devices within an illuminating device of the invention.

FIG. 7 is diagrammatic views illustrating examples of the arrangement of solid-state light-emitting devices within an illuminating device of the invention.

FIG. 13 is a block diagram of an example of illuminating devices comprising a solid-state light-emitting device having a plurality of light-emitting parts to be subjected to PWM control.

FIG. 17 is first views illustrating steps for producing a semiconductor light-emitting device according to an Example of the invention.

FIG. 18 is second views illustrating steps for producing a semiconductor light-emitting device according to an Example of the invention.

FIG. 21 is views illustrating examples of a square wave voltage applied to the electrodes of the semiconductor light-emitting device shown in FIG. 19 and FIG. 20.

FIG. 28 is a diagram showing the chromaticity of the light-emitting module shown in FIG. 26.

DESCRIPTION OF REFERENCE NUMERALS AND SIGNS

Figure 1:
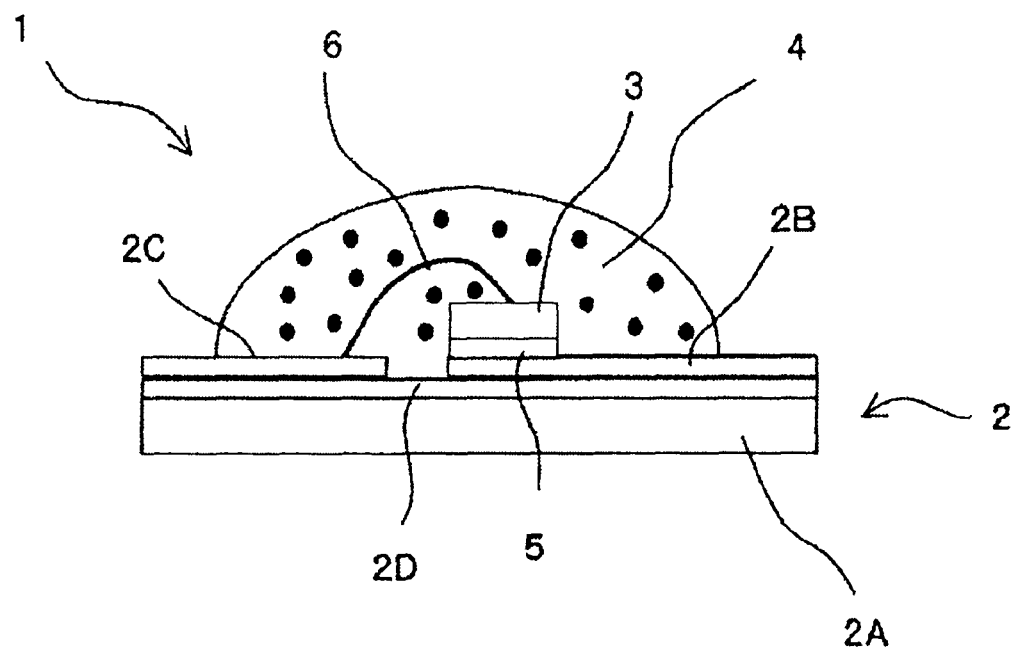
FIG. 1 is a diagrammatic sectional view of a solid-state light-emitting device according to embodiment 1 of the invention.

1 . . . LED lamp
2 . . . Wiring board
3 . . . LED
4 . . . Phosphor-containing part
6 . . . Wire
10 . . . Solid-state light-emitting element module
11 . . . Base
12 . . . Solid-state light-emitting element
20 . . . Phosphor module
21 . . . Base
22 . . . Phosphor-containing part
35 . . . Light-emitting part
36 . . . PWM control circuit
37 . . . Light-emitting-part control circuit
101 . . . Package
102 . . . Substrate
103, 103A, 103B . . . Near-ultraviolet semiconductor light-emitting element
105 . . . Eutectic solder
106 . . . Wire
108 . . . Semiconductor light-emitting device (light-emitting device)
110 . . . Reflector
111 . . . Partition
112, 112A, 112B . . . Divided region
113 . . . Opening
113A, 113B . . . Divided opening
114, 114A, 114B . . . Fluorescent part
120, 120A, 120B, 120E . . . Wiring
120C, 120D . . . Paired wiring
130 . . . Power source
140 . . . Dispenser
200 . . . Sidewall
210 . . . Partitioning part

BEST MODE FOR CARRYING OUT THE INVENTION

Examples of the illuminating device according to the invention are explained here on the basis of drawings accompanying the description. The following Examples are mere examples of the semiconductor light-emitting devices according to the invention and should not be construed as limiting the scope of a right to the invention thereto.

<First Embodiment>

The illuminating device of the invention comprises a light-emitting part in which plurality of kinds of solid-state light-emitting devices, which differ in emission color, in particular, correlated color temperature, are integrated and arranged. In the illuminating device, each solid-state light-emitting device has an emission color which, in the xy chromaticity diagram according to the XYZ color system (CIE 1931), has a deviation Δuv from a blackbody radiation locus, the deviation Δuv being in the range of −0.02≦Δuv≦0.02, preferably in the range of −0.01≦Δuv≦0.01, more preferably in the range of 0≦Δuv≦0.01. Each constituent element is described below in detail.

[1] Solid-State Light-Emitting Devices

The solid-state light-emitting devices used in the illuminating device of the invention emit primary light serving as the components of synthesized light from the illuminating device. It is preferred that each solid-state light-emitting device should comprise a solid-state light-emitting element and a phosphor, and may further contain optional components according to need.

The constituent elements of the solid-state light-emitting devices are described below in detail.

[1-1] Solid-State Light-Emitting Element

The solid-state light-emitting element emits light which excites the phosphor that will be described later in section [1-2]. Emission wavelengths of the solid-state light-emitting element are not particularly limited so long as the wavelengths thereof overlap the absorption wavelengths of the phosphor. Light-emitting elements having emission wavelengths in a wide range can be used.

The kind of the solid-state light-emitting element to be used in the illuminating device of the invention is not particularly limited. Examples thereof include semiconductor light-emitting elements, inorganic EL, and organic EL. Of these, it is preferred to use semiconductor light-emitting elements from the standpoints of long life, energy saving, reduced heat generation, quick response, impact resistance, smallness/lightweight properties, and environmental resistance.

As the semiconductor light-emitting elements, use can be specifically made of light-emitting diodes (LEDs), semiconductor laser diodes (LDs), and the like. The emission peak wavelength of a semiconductor light-emitting element is an important factor which affects not only the excitation efficiency of the phosphor but also the efficiency of conversion of excitation light to fluorescence by the phosphor. Usually, light-emitting elements having emission wavelengths ranging from the ultraviolet region to the blue region can be used. With respect to specific numerical values, light-emitting elements having a peak emission wavelength which is generally 300 nm or more, preferably 330 nm or more, more preferably 350 nm or more, and is generally 500 nm or less, preferably 480 nm or less, more preferably 430 nm or less, may be used.

Preferred of these are GaN-based LEDs and LDs which employ a GaN-based compound semiconductor. This is because GaN-based LEDs and LDs are far higher in emission power and external quantum efficiency than SiC-based LEDs and the like which emit light within the same region, and because when GaN-based LEDs and LDs are used in combination with the phosphor which will be described later, exceedingly bright emission is obtained with exceedingly low electric power. For example, GaN-based LEDs and LDs have an emission intensity at least 100 times the emission intensity of SiC-based LEDs at the same current. Preferred GaN-based LEDs and LDs are ones having an $Al_xGa_yN$ light-emitting layer, GaN light-emitting layer, or $In_xGa_yN$ light-emitting layer. With respect to GaN-based LEDs, ones having an $In_xGa_yN$ light-emitting layer, among those layers, are especially preferred because such LEDs have an exceedingly high emission intensity. With respect to GaN-based LDs, ones having a multiple quantum well structure comprising an $In_xGa_yN$ layer and a GaN layer are especially preferred because such LDs have an exceedingly high emission intensity.

In the empirical formulae given above, the value of x+y is generally in the range of 0.8-1.2. GaN-based LEDs in which those light-emitting layers have been doped with zinc or silicon or contain no dopant are preferred from the standpoint of regulating emission characteristics.

A GaN-based LED comprises any of those light-emitting layers, a p-layer, an n-layer, electrodes, and a substrate as basic constituent elements. GaN-based LEDs having a heterojunction structure in which the light-emitting layer has been sandwiched between n-type and p-type $Al_xGa_yN$ layers, GaN layers, $In_xGa_yN$ layers, or the like are preferred because these LEDs have a high emission efficiency. More preferred are ones in which the heterojunction structure is a quantum well structure because such LEDs have an even higher emission efficiency.

Examples of methods for growing a GaN-based crystal layer for forming a GaN-based semiconductor light-emitting element include the HVPE method, MOVPE method, and MBE method. The HVPE method is preferred in the case of forming a thick film, while the MOVPE method and the MBE method are preferred in the case of forming a thin film.

[1-2] Phosphor

The phosphor used in the illuminating device of the invention is excited by the emission from the solid-state light-emitting element described above in section [1-1] and thereby converts the light from the solid-state light-emitting element into light having different wavelengths.

The composition of such phosphor is not particularly limited. However, oxide phosphors or nitride phosphors are preferred because they are chemically stable and hence serve to prolong the lives of the semiconductor light-emitting element and illuminating device. Preferred of these are phosphors constituted of a combination of: a crystal host which is a metal oxide represented by $Y_2O_3$, $Zn_2SO_4$, or the like, a metal nitride represented by $Sr_2Si_5N_8$ or the like, a phosphate represented by $Ca_5(PO_4)_3Cl$ or the like, and a sulfide represented by ZnS, SrS, CaS, or the like; and an activating element or co-activating elements selected from ions of rare-earth metals such as Ce, Pr, Nd, Pm, Sm, Eu, Tb, Dy, Ho, Er, Tm, and Yb and ions of metals such as Ag, Cu, Au, Al, Mn, and Sb.

Preferred examples of the crystal host include sulfides such as (Zn,Cd)S, $SrGa_2S_4$, SrS, and ZnS, oxysulfides such as $Y_2O_2S$, aluminates such as $(Y,Gd)_3Al_5O_{12}$, $YAlO_3$, $BaMgAl_{10}O_{17}$, $(Ba,Sr)(Mg,Mn)Al_{10}O_{17}$, $(Ba,Sr,Ca)(Mg,Zn,Mn)Al_{10}O_{17}$, $BaAl_{12}O_{19}$, $CeMgAl_{11}O_{19}$, $(Ba,Sr,Mg)O\cdot Al_2O_3$, $BaAl_2Si_2O_8$, $SrAl_2O_4$, $Sr_4Al_{14}O_{25}$, and $Y_3Al_5O_{12}$, silicates such as $Y_2SiO_5$ and $ZnSiO_4$, oxides such as $SnO_2$ and $Y_2O_3$, borates such as $GdMgB_5O_{10}$ and $(Y,Gd)BO_3$, halophosphates such as $Ca_{10}(PO_4)_6(F,Cl)_2$ and $(Sr,Ca,Ba,Mg)_{10}(PO_4)_6Cl_2$, and phosphates such as $Sr_2P_2O_7$ and $(La,Ce)PO_4$.

It is, however, noted that the crystal host and the activating element or co-activating elements are not particularly limited in element composition. Part of an element may be replaced with an element belonging to the same group, and the phosphor obtained can be used so long as this substance absorbs light in the near-ultraviolet to the visible regions and emits visible light.

Specifically, the phosphors shown below can be used. However, the following phosphors are mere examples, and phosphors usable in the invention should not be construed as being limited to the examples. In the following examples, phosphors the structures of which are only partly different have been suitably omitted. For example, "$Y_2SiO_5:Ce^{3+}$", "$Y_2SiO_5:Tb^{3+}$", and "$Y_2SiO_5:Ce^{3+},Tb^{3+}$" are inclusively referred to as "$Y_2SiO_5:Ce^{3+},Tb^{3+}$"; and "$La_2O_2S:Eu$", "$Y_2O_2S:Eu$", and "$(La,Y)_2O_2S:Eu$" are inclusively referred to as "$(La,Y)_2O_2S:Eu$". Each omission is indicated by separation with a comma (,). The sum of the elements within ( ) is 1 mol.

With respect to the fluorescent colors of phosphors for use in the invention, one or more kinds of phosphors can be selected so that the emission color of each solid-state light-emitting device satisfies $-0.02 \leq \Delta uv \leq 0.02$ in an xy chromaticity diagram according to the XYZ color system (CIE 1931). Specifically, the phosphors shown below can be used.

[1-2-1] Orange to Red Phosphors

Examples of base phosphors emitting orange to red fluorescence (hereinafter, base phosphors emitting orange fluorescence are suitably referred to as "orange phosphors", base phosphors emitting red fluorescence are suitably referred to as "red phosphors", and base phosphors emitting orange to red fluorescence are suitably referred to as "orange to red phosphors") include the following.

The fluorescence emitted by red phosphors suitable for the invention, for example, has the following wavelength range. The main emission peak appears at a wavelength which is generally 570 nm or more, preferably 580 nm or more, especially preferably 610 nm or more, and is generally 700 nm or less, preferably 680 nm or less, especially preferably 660 nm or less.

The half-width of the main emission peak is generally 1 nm or more, preferably 10 nm or more, especially preferably 30 nm or more, and is generally 120 nm or less, preferably 110 nm or less, especially preferably 100 nm or less.

In case where the wavelength at the main emission peak is too long, eye-sensitivity decreases, resulting in a possibility that the illuminating device might have reduced illuminance (be not bright enough). In case where the wavelength at the peak is too short, there is a possibility that this phosphor might give an illuminating device having reduced color rendering properties. In case where the half-width of the main emission peak is outside the above-mentioned range, there is a possibility that this phosphor might give an illuminating device having reduced color rendering properties.

Examples of orange to red phosphors include: europium-activated alkaline-earth silicon nitride phosphors represented by $(Mg,Ca,Sr,Ba)_2Si_5N_8$:Eu which are constituted of crushed particles having red surfaces formed by crushing and emit light within the red region; and europium-activated rare-earth oxychalcogenide phosphors represented by $(Y,La,Gd,Lu)_2O_2S$:Eu which are constituted of grown particles having an approximately spherical shape as a regularly grown crystal shape and emit light within the red region.

Furthermore, the phosphors described in JP-A-2004-300247 can be used which are phosphors that comprise an oxynitride and/or oxysulfide containing at least one element selected from the group consisting of Ti, Zr, Hf, Nb, Ta, W, and Mo and comprise an oxynitride having an α-Sialon structure in which the aluminum element has been partly or wholly replaced by gallium element. Incidentally, these are phosphors comprising an oxynitride and/or an oxysulfide.

As a red phosphor, it is preferred to use a phosphor containing a crystalline phase having a chemical composition represented by the following formula [3], from the standpoint of obtaining a semiconductor light-emitting device in which when light emitted from the semiconductor light-emitting device changes in correlated color temperature from 3,000K to 6,500K, then the absolute value of the percentage change in emitted-light intensity is within the range of 10%.

This phosphor, when used with excitation by near-ultraviolet light in a white illuminating device, shows excellent properties especially regarding color rendering properties and emission efficiency.

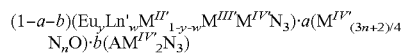

[3]

(In formula [3],

Ln' is at least one metallic element selected from the group consisting of the lanthanoides excluding Eu and of Mn and Ti, $M^{II'}$ is one or more elements selected from the group consisting of divalent metallic elements other than Eu and the Ln' element, $M^{III'}$ is one or more elements selected from the group consisting of trivalent metallic elements, $M^{IV'}$ is one or more elements selected from the group consisting of tetravalent metallic elements, A is one or more monovalent metallic elements selected from the group consisting of Li, Na, and K, y is a number satisfying $0 \leq y \leq 0.2$, w is a number satisfying $0 \leq w \leq 0.2$, and a, b, and n are numbers satisfying $0 \leq a$, $0 \leq b$, $a+b>0$, $0 \leq n$, and $0.002 \leq (3n+2)a/4 \leq 0.9$.)

In formula [3], Ln' preferably is at least one metallic element selected from Ce, Tb, Sm, Mn, Dy, and Yb, from the standpoint of luminance.

It is preferred that $M^{II'}$ should include one or more members selected from the group consisting of Mg, Ca, Sr, Ba, and Zn, in a total amount of 90 mol % or more. From the standpoint of the luminance of the phosphor, examples of elements other than Mg, Ca, Sr, Ba, and Zn in $M^{II'}$ include Mn, Sm, Eu, Tm, Yb, Pb, and Sn. From the standpoint of the luminance of the phosphor, it is especially preferred that $M^{II'}$ should include Ca and/or Sr in a total amount of 80 mol % or more, more preferably 90 mol % or more. It is most preferred that the total amount thereof should be 100 mol %. Furthermore, it is preferred that the proportion of Ca to the sum of Ca and Sr in $M^{II'}$ should exceed 10 mol %. It is most preferred that the proportion thereof should be 100 mol %, i.e., $M^{II'}$ should consist of Ca only.

It is preferred that Al should account for at least 80 mol % of $M^{III'}$. From the standpoint of the luminance of the phosphor, examples of elements other than Al in $M^{III'}$ include Ga, In, B, Sc, Y, Bi, Sb, La, Ce, Pr, Nd, Sm, Gd, Tb, Dy, Ho, Er, Tm, Yb, and Lu. Preferred of these are Ga, In, B, Bi, Sc, Y, La, Ce, Gd, and Lu. From the standpoint of the luminance of the phosphor, it is preferred that $M^{III'}$ should contain Al in an amount of 90 mol % or more. It is most preferred that the amount of Al should be 100 mol %, i.e., $M^{III'}$ should consist of Al only.

It is preferred that Si should account for at least 90 mol % of $M^{IV'}$. From the standpoint of the luminance of the phosphor, examples of elements other than Si in $M^{IV'}$ include Ge, Sn, Ti, Zr, and Hf. Preferred of these is Ge. From the standpoint of the luminance of the phosphor, it is most preferred that $M^{IV'}$ should consist of Si only.

In the phosphor described above, the crystalline phase has a crystal structure belonging to space group $Cmc2_1$ or $P2_1$.

Other usable red phosphors comprise Eu-activated oxysulfide phosphors such as $(La,Y)_2O_2S$:Eu, Eu-activated oxide phosphors such as $Y(V,P)O_4$:Eu and $Y_2O_3$:Eu, Eu,Mn-activated silicate phosphors such as $(Ba,Sr,Ca,Mg)_2SiO_4$:Eu,Mn and $(Ba,Mg)_2SiO_4$:Eu,Mn, Eu-activated sulfide phosphors such as $(Ca,Sr)S$:Eu, Eu-activated aluminate phosphors such as $YAlO_3$:Eu, Eu-activated silicate phosphors such as $LiY_9(SiO_4)_6O_2$:Eu, $Ca_2Y_8(SiO_4)_6O_2$:Eu, $(Sr,Ba,Ca)_3SiO_5$:Eu, and $Sr_2BaSiO_5$:Eu, Ce-activated aluminate phosphors such as $(Y,Gd)_3Al_5O_{12}$:Ce and $(Tb,Gd)_3Al_5O_{12}$:Ce, Eu-activated nitride phosphors such as $(Ca,Sr,Ba)_2Si_5N_8$:Eu, $(Mg,Ca,Sr,Ba)SiN_2$:Eu, and $(Mg,Ca,Sr,Ba)AlSiN_3$:Eu, Ce-activated nitride phosphors such as $(Mg,Ca,Sr,Ba)AlSiN_3$:Ce, Eu,Mn-activated halophosphate phosphors such as $(Sr,Ca,Ba,Mg)_{10}(PO_4)_6Cl$:Eu,Mn, Eu,Mn-activated silicate phosphors such as $Ba_3MgSi_2O_8$:Eu,Mn and $(Ba,Sr,Ca,Mg)_3(Zn,Mg)Si_2O_8$:Eu, Mn, Mn-activated germinate phosphors such as $3.5MgO \cdot 0.5MgF_2 \cdot GeO_2:Mn$, Eu-activated oxynitride phosphors such as Eu-activated α-Sialon, Eu,Bi-activated oxide phosphors such as $(Gd,Y,Lu,La)_2O_3:Eu,Bi$, Eu,Bi-activated sulfide phosphors such as $(Gd,Y,Lu,La)_2O_2S:Eu,Bi$, Eu,Bi-activated vanadate phosphors such as $(Gd,Y,Lu,La)VO_4:Eu,Bi$, Eu,Ce-activated sulfide phosphors such as $SrY_2S_4:Eu,Ce$, Ce-activated sulfide phosphors such as $CaLa_2S_4:Ce$, Eu,Mn-activated phosphate phosphors such as $(Ba,Sr,Ca)MgP_2O_7:Eu,Mn$ and $(Sr,Ca,Ba,Mg,Zn)_2P_2O_7:Eu,Mn$, Eu,Mo-activated tungstate phosphors such as $(Y,Lu)_2WO_6:Eu,Mo$, Eu,Ce-activated nitride phosphors such as $(Ba,Sr,Ca)_xSi_yN_z:Eu,Ce$ (wherein x, y, and z are integers of 1 or more), Eu,Mn-activated halophosphate phosphors such as $(Ca,Sr,Ba,Mg)_{10}(PO_4)_6(F,Cl,Br,OH)_2:Eu,Mn$, Ce-activated silicate phosphors such as $((Y,Lu,Gd,Tb)_{1-x}Sc_xCe_y)_2(Ca,Mg)_{1-r}(Mg,Zn)_{2+s}Si_{2-q}O_{12+\delta}$, and the like.

As red phosphors, use can also be made of red organic phosphors constituted of a rare-earth element ion complex comprising as a ligand an anion of a β-diketonate, β-diketone, aromatic carboxylic acid, Brønsted acid, or the like, perylene pigments (e.g., dibenzo{[f,f']-4,4',7,7'-tetraphenyl}diindino[1,2,3-cd:1',2',3'-lm]perylene), anthraquinone pigments, lake pigments, azo pigments, quinacridone pigments, anthracene pigments, isoindoline pigments, isoindolinone pigments, phthalocyanine pigments, triphenylmethane-type basic dyes, indanthrone pigments, indophenol pigments, cyanine pigments, and dioxazine pigments.

Red phosphors having a peak wavelength which is 580 nm or more, preferably 590 nm or more, and is 620 nm or less, preferably 610 nm or less, are suitable for use as orange phosphors. Examples of such orange phosphors include $(Sr,Ba)_3SiO_5:Eu$, $(Sr,Mg)_3(PO_4)_2:Sn$, and Eu-activated oxynitride phosphors such as Eu-activated Sialon.

[1-2-2] Green Phosphors

Examples of base phosphors emitting green fluorescence (hereinafter suitably referred to as "green phosphors") include the following.

The fluorescence emitted by green phosphors suitable for the invention, for example, has the following wavelength range. The main emission peak appears at a wavelength which is generally 500 nm or more, preferably 510 nm or more, especially preferably 520 nm or more, and is generally 580 nm or less, preferably 570 nm or less, especially preferably 560 nm or less.

The half-width of the main emission peak is generally 1 nm or more, preferably 10 nm or more, especially preferably 30 nm or more, and is generally 120 nm or less, preferably 90 nm or less, especially preferably 60 nm or less.

In case where the wavelength at the main emission peak is too short beyond the above-mentioned range, eye sensitivity decreases, resulting in a possibility that the illuminating device might have reduced illuminance (be not bright enough). In case where the wavelength at the peak is too long, there is a possibility that this phosphor might give an illuminating device having reduced color rendering properties. In case where the half-width of the main emission peak is outside the above-mentioned range, there is a possibility that this phosphor might give an illuminating device having reduced color rendering properties.

Examples of such green phosphors include: europium-activated alkaline-earth silicon oxynitride phosphors represented by $(Mg,Ca,Sr,Ba)Si_2O_2N_2:Eu$ which are constituted of crushed particles having surfaces formed by crushing and emit light within the green region; and europium-activated alkaline-earth silicate phosphors represented by $(Ba,Ca,Sr,Mg)_2SiO_4:Eu$ which are constituted of crushed particles having surfaces formed by crushing and emit light within the green region.

Other usable green phosphors include Eu-activated aluminate phosphors such as $Sr_4Al_{14}O_{25}:Eu$ and $(Ba,Sr,Ca)Al_2O_4:Eu$, Eu-activated silicate phosphors such as $(Sr,Ba)Al_2Si_2O_8:Eu$, $(Ba,Mg)_2SiO_4:Eu$, $(Ba,Sr,Ca,Mg)_2SiO_4:Eu$, and $(Ba,Sr,Ca)_2(Mg,Zn)Si_2O_7:Eu,Ce$, Tb-activated silicate phosphors such as $Y_2SiO_5:Ce,Tb$, Eu-activated borate phosphate phosphors such as $Sr_2P_2O_7$-$Sr_2B_2O_5:Eu$, Eu-activated halosilicate phosphors such as $Sr_2Si_3O_8$-$2SrCl_2:Eu$, Mn-activated silicate phosphors such as $Zn_2SiO_4:Mn$, Tb-activated aluminate phosphors such as $CeMgAl_{11}O_{19}:Tb$ and $Y_3Al_5O_{12}:Tb$, Tb-activated silicate phosphors such as $Ca_2Y_8(SiO_4)_6O_2:Tb$ and $La_3Ga_5SiO_{14}:Tb$, Eu,Tb,Sm-activated thiogallate phosphors such as $(Sr,Ba,Ca)Ga_2S_4:Eu,Tb,Sm$, Ce-activated aluminate phosphors such as $Y_3(Al,Ga)_5O_{12}:Ce$ and $(Y,Ga,Tb,La,Sm,Pr,Lu)_3(Al,Ga)_5O_{12}:Ce$, Ce-activated silicate phosphors such as $Ca_3Sc_2Si_3O_{12}:Ce$ and $Ca_3(Sc,Mg,Na,Li)_2Si_3O_{12}:Ce$, Ce-activated oxide phosphors such as $CaSc_2O_4:Ce$, Eu-activated oxynitride phosphors such as $SrSi_2O_2N_2:Eu$, $(Sr,Ba,Ca)Si_2O_2N_2:Eu$, and Eu-activated β-Sialon, Eu-activated oxynitride phosphors such as $M_3Si_6O_{12}N_2:Eu$ (wherein M represents an alkaline earth metal element), Eu,Mn-activated aluminate phosphors such as $BaMgAl_{10}O_{17}:Eu,Mn$, Eu-activated aluminate phosphors such as $SrAl_2O_4:Eu$, Tb-activated oxysulfide phosphors such as $(La,Gd,Y)_2O_2S:Tb$, Ce,Tb-activated phosphate phosphors such as $LaPO_4:Ce,Tb$, sulfide phosphors such as $ZnS:Cu,Al$ and $ZnS:Cu,Au,Al$, Ce,Tb-activated borate phosphors such as $(Y,Ga,Lu,Sc,La)BO_3:Ce,Tb$, $Na_2Gd_2B_2O_7:Ce,Tb$, and $(Ba,Sr)_2(Ca,Mg,Zn)B_2O_6:K,Ce,Tb$, Eu,Mn-activated halosilicate phosphors such as $Ca_8Mg(SiO_4)_4Cl_2:Eu,Mn$, Eu-activated thioaluminate phosphors such as $(Sr,Ca,Ba)(Al,Ga,In)_2S_4:Eu$, thiogallate phosphors, Eu,Mn-activated halosilicate phosphors such as $(Ca,Sr)_8(Mg,Zn)(SiO_4)_4Cl_2:Eu,Mn$, and the like.

As green phosphors, use can also be made of organic phosphors such as pyridine-phthalimide condensate derivatives, fluorescent pigments such as benzoxazinone, quinazolinone, coumarin, quinophthalone, and naphthalimide compounds, and terbium complexes.

[1-2-3] Blue Phosphors

Examples of base phosphors emitting blue fluorescence (hereinafter suitably referred to as "blue phosphors") include the following.

The fluorescence emitted by blue phosphors suitable for the invention, for example, has the following wavelength range. The main emission peak appears at a wavelength which is generally 430 nm or more, preferably 440 nm or more, and is generally 500 nm or less, preferably 480 nm or less, especially preferably 460 nm or less.

The half-width of the main emission peak is generally 1 nm or more, preferably 10 nm or more, especially preferably 30 nm or more, and is generally 100 nm or less, preferably 80 nm or less, especially preferably 70 nm or less.

In case where the wavelength at the main emission peak is too short, eye sensitivity decreases, resulting in a possibility that the illuminating device might have reduced illuminance (be not bright enough). In case where the wavelength at the peak is too long, there is a possibility that this phosphor might give an illuminating device having reduced color rendering properties. In case where the half-width of the main emission peak is outside the above-mentioned range, there is a possibility that this phosphor might give an illuminating device having reduced color rendering properties.

Examples of such blue phosphors include: europium-activated barium magnesium aluminate phosphors represented by $BaMgAl_{10}O_{17}$:Eu which are constituted of grown particles having an approximately hexagonal shape as a regularly grown crystal shape and emit light within the blue region; europium-activated calcium halophosphate phosphors represented by $(Ca,Sr,Ba)_5(PO_4)_3Cl$:Eu which are constituted of grown particles having an approximately spherical shape as a regularly grown crystal shape and emit light within the blue region; europium-activated alkaline-earth chloroborate phosphors represented by $(Ca,Sr,Ba)_2B_5O_9Cl$:Eu which are constituted of grown particles having an approximately cubical shape as a regularly grown crystal shape and emit light within the blue region; and europium-activated alkaline-earth aluminate phosphors represented by $(Sr,Ca,Ba)Al_2O_4$:Eu or $(Sr,Ca,Ba)_4Al_{14}O_{25}$:Eu which are constituted of crushed particles having surfaces formed by crushing and emit light within a blue-green region.

Other usable blue phosphors include Sn-activated phosphate phosphors such as $Sr_2P_2O_7$:Sn, Eu-activated aluminate phosphors such as $Sr_4Al_{14}O_{25}$:Eu, $BaMgAl_{10}O_{17}$:Eu, and $BaAl_8O_{13}$:Eu, Ce-activated thiogallate phosphors such as $SrGa_2S_4$:Ce and $CaGa_2S_4$:Ce, Eu,Tb,Sm-activated aluminate phosphors such as $(Ba,Sr, Ca)MgAl_{10}O_{17}$:Eu and $BaMgAl_{10}O_{17}$:Eu,Tb,Sm, Eu,Mn-activated aluminate phosphors such as $(Ba,Sr, Ca)MgAl_{10}O_{17}$:Eu,Mn, Eu,Tb,Sm-activated halophosphate phosphors such as $(Sr,Ca,Ba,Mg)_{10}(PO_4)_6Cl_2$:Eu and $(Ba,Sr, Ca)_5(PO_4)_3(Cl,F,Br,OH)$:Eu,Mn,Sb, Eu-activated silicate phosphors such as $BaAl_2Si_2O_8$:Eu and $(Sr,Ba)_3MgSi_2O_8$:Eu, Eu-activated phosphate phosphors such as $Sr_2P_2O_7$:Eu, sulfide phosphors such as ZnS:Ag and ZnS:Ag,Al, Ce-activated silicate phosphors such as $Y_2SiO_5$:Ce, tungstate phosphors such as $CaWO_4$, Eu,Mn-activated borate phosphate phosphors such as $(Ba,Sr,Ca)BPO_5$:Eu,Mn, $(Sr,Ca)_{10}(PO_4)_6 \cdot nB_2O_3$:Eu, and $2SrO \cdot 0.84P_2O_5 \cdot 0.16B_2O_3$:Eu, Eu-activated halosilicate phosphors such as $Sr_2Si_3O_8 \cdot 2SrCl_2$:Eu, and the like.

As blue phosphors, use can also be made of organic phosphors such as, for example, fluorescent pigments such as naphthalimide, benzoxazole, styryl, coumarin, pyrazoline, and triazole compounds and thulium complexes.

One of phosphors such as those described above may be used alone, or any desired combination of two or more thereof may be used in any desired proportion.

[1-2-4] Yellow Phosphors

Examples of phosphors emitting yellow fluorescence (hereinafter suitably referred to as "yellow phosphors") include the following.

The fluorescence emitted by yellow phosphors, for example, has a wavelength range which preferably is generally 530 nm or more, preferably 540 nm or more, more preferably 550 nm or more, and is generally 620 nm or less, preferably 600 nm or less, more preferably 580 nm or less.

In case where the emission peak wavelength of yellow phosphors is too short, the proportion of yellow components is low, resulting in a possibility that such phosphors might give an illuminating device having poor color rendering properties. In case where the emission peak wavelength thereof is too long, there is a possibility that the illuminating device might have reduced luminance.

Examples of such yellow phosphors include phosphors such as various oxides, nitrides, oxynitrides, sulfides, and oxysulfides.

In particular, examples thereof include garnet-type phosphors having a garnet structure represented by, e.g., $RE_3M_5O_{12}$:Ce (wherein RE represents at least one element selected from Y, Tb, Gd, Lu, and Sm, and M represents at least one element selected from Al, Ga, and Sc) or $M^2_3M^3_2M^4_3O_{12}$:Ce (wherein $M^2$ is a divalent metallic element, $M^3$ is a trivalent metallic element, and $M^4$ is a tetravalent metallic element), orthosilicate-type phosphors represented by, e.g., $AE_2M^5O_4$:Eu (wherein AE represents at least one element selected from Ba, Sr, Ca, Mg, and Zn, and $M^5$ represents at least one element selected from Si and Ge), oxynitride-type phosphors obtained by replacing part of the oxygen among the constituent elements of these phosphors with nitrogen, and Ce-activated phosphors such as nitride-type phosphors having a $CaAlSiN_3$ structure, e.g., $AEAlSiN_3$:Ce (wherein AE represents at least one element selected from Ba, Sr, Ca, Mg, and Zn).

Other usable yellow phosphors are Eu-activated phosphors such as sulfide-type phosphors, e.g., $CaGa_2S_4$:Eu, $(Ca,Sr)Ga_2S_4$:Eu, and $(Ca,Sr)(Ga,Al)_2S_4$:Eu, and oxynitride-type phosphors having an SiAlON structure, e.g., $Ca_x(Si,Al)_{12}(O,N)_{16}$:Eu.

The phosphors described above in sections [1-2-1] to [1-2-4] may be used in a suitable combination according to a desired emission spectrum, color temperature, chromaticity diagram, color rendering properties, emission efficiency, etc. A suitable combination of specific phosphors makes it possible to obtain not only white color (daylight/neutral-white/white/warm-white/incandescent color) but also pastel-color or monochromatic light or other light. Preferred phosphor combinations for obtaining a white emission color are as follows. In the case where the solid-state light-emitting element is one which emits light within the ultraviolet to near-ultraviolet regions, a combination of a blue phosphor, a green phosphor, and a red phosphor is preferred. In the case where the solid-state light-emitting element is one which emits light within the blue region, it is preferred to use a yellow phosphor alone or to use a combination of a green phosphor and a red phosphor.

[1-2-5] Other Properties of Phosphor

The phosphor to be used in the invention is not particularly limited in particle diameter. However, the median particle diameter ($D_{50}$) thereof is generally 0.1 μm or more, preferably 2 μm or more, more preferably 10 μm or more, and is generally 100 μm or less, preferably 50 μm or less, more preferably 20 μm or less.

When the phosphor has a median particle diameter ($D_{50}$) within that range, light emitted from the semiconductor light-emitting element is sufficiently scattered. In addition, the light emitted from the semiconductor light-emitting element is sufficiently absorbed by the phosphor particles. Consequently, wavelengths are changed highly efficiently and the light emitted from the phosphor is emitted in all directions. As a result, by mixing primary light from plurality of kinds of such phosphors, the plurality of kinds of primary light can be rendered white and an even white color is obtained. The illuminating device hence emits synthesized light which is even white light having an even illuminance.

In case where the median particle diameter ($D_{50}$) of the phosphor is larger than the above-mentioned range, this phosphor cannot sufficiently fill up the space in the light-emitting part and there is hence a possibility that light from the light-emitting element might not be sufficiently absorbed by the phosphor. In case where the median particle diameter ($D_{50}$) of the phosphor is smaller than the above-mentioned range, this phosphor has a reduced emission efficiency and there is hence a possibility that the illuminating device might have a reduced illuminance.

It is preferred that the phosphor particles should have a narrow particle size distribution (QD) from the standpoint of enabling the particles to be evenly dispersed in the phosphor-containing part which will be described later. However, narrowing the particle size distribution results in a decease in classification yield, leading to a cost increase. Consequently, the value of particle size distribution thereof is generally 0.03 or more, preferably 0.05 or more, more preferably 0.07 or more, and is generally 0.4 or less, preferably 0.3 or less, more preferably 0.2 or less. The shape of the phosphor particles is not particularly limited so long as the shape thereof does not influence the formation of the phosphor-containing part.

The median particle diameter ($D_{50}$) and particle size distribution (QD) of a phosphor can be obtained from a weight-basis particle size distribution curve. The weight-basis particle size distribution curve is obtained by determining a particle size distribution by the laser diffraction/scattering method. Specifically, the curve can be determined, for example, in the following manner.

The phosphor is dispersed in a solvent, e.g., ethylene glycol, in an environment having a temperature of 25° C. and a humidity of 70%.

The dispersion is examined with a laser diffraction type particle size analyzer (e.g., "LA-300", manufactured by Horiba Ltd.) with respect to the particle diameter range of from 0.1 μm to 600 μm.

In this weight-basis particle size distribution curve, the particle diameter value corresponding to an integrated value of 50% is referred to as median particle diameter $D_{50}$. Furthermore, the particle diameter values corresponding to integrated values of 25% and 75% are respectively expressed by $D_{25}$ and $D_{75}$. QD is defined as $QD=(D_{75}-D_{25})/(D_{75}+D_{25})$. When QD is small, this means that the particle size distribution is narrow.

[1-2-6] Surface Treatment of Phosphor

The phosphor to be used in the invention may be subjected to a surface treatment for the purpose of enhancing water resistance and/or for the purpose of preventing the phosphor from unnecessarily aggregating in the phosphor-containing part, which will be described later.

Examples of the surface treatment include known surface treatments such as the surface treatment with an organic material, inorganic material, glass material, or the like described in, e.g., JP-A-2002-223008, the coating treatment with a metal phosphate described in, e.g., JP-A-2000-96045, coating treatment with a metal oxide, and silica coating.

Specifically, the surface of a phosphor may be coated with the metal phosphate, for example, in the following manner.
(1) A given amount of a water-soluble phosphate such as, e.g., potassium phosphate or sodium phosphate and a given amount of a water-soluble salt compound of at least one metal selected from alkaline earth metals, Zn, and Mn, such as, e.g., calcium chloride, strontium sulfate, manganese chloride, or zinc nitrate, are added to a suspension of a phosphor, and the resultant mixture is stirred.
(2) A phosphate of the at least one metal selected from alkaline earth metals, Zn, and Mn is yielded in the suspension and, simultaneously therewith, the metal phosphate yielded is deposited on the surface of the phosphor.
(3) The water is removed.

Examples of the silica coating treatment include a method in which water glass is neutralized to deposit $SiO_2$ and a method in which the surface is treated with an alkoxysilane hydrolyzate (e.g., JP-A-3-231987). From the standpoint of enhancing dispersibility, the method in which the surface is treated with an alkoxysilane hydrolyzate is preferred.

[1-2-7] Amount of Phosphor to be Used

The amount of those phosphors to be used in the solid-state light-emitting devices can be suitably selected so that the solid-state light-emitting devices satisfy desired properties. However, it is preferred that the total amount of the phosphors should be from 5% by weight to 90% by weight based on the sum of the total weight of the phosphors, the weight of the transparent resin or the like which will be described later, as an encapsulating material, and the weight of additives added according to need, such as, e.g., a viscosity regulator. When the phosphors are to be used as the transmission type, the proportion thereof is preferably relatively small, i.e., from 5% by weight to 50% by weight. When the phosphors are to be used as the reflection type, the proportion thereof is preferably relatively large, i.e., from 50% by weight to 90% by weight.

[1-3] Encapsulating Material (Light-Transmitting Material)

The solid-state light-emitting devices to be used in the illuminating device of the invention are not particularly limited in configuration so long as each device comprises the solid-state light-emitting element and phosphor described above. Usually, the solid-state light-emitting element and the phosphor are disposed so that the phosphor is excited by the emission from the solid-state light-emitting element and thereby emits light and this light is taken out. In the case where each light-emitting device has such structure, the solid-state light-emitting element and phosphor described above are usually encapsulated and protected with an encapsulating material. Specifically, this encapsulating material is employed for the purposes of dispersing the phosphor therein to constitute a light-emitting part and bonding the semiconductor light-emitting element, phosphor, and substrate together.

Examples of the encapsulating material to be used usually include thermoplastic resins, thermocurable resins, and photocurable resins. However, resins which are sufficiently transparent and resistant to excitation light (more preferred peak wavelength range is from 350 nm to 430 nm) from the solid-state light-emitting element are preferred.

Examples thereof include (meth)acrylic resins such as poly(methyl(meth)acrylate); styrene resins such as polystyrene and styrene/acrylonitrile copolymers; polycarbonate resins; polyester resins; phenoxy resins; butyral resins; poly(vinyl alcohol); cellulosic resins such as ethyl cellulose, cellulose acetate, and cellulose acetate butyrate; epoxy resins; phenolic resins; and silicone resins. Inorganic materials are also usable, such as, e.g., an inorganic material obtained by solidifying a metal alkoxide, a ceramic-precursor polymer, a solution obtained by hydrolyzing and polymerizing a metal-alkoxide-containing solution by the sol-gel method, or a combination of these. Such an inorganic material is, for example, an inorganic material having siloxane bonds. Examples of the inorganic materials further include glasses.

Preferred of these from the standpoints of heat resistance, ultraviolet (UV) resistance, etc. are silicone resins and the inorganic material obtained by solidifying a metal alkoxide, a ceramic-precursor polymer, a solution obtained by hydrolyzing and polymerizing a metal-alkoxide-containing solution by the sol-gel method, or a combination of these, e.g., an inorganic material having siloxane bonds.

Especially preferred of such encapsulating materials are silicone materials or silicone resins which have one or more of the following features (1) to (3) (hereinafter sometimes referred to as "silicone materials of the invention").

(1) To give a solid Si-nuclear magnetic resonance (NMR) spectrum having at least one peak which is the following peak (i) and/or (ii).

(i) A peak wherein the peak top position is in the chemical-shift region of −40 ppm or more and 0 ppm or less, and the peak has a half-width of 0.3 ppm or more and 3.0 ppm or less.

(ii) A peak wherein the peak top position is in the chemical-shift region of −80 ppm or more and less than −40 ppm, and the peak has a half-width of 0.3 ppm or more and 5.0 ppm or less.

(2) To have a silicon content of 20% by weight or higher.

(3) To have a silanol content of 0.01% by weight or more and 10% by weight or less.

In the invention, silicone materials or silicone resins having the feature (2), among the features (1) to (3), can be advantageously used. More preferably, silicone materials or silicone resins having the features (1) and (2) are used. It is especially preferred to use a silicone material or silicone resin which has all of the features (1) to (3).

The features (1) to (3) are explained below.

[1-3-1] Solid Si-NMR Spectrum

A compound containing silicon as a main component is represented by the rational formula $SiO_2 \cdot nH_2O$. With respect to structure, this compound has a structure which comprises a tetrahedron constituted of silicon atoms Si and having oxygen atoms O respectively bonded to the vertexes and in which silicon atoms Si are further bonded to these oxygen atoms O to constitute a net-like extended structure. The diagrammatic views (A) and (B) given below represent Si—O net structures in disregard of the tetrahedral structure. In some Si—O—Si—O— repeating units, part of the oxygen atoms O have been substituted with another member (e.g., —H, —$CH_3$, or the like). When individual silicon atoms Si are viewed, there are a silicon atom Si having four —OSi groups ($Q^4$) as shown in diagrammatic view (A), a silicon atom Si having three —OSi groups ($Q^3$) as shown in diagrammatic view (B), etc. In solid Si-NMR spectroscopy, peaks attributable to those silicon atoms Si are called a $Q^4$ peak, $Q^3$ peak, . . . in order.

[Chem. 1]

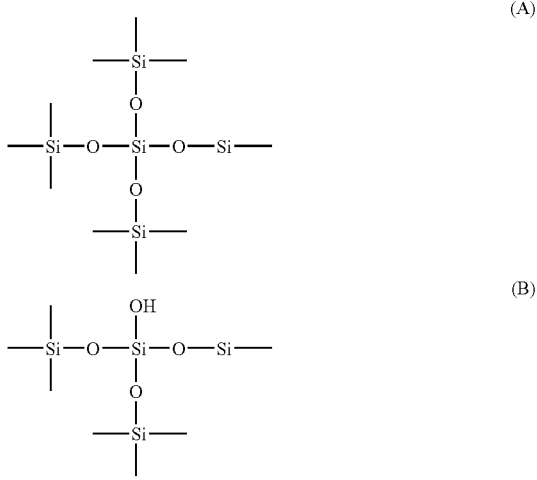

Those silicon atoms each having four oxygen atoms bonded thereto are generally inclusively referred to as Q sites. In the invention, peaks $Q^0$ to $Q^4$ assigned to Q sites are called a $Q^n$ peak group. In a silica film containing no organic substituents, a $Q^n$ peak group is observed as a continuous multimodal peak in the chemical-shift region of from −80 to −130 ppm.

In contrast, silicon atoms each having three oxygen atoms bonded thereto and one atom of another kind (usually, carbon) bonded thereto are generally inclusively referred to as T sites. Peaks assigned to T sites are observed as $T^0$ to $T^3$ peaks, as in the case of Q sites. In the invention, the peaks assigned to T sites are called a $T_n$ peak group. In general, a $T_n$ peak group is observed as a continuous multimodal peak in a region on the higher-magnetic-field side of the $Q^n$ peak group (usually in the chemical-shift region of from −80 to −40 ppm).

Furthermore, silicon atoms each having two oxygen atoms bonded thereto and two atoms of other kind(s) (usually, carbon) bonded thereto are generally inclusively referred to as D sites. Peaks assigned to D sites also are observed as $D^0$ to $D^n$ peaks (referred to as a $D^n$ peak group) like the peaks assigned to Q sites and T sites, and are observed as a multimodal peak in a region on the higher-magnetic-field side of the $Q^n$ and $T^n$ peak groups (usually in the chemical-shift region of from 0 to −40 ppm). The areal ratio among these $D^n$, $T^n$, and $Q^n$ peak groups is equal to the molar ratio among silicon atoms located in environments respectively corresponding to those peak groups. Consequently, when the area of all peaks is taken as the molar amount of all silicon atoms, then the total area of the $D^n$ peak group and the $T^n$ peak group usually corresponds to the molar amount of all silicon directly bonded to the carbon atoms associated with these peak groups.

When a silicone material of the invention is examined for solid Si-NMR spectrum, then a $D^n$ peak group and a $T_n$ peak group, which are assigned to silicon atoms having, directly bonded thereto, a carbon atom of an organic group, and a $Q^n$ peak group, which is assigned to silicon atoms not bonded to a carbon atom of an organic group, appear in respective different regions. Of these peaks, the peaks appearing in a region of less than −80 ppm, are $Q^n$ peaks as described above and the peaks appearing in a higher-magnetic-field region of from −80 ppm are $D^n$ and $T^n$ peaks. In the silicone materials of the invention, a $Q^n$ peak is not essential. However, at least one peak or preferably a plurality of peaks are observed in the $D^n$ and $T^n$ peak regions.

In the silicone materials of the invention, peaks observed in the region of −80 ppm and larger ppm values are characterized by having a smaller (narrower) half-width than the half-width range of known silicone materials produced by the sol-gel method.

This point is explained with respect to each chemical-shift region. In the silicone materials of the invention, the $T^n$ peak group, the peak tops of which are observed in the region of −80 ppm or more and less than −40 ppm, has half-widths that are generally 5.0 ppm or less, preferably 4.0 ppm or less, and are generally 0.3 ppm or more, preferably 0.4 ppm or more.

Likewise, the $D^n$ peak group, the peak tops of which are observed in the region of −40 ppm or more and 0 ppm or less, has h half-widths that are generally smaller than those of the $T^n$ peak group due to reduced inhibition of molecular movement. These half-widths are generally 3.0 ppm or less, preferably 2.0 ppm or less, and are generally 0.3 ppm or more.

In case where peaks observed in those chemical-shift regions have a half-width larger than that range, molecular movement is highly inhibited and this silicone material is in a highly distorted state and is apt to crack. There is hence a possibility that the material gives a member inferior in heat resistance and weatherability. A half-width larger than the above-mentioned range result, for example, when a tetrafunctional silane is used in too large an amount or rapid drying is conducted in a drying step to yield a material having large internal stress accumulated therein.

In case where the peaks have a half-width smaller than the above-mentioned range, this means that the silicon atoms present in such environment do not participate in siloxane crosslinking. There is hence a possibility that this material gives a member inferior in heat resistance and weatherability to substances mainly formed with siloxane bonds. For example, there are cases where a trifunctional silane remains in an uncrosslinked state.

The compositions of the silicone materials of the invention are limited to cases where crosslinking in the system is constituted mainly with an inorganic ingredient comprising silica. Namely, even when a silicone material constituted of a large proportion of an organic ingredient and a small proportion of an Si ingredient contained therein shows a peak with a half-width within the range described above at −80 ppm or above, this material cannot have satisfactory heat resistance/light resistance and satisfactory applicability.

The value of chemical shift of a silicone material of the invention can be determined by subjecting the material to solid Si-NMR spectroscopy, for example, by the following method and calculating the value from the results thereof. The data obtained by the examination are analyzed (for half-width and silanol content), for example, by a method in which peaks are separately extracted by, e.g., waveform separation analysis using, for example, the Gaussian function or Lorentz function.

{Solid Si-NMR Spectroscopy}

When a silicone material is examined for solid Si-NMR spectrum, solid Si-NMR spectroscopy and waveform separation analysis are conducted under the following conditions. From the waveform data obtained, the half-width of each peak for the silicone material is obtained.

<Apparatus Conditions>

Apparatus: nuclear magnetic resonance spectrometer Infinity CMX-400; Chemagnetics Inc.
$^{29}$Si resonance frequency: 79.436 MHz
Probe: 7.5 mmϕ probe for CP/MAS
Examination temperature: room temperature
Sample spinning speed: 4 kHz
Examination method: single-pass method
$^1$H decoupling frequency: 50 kHz
$^{29}$Si flip angle: 90°
90° pulse width for $^{29}$Si: 5.0 μs
Repetition time: 600 s
Number of integrations: 128
Spectral width: 30 kHz
Broadening factor: 20 Hz <Method of Data Processing>

Examination data for 512 points in the silicone material are incorporated, and the data are zero-filled to 8,192 points and subjected to Fourier transform.

<Method of Waveform Separation Analysis>

With respect to peaks appearing in the spectrum which has undergone Fourier transform, peak shapes are drawn by means of Lorentz waveform and Gauss waveform or of a mixture of both. The center position, height, and half-width of each peak shape are used as variable parameters to conduct an optimizing calculation by the nonlinear least-square method.

In identifying the peaks, reference is made to, for example, *AIChE Journal*, 44(5), p. 1141, 1998.

[1-3-2] Silicon Content

The silicone materials of the invention preferably are ones having a silicon content of 20% by weight or higher (feature (2)). Conventional silicone materials are organic resins, such as epoxy resins, which have a basic framework constituted of carbon-carbon and carbon-oxygen bonds. In contrast, the basic framework of the silicone materials of the invention is constituted of inorganic siloxane bonds as in glasses (silicate glasses) and the like. The siloxane bonds have the following features which are excellent for silicone materials, as apparent from the chemical-bond comparison table given in the following Table 1.

(I) To have a high bond energy and reduced susceptibility to thermal decomposition/photodecomposition and, hence, satisfactory light resistance.
(II) To be in an electrically slightly polarized state.
(III) The chain structure has a high degree of freedom and is capable of forming a highly flexible structure in which free rotation on the siloxane chain is possible.
(IV) To have a high degree of oxidation and be not oxidized any more.
(V) To have high electrical insulating properties.

TABLE 1

Chemical-bond comparison table

| Bond | Bond length (Å) | Bond energy (kcal/mol) | Bond angle (°) |
|---|---|---|---|
| Si—O—Si | 1.64 | 108 | 130-160 |
| C—O—C | 1.43 | 86 | 110 |
| C—C—C | 1.54 | 85 | 109 |

It can be understood from those features that a silicone material constituted of a framework made up of siloxane bonds combined with one another in a three-dimensional arrangement at a high crosslink density is akin to inorganic materials such as glasses or stones and gives a protective film having high heat resistance and high light resistance. In particular, a silicone material having methyl substituents shows no absorption in the ultraviolet region and, hence, is less susceptible to photodecomposition and has excellent light resistance.

The silicone materials of the invention have a silicon content of 20% by weight or higher as stated above. In particular, the silicon content thereof is preferably 25% by weight or higher, more preferably 30% by weight or higher. On the other hand, the upper limit thereof is in the range of up to 47% by weight because of the fact that the glass consisting of $SiO_2$ only has a silicone content of 47% by weight.

The silicon content of a silicone material of the invention can be determined by analyzing the material by inductively coupled plasma spectrometry (hereinafter suitably abbreviated to "ICP"), for example, by the following method and calculating the content from the results.

{Determination of Silicon Content}

A silicone material which has been cured alone is pulverized to a particle diameter of about 100 gm. In the air, the particles placed in a platinum crucible are held at 450° C. for 1 hour, subsequently at 750° C. for 1 hour, and at 950° C. for 1.5 hours to burn the particles and remove carbon ingredients. Thereafter, a small amount of the resultant residue is mixed with at least a 10-fold amount of sodium carbonate, and this mixture is melted by heating with a burner. This melt is cooled, and desalted water is added thereto. Furthermore, the volume of this mixture is regulated so as to result in a silicon content of about several parts per million while regulating the pH to about a neutral value with hydrochloric acid. The resultant sample is subjected to ICP analysis.

[1-3-3] Silanol Content

The silicone materials of the invention have a silanol content which is generally 0.01% by weight or higher, preferably 0.1% by weight or higher, more preferably 0.3% by weight or higher, and is generally 10% by weight or lower, preferably 8% by weight or lower, more preferably 5% by weight or lower (feature (3)).

The silicone materials of the invention are less apt to change with the lapse of time because of the low silanol content. The materials have excellent long-term performance stability and have such excellent performance that the materials are low in both hygroscopicity and moisture permeability. It is, however, noted that members containing no silanol have poor adhesion and, hence, there is the optimal range of silanol content shown above.

The silanol content of a silicone material can be determined by subjecting the material to solid Si-NMR spectroscopy, for example, by the method described above under {Solid Si-NMR Spectroscopy} to obtain the proportion of the area of peaks assigned to silanol to the total peak area, determining from that proportion the proportion (%) of silicon atoms present in the form of silanol to all silicon atoms, and calculating a silanol content by comparing that silicon atom proportion with a silicon content obtained through separate analysis.

Since the silicone materials of the invention contain an appropriate amount of silanol, the silanol combines through hydrogen bonds with polar sites present in a device surface, and adhesion is thus developed. Examples of the polar sites include hydroxyl groups and the oxygen of metalloxane bonds.

Furthermore, the silicone materials of the invention, when heated in the presence of an appropriate catalyst, undergo dehydrating condensation with hydroxyl groups present in a device surface and thereby form covalent bonds. Thus, more tenacious adhesion can be developed.

On the other hand, in case where the silanol content thereof is too high, the system may have an increased viscosity and be difficult to apply or the system may have enhanced activity and solidify upon heating before low-boiling matter volatilizes. There is hence a possibility that foaming or increased internal stress might result and this might induce cracks, etc.

[1-3-4] Measured Hardness Value

It is preferred that the silicone materials of the invention should be in an elastomer state. Specifically, the materials have the following feature (4).

(4) To have a hardness value measured with Durometer Type A (Shore A) which is generally 5 or higher, preferably 7 or higher, more preferably 10 or higher, and is generally 90 or lower, preferably 80 or lower, more preferably 70 or lower.

When the silicone materials have a measured hardness value within that range, it is possible to obtain advantages that the materials are less apt to crack and that excellent reflow resistance and excellent temperature cycling resistance are attained. The term reflow means a soldering technique in which a solder paste is printed on a substrate, a part is placed thereon, and the solder is heated to bond the part. The term reflow resistance means the property of withstanding 10-second thermal shock including a maximum temperature of 260° C.

The measured hardness value (Shore A) can be obtained by the method described in JIS K6253. Specifically, a measurement can be made with a Type A rubber hardness meter manufactured by Kori Seiki MFG. Co., Ltd.

[1-3-5] Other Additives

The silicone materials of the invention can be used to incorporate into the encapsulating material a metallic element capable of giving a metal oxide having a high refractive index, for the purpose of regulating the refractive index of the encapsulating material. Examples of the metallic element giving a metal oxide having a high refractive index include Si, Al, Zr, Ti, Y, Nb, and B. These metallic elements may be used alone, or any desired combination of two or more thereof may be used in any desired proportion.

The state in which such a metallic element is present is not particularly limited so long as the transparency of the encapsulating material is not impaired. For example, a metallic element may be present as metalloxane bonds so as to form an even glass layer or may be present as particles in the encapsulating material. In the case where a metallic element is present as particles, the internal structure of the particles may be amorphous or a crystalline structure. However, from the standpoint of imparting a high refractive index, it is preferred that the particles have a crystalline structure. The particle diameter thereof is generally not larger than the emission wavelengths of the semiconductor light-emitting element, preferably 100 nm or less, more preferably 50 nm or less, especially preferably 30 nm or less, from the standpoint of not impairing the transparency of the encapsulating material. For example, by adding particles of silicon oxide, aluminum oxide, zirconium oxide, titanium oxide, yttrium oxide, niobium oxide, or the like to a silicone material, the metallic element can be rendered present in the encapsulating material.

The silicone materials of the invention may further contain known additives such as, e.g., a diffusing agent, filler, viscosity regulator, and ultraviolet absorber.

Examples of the silicone materials of the invention include the silicone materials described in, e.g., the description of Japanese patent application No. 2006-176468.

[1-4] Other Ingredients

In the solid-state light-emitting devices to be used in the illuminating device of the invention, any of additives known in this field can be used as optional ingredients besides the ingredients described above. Examples of the known additives include pigments, antioxidants, stabilizers (e.g., processing stabilizers such as phosphorus compound processing stabilizers, oxidation stabilizers, heat stabilizers, and light stabilizers such as ultraviolet absorbers), silane coupling agents, light-diffusing materials, and fillers.

[1-5] Structure of Solid-State Light-Emitting Devices

The solid-state light-emitting devices to be used in the illuminating device of the invention are not particularly limited in the specific structure thereof, so long as the devices comprise the light-emitting element and phosphor described above. It is, however, desirable that an LED should be used as the solid-state light-emitting element.

Embodiments of the solid-state light-emitting devices employing an LED are described below in detail. However, the invention should not be construed as being limited to the following explanation. In carrying out the invention, various modifications can be made therein within the range of the spirit thereof.

[1-5-1] Example 1

FIG. 1 is a view diagrammatically illustrating the configuration of an LED lamp as a solid-state light-emitting device according to an embodiment of the invention.

This LED lamp 1 of this embodiment comprises a wiring board 2, an LED 3 as a semiconductor light-emitting element, and a phosphor-containing part 4 which absorbs a part of light emitted from the LED 3 and emits light having wavelengths different from those of that light.

The wiring board 2 is a base for holding the LED 3 and the phosphor-containing part 4 thereon, and comprises a metallic base member 2A, an insulating layer 2D formed on the metallic base member 2A, and a pair of conductive parts 2B and 2C formed on the insulating layer 2D. The LED 3 has a pair of electrodes (not shown) on the opposed bottom face and top face thereof, and the bottom-face-side electrode of the LED 3 has been bonded to the top face of one conductive part 2B through an AuSn eutectic solder 5. The top-face-side electrode of the LED 3 has been connected to the other conductive part 2C with a metallic wire 106.

The LED 3 is one which emits light within the near-ultraviolet region to the blue region when electric power is supplied thereto, and those described hereinabove in section [1-1] can be used. Furthermore, the phosphor-containing part 4, which absorbs a part of light emitted from the LED 3 and emits light having different wavelengths, has been formed over the wiring board 2 so as to cover the LED 3 therewith. This LED lamp 1 has been configured so that a part of the light emitted from the LED 3 is absorbed as excitation light by a light-emitting substance (phosphor) contained in the phosphor-containing part 4 and another part thereof passes through the phosphor-containing part 4 and is emitted from the LED lamp 1. The phosphor-containing part 4 has been formed so as to leave the conductive parts 2B and 2C partly exposed, and the exposed areas of the conductive parts 2B and 2C serve as electrodes for power supply to the LED lamp 1.

Electrical connection between the LED 3 and the pair of conductive parts 2B and 2C of the wiring board 2 can be established by a suitable method according to the arrangement of electrode groups (not shown) on the LED 3. For example, in the case where electrode groups have been arranged on one side only of the LED 3, the LED 3 is arranged so that the side having the electrodes faces upward, and the electrodes in each group are connected respectively to the conductive parts 2B and 2C with, for example, gold wires 106. Thus, the conductive parts 2B and 2C can be electrically connected to the LED 3. In the case where the LED 3 is a flip chip (face down), the electrodes of this LED 3 are bonded to the conductive parts 2B and 2C with gold bumps or a solder and can be thereby electrically connected thereto.

The phosphor-containing part 4 comprises a transparent resin and a phosphor. The phosphor is a substance which is excited by light emitted from the LED 3 and emits light having different wavelengths. The kind of the phosphor to be contained in the phosphor-containing part 4 is selected so that either the sum of the light emitted from the LED 3 and the light emitted from the phosphor contained in the phosphor-containing part 4 or the light emitted from the phosphor satisfies $-0.02 \leq \Delta uv \leq 0.02$ in an xy chromaticity diagram according to the XYZ color system (CIE 1931). The transparent resin not only transmits the light emitted from the LED 3 and phosphor but also has the function of encapsulating the LED 3 therein and dispersedly holding the phosphor therein. Any desired transparent resin can be used so long as the resin has these functions. An encapsulating material described above in section [1-3] is used here.

A plurality of such LED lamps 1, which each are a solid-state light-emitting device comprising an LED 3 and a phosphor-containing part 4 as described above, are integrated and arranged, for example, on a substrate to constitute a light-emitting part according to the invention.

[1-5-2] Example 2

In embodiment 1, an example was shown in which an LED 3 was encapsulated in a phosphor-containing part 4 to thereby configure the solid-state light-emitting element and the phosphor so as to constitute the same module. However, a solid-state light-emitting element and a phosphor can be configured so as to constitute separate modules. A solid-state light-emitting device as embodiment 2 is explained below which comprises a solid-state light-emitting element and a phosphor in separate modules.

Figure 2A:
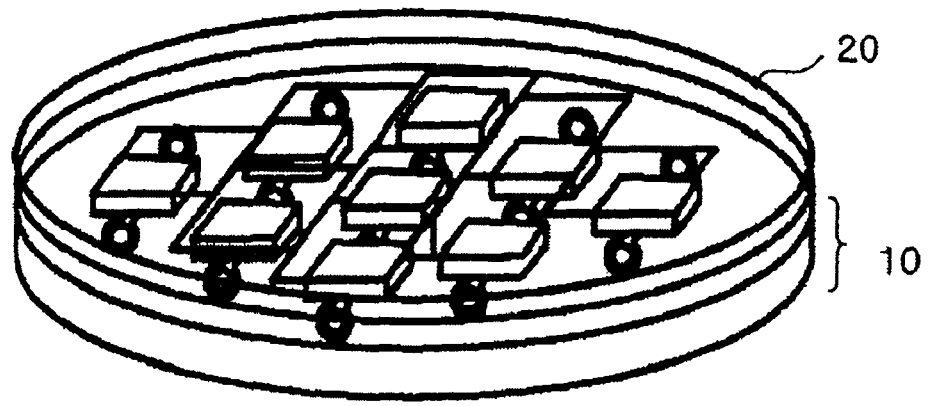
FIG. 2A is a diagrammatic slant view of a solid-state light-emitting device according to embodiment 2 of the invention.
Figure 2B:
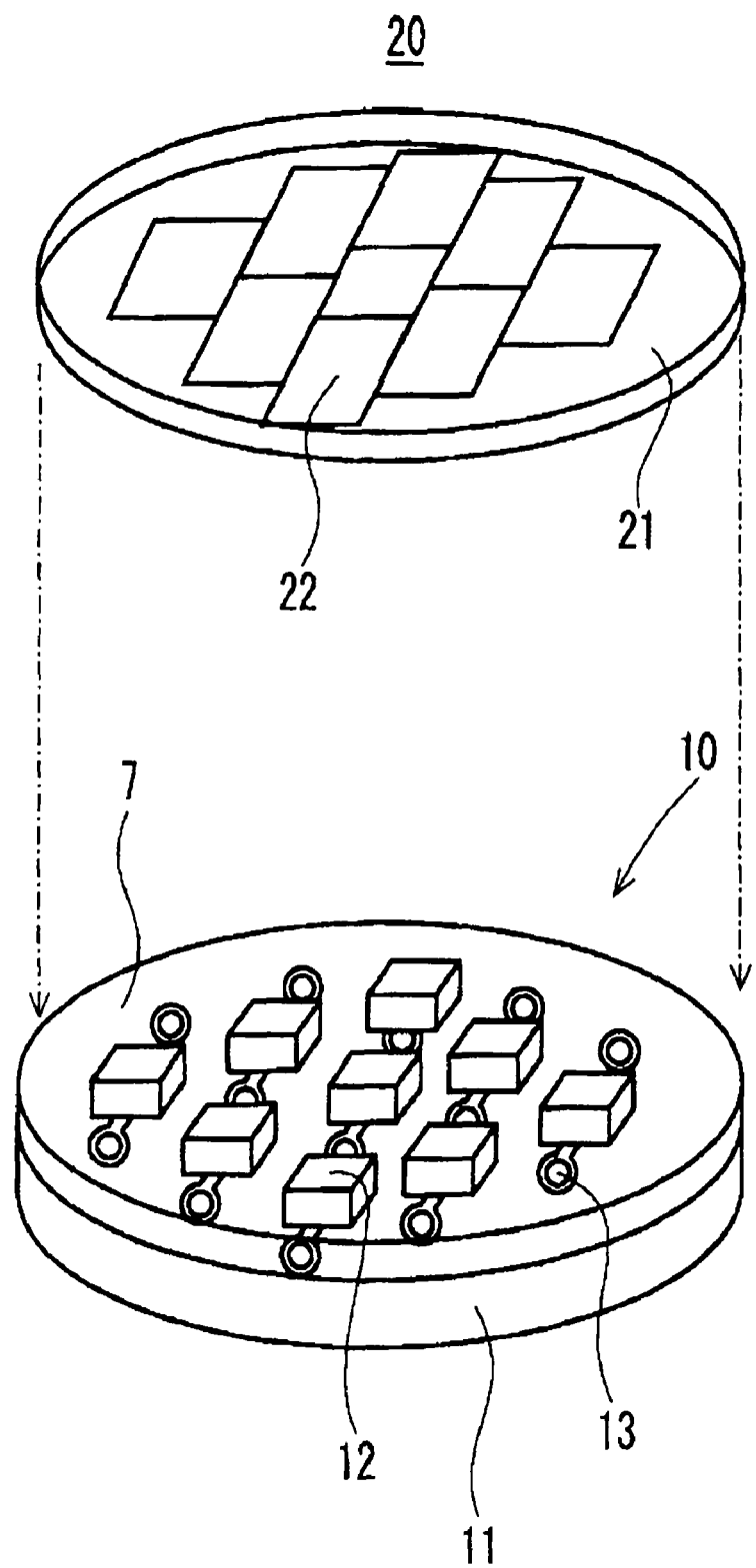
FIG. 2B is an exploded slant view of the solid-state light-emitting device shown in FIG. 2A.

The solid-state light-emitting device shown in FIG. 2A comprises: a solid-state light-emitting element module 10 in which solid-state light-emitting elements have been arranged into a module; and a phosphor module 20 in which phosphor-containing parts have been arranged into a module. As shown in FIG. 2B, the phosphor module 20 is bonded to the solid-state light-emitting element module 10 to thereby constitute the solid-state light-emitting device.

Each module is explained below.

[1-5-2-1] Solid-State Light-Emitting Element Module

As shown in FIG. 2B, the solid-state light-emitting element module 10 comprises a base 11 and at least one solid-state light-emitting element 12 arranged on a base 11.

(i) Base

The base 11 of the solid-state light-emitting element module 10 serves to fix and support the solid-state light-emitting elements 12 thereon. In FIG. 2B, a disk-form base 11 is shown. However, a base made of any desired material and having any desired shape and dimensions can be used as the base 11 unless this considerably lessens the effects of this embodiment, so long as the base can withstand conditions, including temperature conditions, under which the base of the solid-state light-emitting element module of this embodiment is used. On that surface of the base 11 which has the solid-state light-emitting elements 12 arranged thereon, a molded part 7 may have been formed over the whole base 11 so as to encapsulate the solid-state light-emitting elements 12 therein. As a resin for constituting the molded part 7, use can be made of the same resin as the transparent resin used in the phosphor-containing part of embodiment 1.

(ii) Solid-State Light-Emitting Elements

The solid-state light-emitting elements 12 can be the same as those described above, especially preferably LEDs, in order that the solid-state light-emitting device emits primary light. Consequently, when a solid-state light-emitting element 12 and phosphor-containing parts 22 are used to output primary light as shown in FIG. 2B, at least one solid-state light-emitting element 12 is arranged in the solid-state light-emitting module 10. In this case, the module may be configured so that each solid-state light-emitting element 12 can be common among two or more phosphor parts 22.

The number of solid-state light-emitting elements 12 can be suitably determined according to the size of the base 11, etc. In this embodiment, a plurality of, specifically nine, solid-state light-emitting elements 12 have been arranged on the base 11.

(iii) Other Members

The solid-state light-emitting element module 10 may comprise members other than the base 11 and the solid-state light-emitting elements 12. For example, the solid-state light-emitting element module 10 may have wiring 13 for supplying electric power to the solid-state light-emitting elements 12. Usually, this wiring 13 is arranged on the base 11 of the solid-state light-emitting module 10. In the case where a plurality of solid-state light-emitting elements 12 have been arranged on the base 11, wiring 13 is arranged so that electric power can be supplied to each solid-state light-emitting element 12.

[1-5-2-2] Phosphor Module

As shown in FIG. 2B, the phosphor module 20 is bonded to the top face of the solid-state light-emitting element module 10 to thereby constitute the solid-state light-emitting device as this embodiment together with the solid-state light-emitting module 10 and, according to need, with other members. The phosphor module 20 comprises a base 21 and phosphor-containing parts 22 arranged on the base 21. From the standpoint of effectively utilizing light from the solid-state light-emitting element module 10, it is preferred to dispose the phosphor module 20 so as to be in close contact with the solid-state light-emitting element module 10. However, the phosphor module 20 may be arranged so as to leave a space between the phosphor module 20 and the solid-state light-emitting element module 10, depending on the material of the surface of the solid-state light-emitting element module 10 and on the transparent resin material of the phosphor module 20.

(i) Base

The base 21 of the phosphor module 20 is a support for the phosphor-containing parts 22, and can be constituted of, for example, a transparent film or plate (sheet), etc.

The base 21 of the phosphor module 20 can be made of any desired material and have any desired shape and dimensions unless this considerably lessens the effects of this embodiment, so long as this base can withstand conditions, including temperature conditions, under which the base of the phosphor module of this embodiment is used.

(ii) Phosphor-Containing Parts

The phosphor-containing parts 22 have been formed in a partial region of the base 21. Like the phosphor-containing part 4 described with regard to embodiment 1, the phosphor-containing parts 22 are constituted of a transparent resin and a phosphor dispersed in the transparent resin. With respect to the kind of the phosphor contained in the phosphor-containing parts 22, any desired kind can be selected so long as the emission color of light from the whole solid-state light-emitting device shown in FIG. 2A satisfies $-0.02 \leqq \Delta uv \leqq 0.02$ in an xy chromaticity diagram according to the XYZ color system (CIE 1931). For example, plurality of kinds of phosphors can be contained in each phosphor-containing part 22 so that an emission color having a desired color temperature is obtained from each phosphor-containing part 22. Alternatively, at least one phosphor to be contained in each phosphor-containing part 22 may be selected so that an emission color having a desired color temperature is obtained by mixing emission from the plurality of phosphor-containing parts 22.

The phosphor-containing parts 22 are usually arranged on a surface of the base 21. However, in the case where the transparent resin of the phosphor-containing parts 22 is the same as the material constituting the base 21, the phosphor-containing parts 22 may be constituted by incorporating a phosphor into a partial region of the base 21.

In the case where phosphor-containing parts 22 are formed on a surface of the base 21, examples of methods for disposing the phosphor-containing parts 22 on the base 21 include a method in which a dispersion is produced by dispersing a phosphor in a transparent resin (binder resin) and this dispersion is pattern-wise applied to the base 21.

Examples of specific techniques for pattern-wise forming phosphor-containing parts 22 on the base 21 include printing techniques, such as screen printing, gravure printing, flexographic printing, and ink-jet printing, and a method in which a phosphor is dispersed in a photosensitive resist as a transparent resin to produce a dispersion and this dispersion is applied to a surface of the base 21, subsequently exposed to light through a mask, and developed to remove unexposed areas and thereby form a pattern. It is a matter of course that other methods for forming phosphor-containing parts 22 at a time are usable besides those methods. For example, any desired patterning technique for use in color filter production can be utilized, and it is also possible to use transfer molding or injection molding, depending on the transparent resin selected. Furthermore, for forming phosphor-containing parts 22 only in necessary areas, use can be made of a method using a general dispenser.

With respect to the position of the phosphor-containing parts 22, it is preferred that the phosphor-containing parts 22 should be arranged opposite the solid-state light-emitting elements 12 of the solid-state light-emitting element module 10 so that light emitted from the solid-state light-emitting elements 12 can be efficiently received by the phosphor-containing parts 22.

The number of phosphor-containing parts 22 may be 1 or may be 2 or more, according to the size of the base 21, etc. In this embodiment, nine phosphor-containing parts 22 have been arranged in accordance with the number of solid-state light-emitting elements 12 arranged in the solid-state light-emitting element module 10.

(iii) Other Members

The phosphor module 20 may comprise members other than the base 21 and the phosphor-containing parts 22.

The phosphor module 20 having the configuration described above is combined with the solid-state light-emitting element module 10, and light (excitation light) emitted from the solid-state light-emitting elements 12 of the solid-state light-emitting element module 10 is received by the phosphor-containing parts 22. Upon the reception of light from the solid-state light-emitting elements 12 by the phosphor-containing parts 22, the phosphor in the phosphor-containing parts 22 is excited to emit fluorescence (i.e., primary light).

[2] Light-Emitting Part

The illuminating device of the invention comprises a light-emitting part in which the solid-state light-emitting devices described above are integrated and arranged. In the light-emitting part, the plurality of solid-state light-emitting devices are arranged so that primary light emitted from the solid-state light-emitting devices is synthesized together within a given distance from the light-emitting face of the light-emitting part and synthesized light is emitted.

In the case where the solid-state light-emitting module 10 comprises a plurality of solid-state light-emitting elements 12 and the phosphor module 20 comprises a plurality of phosphor-containing parts 22 as described above with regard to embodiment 2, the whole configuration shown in FIG. 2A may be regarded as a solid-state light-emitting device and a light-emitting part can be constituted by integrally arranging a plurality of such devices. Alternatively, each pair of a solid-state light-emitting element 12 and a phosphor-containing part 22 arranged opposite to each other may be regarded as a solid-state light-emitting device to constitute the whole configuration shown in FIG. 2A as one light-emitting part. In the latter case, the kind, content, etc. of the phosphor contained in each phosphor-containing part 22 are selected so that plurality of kinds of primary light differing in color temperature is emitted from the light-emitting part.

[2-1] Arrangement of Solid-State Light-Emitting Devices

In the illuminating device of the invention, the number and disposition of solid-state light-emitting devices to be integrated can be suitably selected according to the size of the illuminating device designed and to a required illuminance.

In the case where the solid-state light-emitting devices are surface-mount-device type LED lamps (hereinafter referred to also as "SMDs") such as those described with regard to embodiment 1, when the structural axes (or optical axes) L (shown in FIG. 3) of a plurality of integrated SMDs are not parallel with each other, it is difficult to obtain illuminance evenness on a surface illuminated with the light synthesized from light from the plurality of SMDs. Especially when SMDs are arranged apart from one another, it is difficult to obtain illuminance evenness. It is therefore preferred that when a plurality of SMDs are mounted on a mounting substrate to constitute a light-emitting part, the SMDs 100 should be arranged so that the structural axes (or optical axes) L thereof are perpendicular to the plane of the mounting substrate.

In the case where the solid-state light-emitting devices are SMD LED packages such as that described above, the light-emitting face of the light-emitting part in the invention is defined as a plane which includes the emission-side end of each solid-state light-emitting device and is parallel with the wiring board on which the solid-state light-emitting elements are integrated and arranged. In the case where solid-state light-emitting devices and light-emitting parts have been arranged into modules as in embodiment 2 described above, the emission-side face of the phosphor module is taken as a light-emitting face.

[2-2] Combination of Solid-State Light-Emitting Devices

The illuminating device of the invention comprises a plurality of solid-state light-emitting devices. The plurality of solid-state light-emitting devices emit two or more kinds of lights (primary lights) differing in emission color. By mixing these two or more kinds of primary lights differing in emission color, synthesized light can be obtained.

Although the emission colors of the primary light emitted from the solid-state light-emitting devices can be suitably set and combined, it is preferred that the emission colors should differ in correlated color temperature. Thus, target colors having a wide range spectra from near-ultraviolet light to near-infrared light can be reproduced, including a spectrum of illumination light sources such as daylight/neutral-white/white/warm-white/incandescent-lamp-color, CIE standard illuminants (A, B, C, and D65), and a sunlight (natural light).

The correlated color temperatures of primary light emitted from the solid-state light-emitting devices are preferably 2,000K or higher, more preferably 2,200K or higher, and are preferably 50,000K or lower, more preferably 10,000K or lower. The wider the range of correlated color temperatures between the solid-state light-emitting device highest in correlated color temperature and the solid-state light-emitting device lowest in correlated color temperature among the plurality of solid-state light-emitting devices used in the illuminating device, the more the set range of correlated color temperature of synthesized light can be widened. However, in case where the range of correlated color temperatures is set so as to be excessively wide, a difference in emission color is apt to be noticed when the light-emitting part of the illuminating device is directly viewed or the shade formed by illuminating an object is viewed. It is therefore preferred to employ a suitable range according to applications of the illuminating device, etc.

The primary light has correlated color temperatures selected so as to satisfy $-0.02 \leq \Delta uv \leq 0.02$ in an xy chromaticity diagram according to the XYZ color system (CIE 1931), and may be regarded to be substantially on a blackbody radiation locus. The primary color emitted from the solid-state light-emitting devices hence has a whitish color tone. Because of this, a considerable reduction is attained in the sense of uncomfortableness which may be given with regard to the color of illuminating light when the light-emitting part of this illuminating device is directly viewed or which may be given with regard to the state of the shadow formed when an object is illuminated, as compared with illuminating devices in which blue light, green light, and red light are mixed together to obtain white light as in conventional techniques.

[2-3] Energy Ratio of Emission Parts of Solid-State Light-Emitting Devices

As described above in section [2-2], in the illuminating device of the invention, primary light having two or more emission colors differing in correlated color temperature is emitted from the plurality of solid-state light-emitting devices and the primary light is mixed together, whereby synthesized light having a desired color can be produced. In this illuminating device, the emitted-light energy for the solid-state light-emitting devices is set for each correlated color temperature. As a result, the correlated color temperature of synthesized light can be regulated so as to be between the lowest correlated color temperature and highest correlated color temperature of primary light from the solid-state light-emitting devices.

The term "energy of the emission part of a solid-state light-emitting device" means the amount of energy of light emitted from the solid-state light-emitting device for each color temperature. In the case where the illuminating device comprises a plurality of solid-state light-emitting devices emitting light having the same correlated color temperature, that term means the total energy of the plurality of solid-state light-emitting devices. Examples of factors which determine energy amount include the area of the emission parts of solid-state light-emitting devices, emission time for light-emitting devices, operating current for solid-state light-emitting devices, and amount of electric energy [(operating current)×(voltage)] for solid-state light-emitting devices.

[2-3-1] Area of Emission Parts of Solid-State Light-Emitting Devices

The term "area of the emission parts of solid-state light-emitting devices" has the following meaning. The emission part of a unit solid-state light-emitting device is regarded as a plane having an area per unit, and this area is multiplied by the number of solid-state light-emitting devices for the same correlated color temperature. The resultant product is the area of the emission parts.

Namely, the number of solid-state light-emitting devices and the area per unit are regulated with respect to each correlated color temperature, whereby an energy ratio among emission parts can be regulated.

Consequently, when the energy-amount-determining factors other than the area of emission parts are the same to the correlated color temperatures, then the area of the emission parts of solid-state light-emitting devices for each correlated color temperature can be regarded as the energy of the emission parts of the solid-state light-emitting devices to calculate the energy ratio therefrom.

[2-3-2] Emission Time for Solid-State Light-Emitting Devices

The term "emission time for solid-state light-emitting devices" has the following meaning. The time period during which light is emitted from a unit solid-state light-emitting device in a given time period is taken as emission time per unit, and this emission time is multiplied by the number of solid-state light-emitting devices for the same correlated color temperature. The resultant product is that emission time.

Namely, the emission time for solid-state light-emitting devices is regulated with respect to each correlated color temperature, whereby an energy ratio among emission parts can be regulated.

Consequently, when the energy-amount-determining factors other than emission time are the same to the correlated color temperatures, then the emission time for solid-state light-emitting devices for each correlated color temperature can be regarded as the energy of the emission parts of the solid-state light-emitting devices to calculate the energy ratio therefrom.

[2-3-3] Operating Current for Solid-State Light-Emitting Devices

The term "operating current for solid-state light-emitting devices" has the following meaning. An operating current for a unit solid-state light-emitting device is taken as operating current per unit, and this operating current is multiplied by the number of solid-state light-emitting devices for the same correlated color temperature. The resultant product is that operating current. When the solid-state light-emitting devices are of the same type, the operating currents are approximately the same.

Namely, the operating current for solid-state light-emitting devices is regulated with respect to each correlated color temperature, whereby an energy ratio among emission parts can be regulated.

Consequently, when the energy-amount-determining factors other than operating current are the same to the correlated color temperatures, then the operating current for solid-state light-emitting devices for each correlated color temperature can be regarded as the energy of the emission parts of the solid-state light-emitting devices to calculate the energy ratio therefrom.

[2-3-4] Amount of Electric Energy [(operating current)× (voltage)] for Solid-State Light-Emitting Devices The term "amount of electric energy for solid-state light-emitting devices" has the following meaning. An amount of electric energy for a unit solid-state light-emitting device is taken as the amount of electric energy per unit, and this amount of electric energy is multiplied by the number of solid-state light-emitting devices for the same correlated color temperature. The resultant product is that amount of electric energy. When the solid-state light-emitting devices are of different types (regarding element structure, element size, wavelength, etc.), the devices differ in operating voltage.

Namely, the amount of electric energy for solid-state light-emitting devices is regulated with respect to each correlated color temperature, whereby an energy ratio among emission parts can be regulated.

Consequently, when the energy-amount-determining factors other than the amount of electric energy are the same to the correlated color temperatures, then the amount of electric energy for solid-state light-emitting devices for each correlated color temperature can be regarded as the energy of the emission parts of the solid-state light-emitting devices to calculate the energy ratio therefrom.

[2-3-5] Disposition of Solid-State Light-Emitting Devices

Examples of factors contributing to light modulation, besides the energy ratio described above, include to properly dispose solid-state light-emitting devices for each correlated color temperature. Examples of the proper disposition of solid-state light-emitting devices for respective correlated color temperatures include the following.

(i) Solid-state light-emitting devices differing in correlated color temperature are arranged so as to adjoin each other and solid-state light-emitting devices equal in correlated color temperature are arranged so as not to adjoin each other as far as possible, whereby a white color having no unevenness can be attained. In this case, when an energy ratio among correlated color temperatures is regulated by regulating areal proportion, an even white color can be attained by combining patterns comprising a large number of solid-state light-emitting devices for each correlated color temperature.

For example, in the case where two kinds of solid-state light-emitting devices differing in the correlated color temperature of outputted light in which each kind consists of a plurality of solid-state light-emitting devices are to be arranged in a matrix arrangement, the solid-state light-emitting devices can be arranged so that solid-state light-emitting devices differing in correlated color temperature are alternately arranged in the line direction and in the row direction. In the case where three kinds of solid-state light-emitting devices differing in correlated color temperature in which each kind consists of a plurality of solid-state light-emitting devices are to be arranged in a matrix arrangement, examples of arrangement patterns in which one kind of devices for a specific correlated color temperature have a large areal proportion are shown in FIGS. 4 (a) and (b). In FIG. 4 (a) to (d), the three kinds of solid-state light-emitting devices differing in correlated color temperature are distinguished by using W1, W2, and W3. Examples in which the areal proportion of W1 is large are shown. It is possible to replace W1, W2, and W3 with each other. Furthermore, the patterns shown in FIG. 4 (a) to (d) may be suitably combined to constitute a module.

(ii) A technique may be used in which solid-state light-emitting devices differing in correlated color temperature are arranged so as to adjoin each other and solid-state light-emitting devices equal in correlated color temperature are arranged so as to adjoin each other only partly. FIG. 5 (a) to (d) show arrangement examples in the case where three kinds of solid-state light-emitting devices differing in correlated color temperature in which each kind consists of a plurality of solid-state light-emitting devices are arranged in a matrix arrangement. Four pattern examples are shown in which the areal proportion for each correlated color temperature is constant and an energy ratio is regulated by regulating the amount of operating electric energy or operating current. In FIG. 5 (a) to (d) also, the three kinds of solid-state light-emitting devices differing in correlated color temperature are distinguished by using W1, W2, and W3. The pattern shown in FIG. 5 (c) is the same as the pattern shown in FIG. 4 (a). It is possible to replace W1, W2, and W3 with each other. Furthermore, the patterns shown in FIG. 5 (a) to (d) may be suitably combined to constitute a module.

Figure 6:
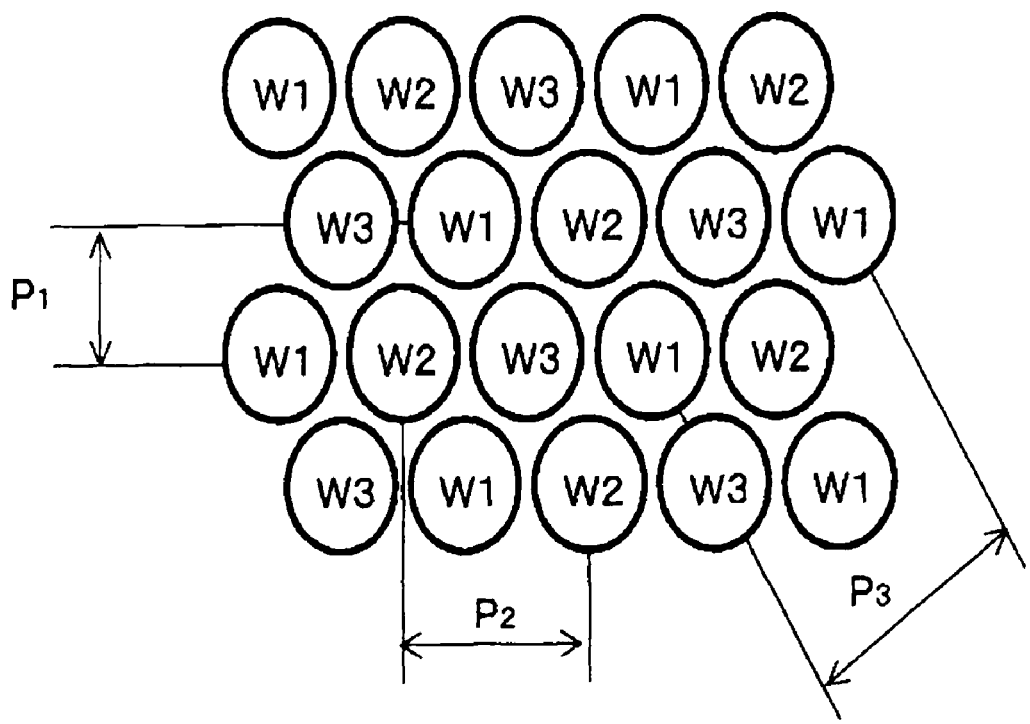
FIG. 6 is a diagrammatic view illustrating an example of the arrangement of solid-state light-emitting devices within an illuminating device of the invention.

(iii) In disposing three kinds of solid-state light-emitting devices differing in correlated color temperature (W1, W2, and W3), minimum units of a regular-triangle shape which each are constituted of a closest-packed combination of one W1, one W2, and one W3 are arranged as repeating units in order to narrow the spacing (pitches $P_1$, $P_2$, and $P_3$) among the solid-state light-emitting devices (W1, W2, and W3), as shown in, e.g., FIG. 6. Narrowing the pitches $P_1$, $P_2$, and $P_3$ produces an effect that the color-mixing distance for the solid-state light-emitting devices for respective correlated color temperatures is reduced.

(iv) Other examples of configurations in which three kinds of solid-state light-emitting devices differing in correlated color temperature (W1, W2, and W3) are arranged with a reduced spacing (pitch) include a honeycomb structure in which a square arrangement of solid-state light-emitting devices is inclined at an angle of 45 degrees, such as that shown in FIG. 7 (a). This arrangement can have a narrower pitch of solid-state light-emitting devices than the square arrangement of solid-state light-emitting devices (FIG. 7 (b)) and, hence, can produce the effect of reducing the color-mixing distance for the solid-state light-emitting devices for respective correlated color temperatures.

[2-4] Energy Control of Solid-State Light-Emitting Devices

Of the area of emission parts, emission time, operating current, amount of electric energy, and disposition of solid-state light-emitting devices described above, the area of emission parts and the disposition, once set, are difficult to use for changing an energy ratio between emission colors. However, emission time, operating current, and amount of electric energy can be used to extremely easily change an energy ratio between emission colors with electrical control of the solid-state light-emitting devices, so long as the illuminating device is provided with a controller which controls operating conditions for solid-state light-emitting devices differing in emission color, with respect to each emission color. The operating conditions for solid-state light-emitting devices which are controlled by the controller can, for example, be the emission time, operating current, or amount of electric energy described above.

Figure 8:
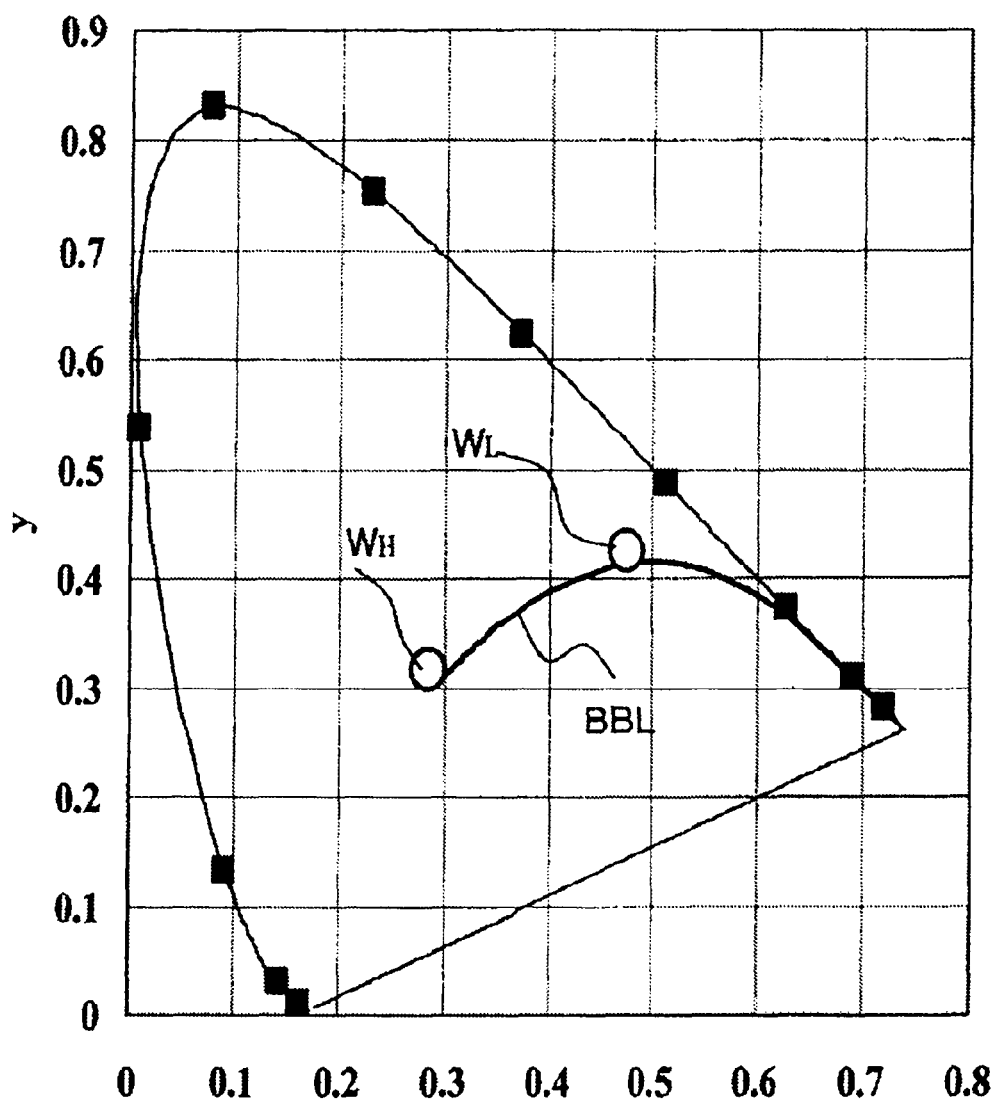
FIG. 8 is an xy chromaticity diagram showing an example of relationships between blackbody radiation locus and correlated color temperature in the case where an illuminating device according to the invention has two kinds of solid-state light-emitting devices differing in correlated color temperature.
Figure 9:
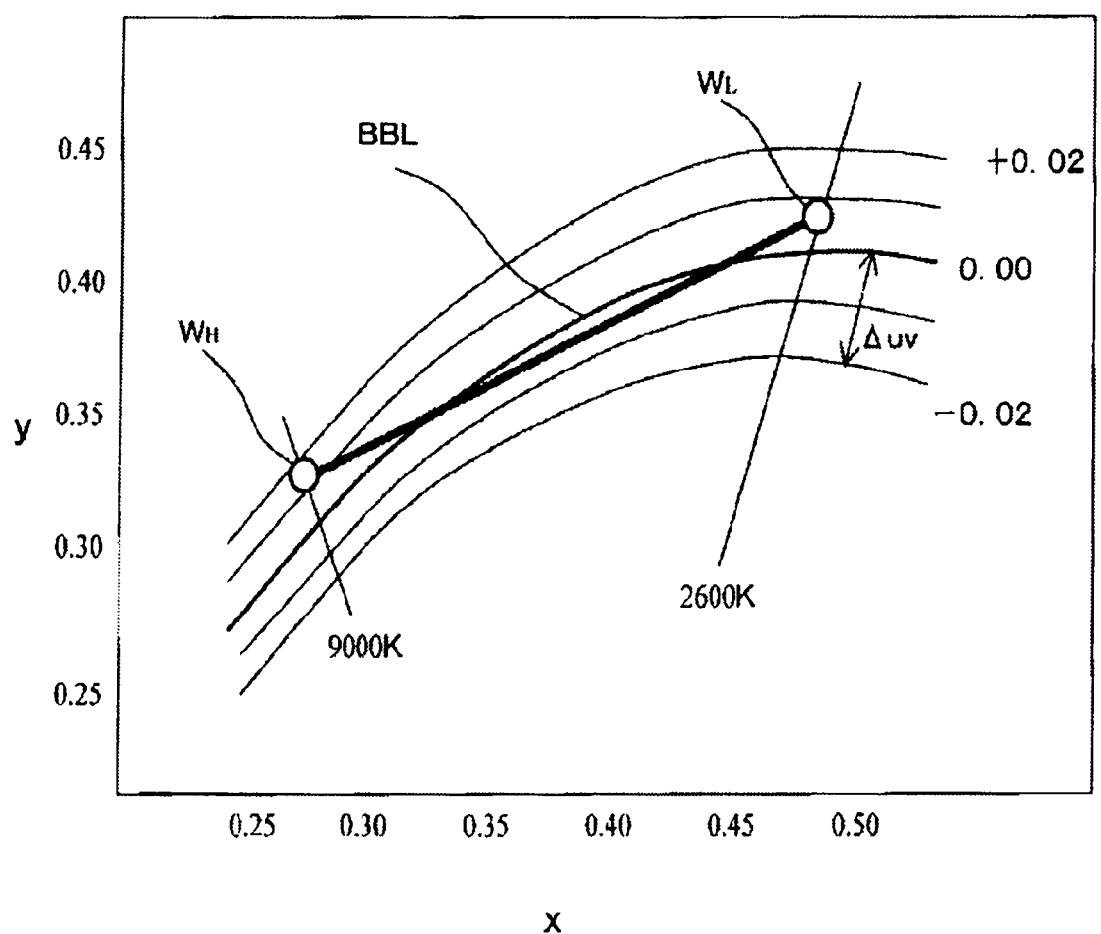
FIG. 9 is an enlarged view of an important part of the xy chromaticity diagram shown in FIG. 8.

For example, an illuminating device comprising two kinds of solid-state light-emitting devices emitting lights respectively represented by chromaticity points $W_L$ and $W_H$ in an xy chromaticity diagram as shown in FIG. 8 is imagined. As shown in FIG. 9, which is an enlarged view of an important part of FIG. 8, the correlated color temperature at the chromaticity point $W_L$ is taken as 2,600K and the correlated color temperature at the chromaticity point $W_H$ is taken as 9,000K. It is further assumed that the chromaticity point $W_L$ has a deviation $\Delta uv$ from a blackbody radiation locus BBL of +0.005 and the chromaticity point $W_H$ has a deviation $\Delta uv$ from the blackbody radiation locus BBL of +0.01.

In that case, by controlling operating conditions, such as emission time, operating current, or electric-energy amount, for the two kinds of solid-state light-emitting devices differing in the correlated color temperature of emission color, an energy ratio between the solid-state light-emitting devices can be freely changed for each emission color and correlated color temperature can be regulated at will on the straight line connecting between the chromaticity point $W_L$ and the chromaticity point $W_H$. In addition, the chromaticity points $W_L$ and $W_H$ satisfy $-0.02 \leq \Delta uv \leq 0.02$, and the straight line connecting these chromaticity points $W_L$ and $W_H$ is also within the range of $-0.02 \leq \Delta uv \leq 0.02$. Consequently, the light emitted from this illuminating device can be considered to be located substantially along the blackbody radiation locus BBL and is suitable as illuminating light.

Figure 10:
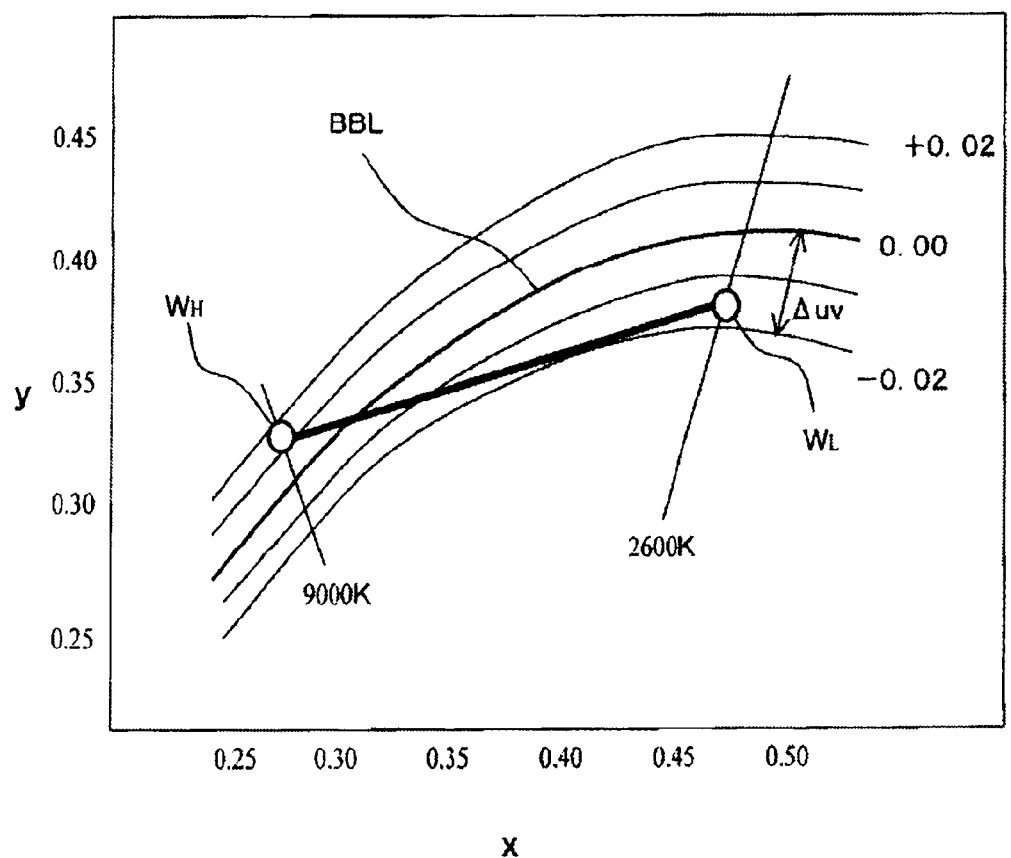
FIG. 10 is an enlarged view of an important part of an xy chromaticity diagram showing another example of relationships between blackbody radiation locus and correlated color temperature.

The example shown in FIG. 9 relates to the case where the chromaticity points $W_L$ and $W_H$ each have a positive value of $\Delta uv$. However, the $\Delta uv$ of the chromaticity point $W_L$ and the $\Delta uv$ of the chromaticity point $W_H$ may be positive and negative, respectively, as shown in FIG. 10, or both may be negative although this case is not shown. Furthermore, an illuminating device is possible which comprises three kinds of solid-state light-emitting devices emitting lights respectively represented by chromaticity points $W_L$, $W_M$, and $W_H$ in an xy chromaticity diagram as shown in FIG. 11.

In this case, operating conditions for the solid-state light-emitting devices are controlled with respect to each emission color. As a result, the correlated color temperature of the emission color of light from the illuminating device can be changed within the triangle having the three chromaticity points $W_L$, $W_M$, and $W_H$ as the vertexes. In addition, since the deviation $\Delta uv$ of each of the chromaticity points $W_L$, $W_M$, and $W_H$ from a blackbody radiation locus BBL satisfies $-0.02 \leq \Delta uv \leq 0.02$, color temperature control within a region closer to the blackbody radiation locus BBL is possible.

Figure 11:
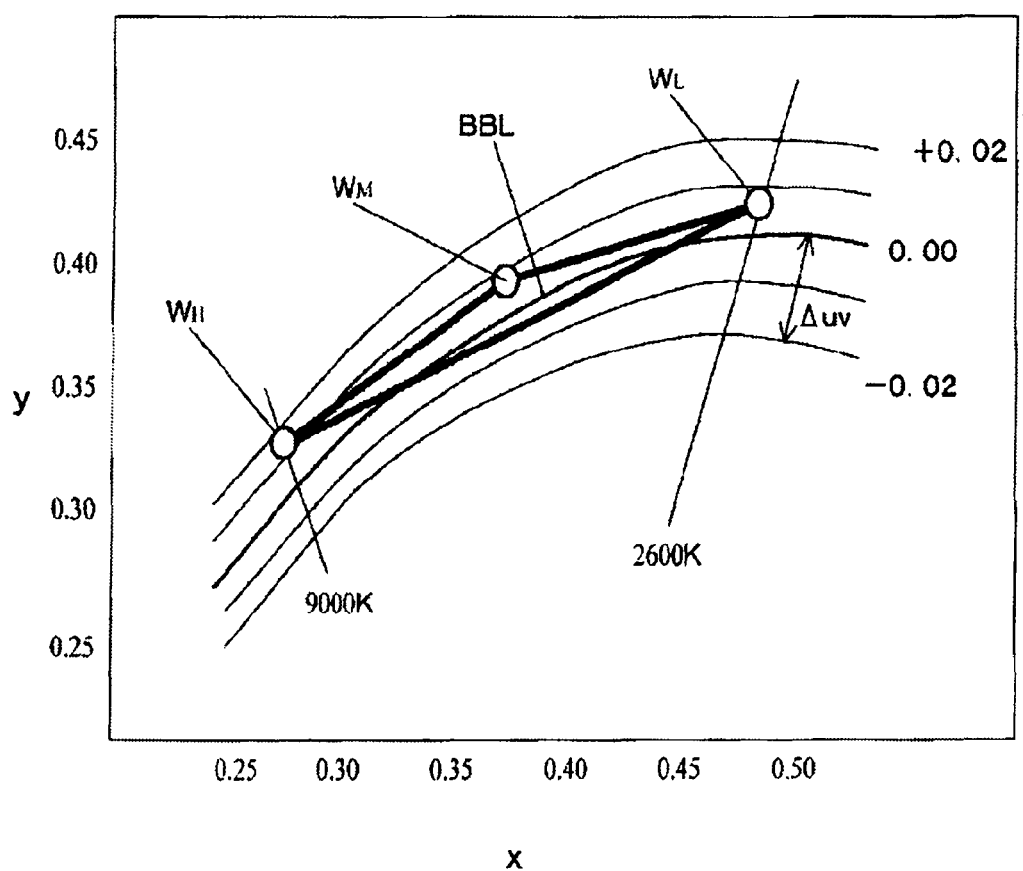
FIG. 11 is an enlarged view of an important part of an xy chromaticity diagram showing an example of relationships between blackbody radiation locus and correlated color temperature in the case where an illuminating device according to the invention has three kinds of solid-state light-emitting devices differing in correlated color temperature.

Although the example shown in FIG. 11 relates to the case where the light emitted from the solid-state light-emitting devices has three chromaticity points, the number of chromaticity points may be 4 or more. Namely, an illuminating device comprising four or more kinds of solid-state light-emitting devices differing in emission color is possible.

Values of $\Delta uv$ may be positive or negative as stated above. However, of emission colors having the same correlated color temperature, an emission color having a smaller value of $\Delta uv$ tends to have a lower luminance. Consequently, from the standpoint of obtaining higher-luminance emission, it is preferred that at least one emission color should have a positive value of $\Delta uv$, and it is more preferred that all emission colors should have a positive value of $\Delta uv$.

With respect to the control of operating conditions for solid-state light-emitting devices, the case where emission time for solid-state light-emitting devices is controlled is explained below as an example.

Specific controllers which control emission time for solid-state light-emitting devices include one based on a general alternating-current power source (50/60 Hz) or one employing a high-frequency circuit. The desired control can be attained with PWM (pulse width modulation) control in which the solid-state light-emitting devices are caused to emit light with pulsation. In the PWM control of two kinds of solid-state light-emitting devices differing in emission color, the two kinds of solid-state light-emitting devices are alternately switched on at a frequency of, e.g., 200 Hz and the ratio of the switch-on time for one kind of solid-state light-emitting devices to that for the other is changed.

Figure 12:
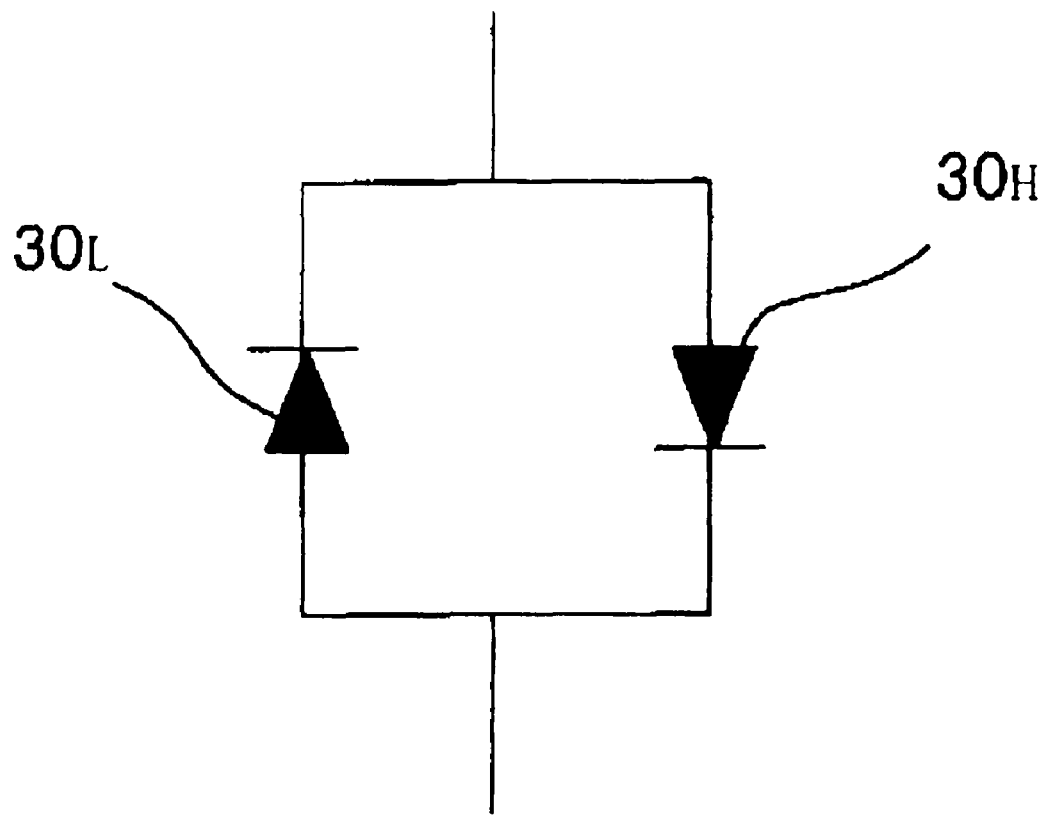
FIG. 12 shows an example of circuit diagrams for the case where an energy ratio between semiconductor light-emitting elements is controlled by means of PWM control.

In this case, the two kinds of solid-state light-emitting devices may be separately controlled. However, a simpler method for solid-state light-emitting devices employing LEDs as the solid-state light-emitting elements is as follows. As shown in FIG. 12, two kinds of solid-state light-emitting devices $30_L$ and $30_H$ differing in the correlated color temperature of emission color are parallel-connected to constitute a circuit so as to have forward bias directions opposite from each other, and an alternating-current voltage pulse is applied to this circuit. According to this method, by merely controlling the duty ratio of the pulse in one period, the solid-state light-emitting devices $30_L$ and $30_H$ are alternately switched on according to the duty ratio. As a result, the correlated color temperature of the emission color of light from the light-emitting part can be changed according to the duty ratio for the solid-state light-emitting devices $30_L$ and $30_H$.

As an application of the technique described above, an illuminating device can be realized which comprises a plurality of light-emitting parts and in which the correlated color temperature of light emitted from each light-emitting part is independently controlled. Examples of such illuminating devices include an illuminating device which comprises, as shown in FIG. 13, a plurality of light-emitting parts 35, a plurality of PWM control circuits 36 respectively corresponding to the light-emitting parts 35, and a light-emitting-part control circuit 37 which independently controls the PWM control circuits 36. Each light-emitting part 35 comprises plurality of kinds of solid-state light-emitting devices which emit different lights differing in the correlated color temperature of emission color. Each PWM control circuit 36 performs the PWM control of the plurality of kinds of solid-state light-emitting devices of the corresponding light-emitting part 35. The light-emitting-part control circuit 37 gives a command regarding pulse duty ratio separately to the PWM control circuits 36. In the illuminating device shown in FIG. 12, the correlated color temperatures for the light-emitting parts 35 can be separately changed. Although the illuminating device shown in FIG. 12 has three light-emitting parts 35, the number of light-emitting parts 35 may be 2 or may be 4 or more.

As described above, by controlling operating conditions for solid-state light-emitting devices, illumination quality can be regulated at will with extremely simple control, according to need concerning an object to be illuminated, environment to be illuminated, etc.

[3] Illuminating Device

[3-1] Illuminance

In the illuminating device of the invention, the illuminance as measured in the position apart from the light-emitting face of the light-emitting part at a distance of 30 cm in the direction perpendicular thereto is preferably 150 lx or higher, more preferably 300 lx or higher, especially preferably 500 lx or higher. In case where the illuminance is too low, the synthesized light is too feeble and, hence, the illuminated surface is too dark. Conversely, in case where the illuminance is too high, the synthesized light is too dazzling. In either case, there is a possibility that the illuminating device is unsuitable for illumination applications. On the other hand, the quality of illumination is not solely determined by illuminance, and color temperature and color rendering properties also affect impressions. Comprehensive performance is therefore important.

In order that the illuminating device of the invention might attain the above-mentioned illuminance, this may be accomplished specifically by suitably selecting the structure, number, and disposition of solid-state light-emitting devices to be integrated, according to the size of the illuminating device and the required illuminance.

[3-2] Illuminant Color

The illuminating device of the invention preferably emits synthesized light which has a white color when observed in the position apart from the light-emitting face of the light-emitting part at a distance of at least 10 cm in the direction perpendicular thereto.

In general, it is desired that illumination is as white as possible and the color rendering property thereof is as good as possible, so that the viewer can properly perceive the color of an object. For example, the color of an object cannot be properly perceived in the light of a red lamp, yellow lamp, or sodium vapor lamp. Consequently, the illuminant color of the illuminating device of the invention is preferably white or a pastel color which is a peripheral color for white.

This illuminant color is realized by regulating an energy ratio between the emission parts of the plurality of kinds of solid-state light-emitting devices described above. For example, when the energy proportion of solid-state light-emitting devices for a low correlated color temperature of about 2,000K is regulated so as to be high, a reddish illuminant color is obtained.

The position where it is observed that the color of synthesized light from the illuminating device of the invention is white is located apart from the light-emitting face of the light-emitting part in the direction perpendicular thereto at a distance of preferably at least 10 cm or more, more preferably at least 5 cm or more. In case where the position where whiteness is observed is too close, there is a possibility that color separation might occur on illuminated surfaces. When the illuminant color separates within the surface irradiated with the white, there is a possibility that the color of the object cannot be properly perceived.

[3-3] Color Temperature

The color temperature of synthesized light according to this embodiment can also be set at will according to applications thereof, etc. However, the color temperature thereof is generally 2,000K or higher, preferably 2,100K or higher, more preferably 2,200K or higher, and is generally 12,000K or lower, preferably 10,000K or lower, more preferably 9,000K or lower. Light having a color temperature within that range is generally used frequently because cold colors and warm colors are satisfactorily perceived therein. In case where the color temperature thereof is outside the range, it is difficult to use the light source according to this embodiment in illuminating devices for ordinary applications. Incidentally, the color temperature of synthesized light can be measured with, for example, a color/luminance meter, radiance meter, or the like.

[3-4] Emission Efficiency

In the illuminating device of the invention, the emission efficiency of synthesized light is generally 30 lm/W or higher, preferably 40 lm/W or higher, more preferably 50 lm/W or higher. In case where the emission efficiency thereof is too low, there is a possibility that use thereof might result in too high an energy cost, and the properties required of illuminating devices having a high energy efficiency are not satisfied. In case where the emission efficiency thereof is too low, there is a possibility that integration of the solid-state light-emitting devices might result in element breakage due to heat generation. Incidentally, the emission efficiency of solid-state light-emitting devices can be determined, for example, by dividing the luminous flux of synthesized light measured with an integrating sphere by electric power supplied.

Meanwhile, a solid-state light-emitting device comprising a solid-state light-emitting element and a phosphor has a tendency that emission efficiency increases as the color temperature of emitted light increases. This tendency varies depending on the wavelengths of excitation light emitted from the solid-state light-emitting element. A solid-state light-emitting device comprising a solid-state light-emitting element emitting excitation light which is in the near-ultraviolet region and has an emission peak wavelength in the range of 350 nm or more and 430 nm or less and a phosphor excited by the excitation light shows a smaller change in emission efficiency with changing color temperature than a solid-state light-emitting device comprising a solid-state light-emitting element emitting excitation light in the blue region being a longer wavelength region and a phosphor excited by the excitation light. Namely, solid-state light-emitting devices comprising a solid-state light-emitting element emitting excitation light belonging to the near-ultraviolet region have an advantage that the solid-state light-emitting devices which, when operated under the same operating conditions, emit light having different color temperatures have a reduced difference in luminance thereamong. As a result, the solid-state light-emitting devices eliminate the necessity of luminance balance regulation for each color temperature or facilitate the regulation. Furthermore, in the case where an energy ratio between plurality of kinds of solid-state light-emitting devices emitting light having different color temperatures is to be controlled with a controller, this control can be easily performed so that the change in energy ratio is inhibited from changing the luminance of the synthesized light.

It is therefore preferred to use solid-state light-emitting devices comprising a solid-state light-emitting element which emits light belonging to the ultraviolet region. As a result, plurality of kinds of such solid-state light-emitting devices differing in color temperature can be inhibited from being uneven in luminance.

[3-5] Color Rendering Index Ra

The illuminating device of the invention has a color rendering index Ra of 80 or higher, preferably 85 or higher, especially preferably 90 or higher. The illuminating device has exceedingly high color rendering properties.

Incidentally, the color rendering index Ra is calculated according to JIS Z 8726.

[3-6] Spectral Feature of Synthesized Light

The spectrum of synthesized light according to this embodiment usually is a combination of the spectra of primary light. It is preferred that the spectrum of the synthesized light should be continuous visible light, because an illuminating device showing satisfactory color rendering properties is obtained therewith. It is also preferred that the spectrum thereof should be as close to Planck radiation as possible.

Incidentally, the spectrum of synthesized light can be determined with a spectrophotometer.

<Second Embodiment>

Figure 14A:
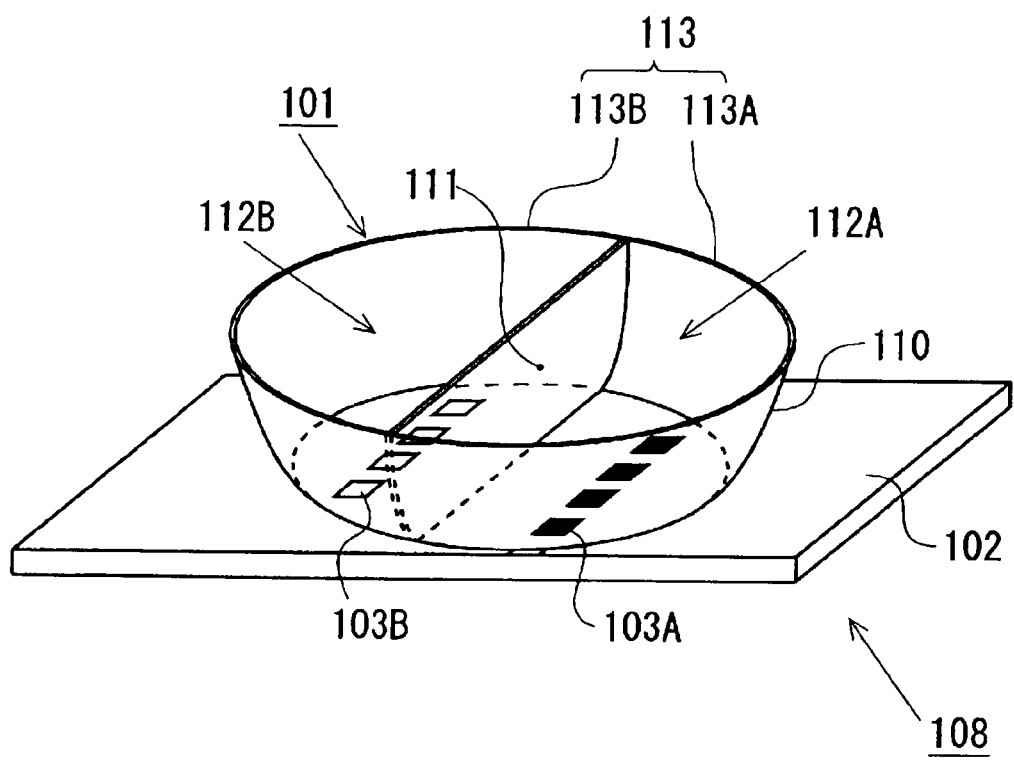
FIG. 14A is a slant view of a rough configuration of a first semiconductor light-emitting device according to an Example of the invention.
Figure 14B:
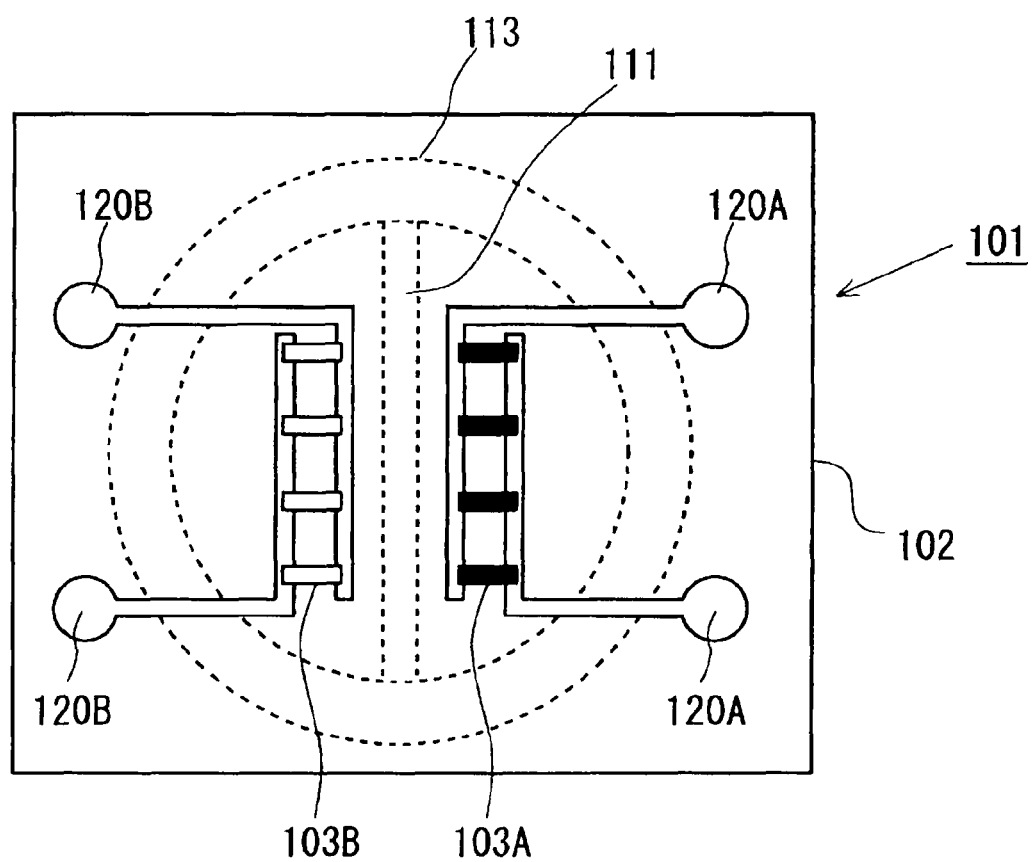
FIG. 14B is a view illustrating a configuration of wiring for supplying electric power to the semiconductor light-emitting elements within the package shown in FIG. 14A.
Figure 15:
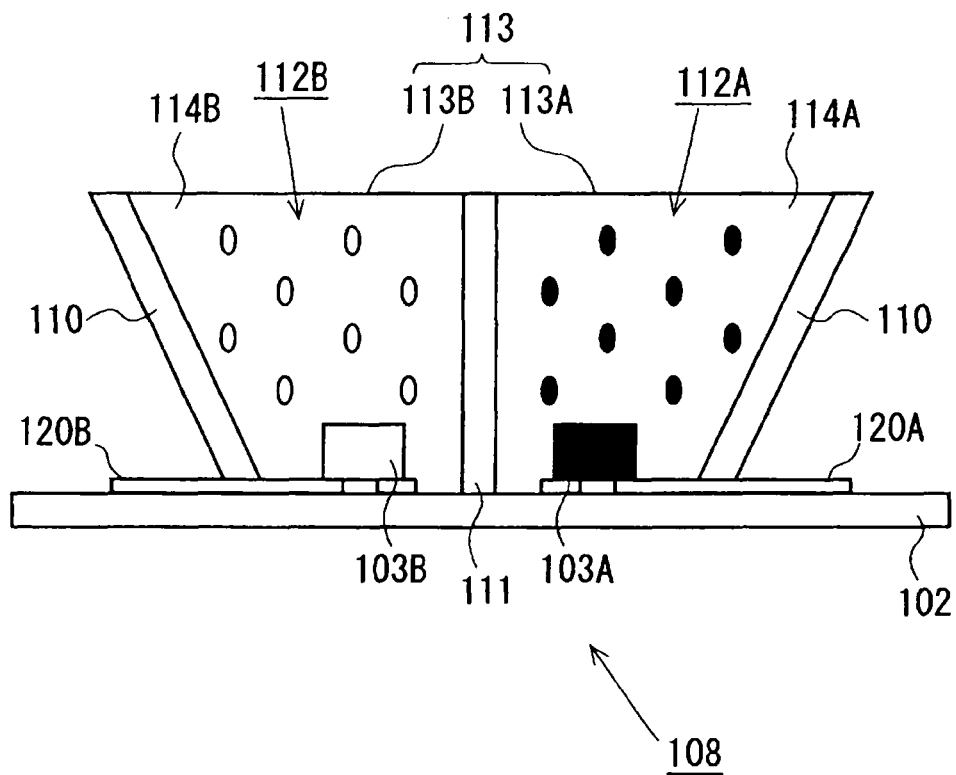
FIG. 15 is a sectional view of the semiconductor light-emitting device shown in FIG. 14A and FIG. 14B.

FIG. 14A is a slant view of a rough configuration of a package 101 included in a semiconductor light-emitting device 108 (hereinafter referred to simply as "light-emitting device") according to the invention, and FIG. 14B is a view illustrating a configuration of wiring 120A and 120B for supplying electric power to semiconductor light-emitting elements 103A and 103B arranged in the package 101. FIG. 15 is a sectional view showing the light-emitting device 108 of FIG. 14A which has been cut along a plane comprising the wiring 120A and 120B. As shown in FIG. 14A, the light-emitting device 108 comprises the package 101, and the package 101 comprises a reflector 110 which has been arranged on a substrate 102 and has an annular truncated-cone shape. This reflector 110 not only has the function of leading a part of outputted light from each divided region 112, which will be described later, in the emission direction for the light-emitting device 108, but also functions as a main body of the package 101. The top side of the truncated-cone shape of the reflector 110 is the emission direction for light from the light-emitting device 108 and constitutes an opening 113. On the other hand, the substrate 102 has been arranged on the bottom side of the truncated-cone shape of the reflector 110, and the wiring for supplying electric power to each semiconductor light-emitting element has been laid or otherwise arranged on the bottom side (the wiring is not shown in FIG. 14A), as will be described later in detail.

A partition 111 which divides the space inside the annular reflector 110 equally into two regions as shown in FIG. 14A, FIG. 14B, and FIG. 15 has been arranged perpendicularly to the substrate 102. This partition 111 demarcates two divided regions 112A and 112B within the reflector 110 so that the opening of the divided region 112A occupies the right-hand half of the opening 113 of the reflector 110 and the opening of the divided region 112B occupies the left-hand half of the opening 113 of the reflector 110, as shown in FIG. 14A and FIG. 15. In this application, the opening of the divided region 112A is referred to as divided opening 113A, and the opening of the divided region 112B is referred to as divided opening 113B. Namely, the opening 113 has been divided into the divided openings 113A and 113B by the partition 111.

The divided region 112A and 112B are respectively provided with four near-ultraviolet semiconductor light-emitting elements 103A and four near-ultraviolet semiconductor light-emitting elements 103B (emission peak wavelength belonging to the range of 350 nm or more and 430 nm or less), which each is a semiconductor light-emitting element and outputs near-ultraviolet light. These near-ultraviolet semiconductor light-emitting elements 103A and 103B (these near-ultraviolet semiconductor light-emitting elements are referred to as near-ultraviolet semiconductor light-emitting elements 103 when inclusively cited) are respectively connected to paired wiring lines 120A and 120B (sometimes inclusively referred to as wiring 120) and supplied with electric power to thereby emit light. With respect to the connection of the near-ultraviolet semiconductor light-emitting element 103 to the wiring 120 in each divided region, four near-ultraviolet semiconductor light-emitting elements 103A are mounted on the wiring 120A and four near-ultraviolet semiconductor light-emitting elements 103B are mounted on the wiring 120B, as shown in FIG. 14B. The four semiconductor light-emitting elements 103 in each divided region have been parallel-connected to the corresponding wiring in the forward direction.

Figure 16:
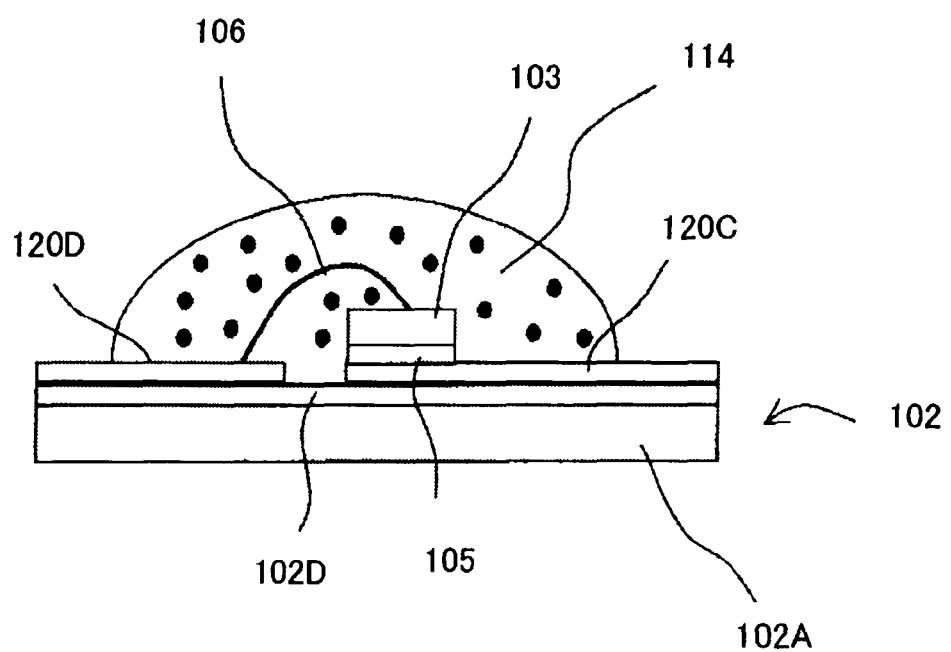
FIG. 16 is a view illustrating a connection relationship between the semiconductor light-emitting elements and the substrate in the semiconductor light-emitting device shown in FIG. 14A and FIG. 14B.

Mounting of a near-ultraviolet semiconductor light-emitting element 103 on a substrate 102 is explained here on the basis of FIG. 16. The mounted state of the near-ultraviolet semiconductor light-emitting element 103 shown in FIG. 16 is substantially the same as the state shown in FIG. 1 with regard to the first embodiment. However, the mounted state is explained again because the state is important for an explanation of the second embodiment. The substrate 102 is a base for holding thereon a light-emitting device 108 comprising the near-ultraviolet semiconductor light-emitting elements 103, and comprises a metallic base member 102A, an insulating layer 102D formed on the metallic base member 102A, and paired wiring lines 120C and 120D formed on the insulating layer 102D. The near-ultraviolet semiconductor light-emitting element 103 has a pair of electrodes, i.e., a p-electrode and an n-electrode, on the opposed bottom face and top face thereof, and the bottom-face-side electrode of the near-ultraviolet semiconductor light-emitting element 103 has been bonded to the top face of one paired wiring line 120C through an AuSn eutectic solder 105. The top-face-side electrode of the near-ultraviolet semiconductor light-emitting element 103 has been connected to the other paired wiring line 120D with a metallic wire 106. These paired wiring lines 120C and 120D as a pair constitute the pair of wiring lines 120A or 120B shown in FIG. 14B, and the four near-ultraviolet semiconductor light-emitting elements 103 in each divided region are supplied with electric power therethrough.

The electrical connection between near-ultraviolet semiconductor light-emitting elements 103 and the pair of paired wiring lines 120C and 120D arranged on the substrate 102 is not limited to the embodiment shown in FIG. 16, and can be established by a suitable method according to the arrangement of electrode groups on the near-ultraviolet semiconductor light-emitting elements 103. For example, in the case where electrode groups have been arranged on one side only of the near-ultraviolet semiconductor light-emitting element 103, the near-ultraviolet semiconductor light-emitting element 103 is arranged so that the side having the electrodes faces upward, and the electrodes in each group are connected respectively to the paired wiring lines 120C and 120D, for example, with gold wires 106. Thus, the paired wiring lines 120C and 120D can be electrically connected to the near-ultraviolet semiconductor light-emitting element 103. In the case where the near-ultraviolet semiconductor light-emitting element 103 is a flip chip (face down), the electrodes of the near-ultraviolet semiconductor light-emitting element 103 are bonded to the paired wiring lines 120C and 120D with gold bumps or a solder and can be thereby electrically connected thereto.

The near-ultraviolet semiconductor light-emitting element 103, upon electric-power supply thereto, emits light belonging to the near-ultraviolet region (the emission peak wavelength is in the region from 350 nm to 430 nm) and excite the fluorescent parts 114A and 114B (sometimes inclusively referred to as fluorescent part 114). Preferred of such light-emitting element is a GaN-based semiconductor light-emitting element employing a GaN-based compound semiconductor. This is because GaN-based semiconductor light-emitting elements are exceedingly high in emission power and external quantum efficiency in emitting light belonging to this region, and because when GaN-based semiconductor light-emitting elements are used in combination with the phosphor which will be described later, exceedingly bright emission is obtained with exceedingly low electric power. Preferred GaN-based semiconductor light-emitting elements are ones having an $Al_xGa_yN$ light-emitting layer, GaN light-emitting layer, or $In_xGa_yN$ light-emitting layer. With respect to GaN-based semiconductor light-emitting elements, ones having an $In_xGa_yN$ light-emitting layer, among those layers, are especially preferred because such elements have an exceedingly high emission intensity, and ones having a multiple quantum well structure comprising an $In_xGa_yN$ layer and a GaN layer are especially preferred because such elements have an exceedingly high emission intensity.

In the empirical formulae given above, the value of x+y is generally in the range of 0.8-1.2. GaN-based semiconductor light-emitting elements in which those light-emitting layers have been doped with zinc or silicon or contain no dopant are preferred from the standpoint of regulating luminescence characteristics.

A GaN-based semiconductor light-emitting element comprises any of those light-emitting layers, a p-layer, an n-layer, electrodes, and a substrate as basic constituent elements. GaN-based semiconductor light-emitting elements having a heterojunction structure in which the light-emitting layer has been sandwiched between n-type and p-type $Al_xGa_yN$ layers, GaN layers, $In_xGa_yN$ layers, or the like are preferred because these light-emitting elements have a high emission efficiency. More preferred are ones in which the heterojunction structure is a quantum well structure because such light-emitting elements have an even higher emission efficiency.

Examples of methods for growing a GaN-based crystal layer for forming a GaN-based semiconductor light-emitting element include the HVPE method, MOVPE method, and MBE method. The HVPE method is preferred in the case of forming a thick film, while the MOVPE method and the MBE method are preferred in the case of forming a thin film.

As shown in FIG. 16, a fluorescent part 114 comprising a plurality of or single phosphor which absorbs a part of light emitted from the near-ultraviolet semiconductor light-emitting element 103 and emits light having different wavelengths and a light-transmitting material in which the phosphor is encapsulated has been arranged on the substrate 102 so that the near-ultraviolet semiconductor light-emitting element 103 is covered with the fluorescent part 114. Although the reflector 110 has been omitted in FIG. 16, such embodiment can be an embodiment of the semiconductor light-emitting device comprising a package. A part of light emitted from the near-ultraviolet semiconductor light-emitting element 103 is partly or wholly absorbed as excitation light by the light-emitting substance (phosphor) present in the fluorescent part 114. The fluorescent part in a light-emitting device 108 is more specifically explained on the basis of FIG. 15. In the divided region 112A, the near-ultraviolet semiconductor light-emitting elements 103A are covered with the fluorescent part 114A and this fluorescent part 114A is exposed at the divided opening 113A. In the divided region 112B, the near-ultraviolet semiconductor light-emitting elements 103 are covered with the fluorescent part 114B and this fluorescent part 114B is exposed at the divided opening 113B. Consequently, outputted light from each fluorescent part is emitted outward through the divided opening.

The fluorescent part 114 is explained next. The light-emitting device 108 according to this embodiment is intended to output white light. In particular, three kinds of phosphors including a red phosphor, a green phosphor, and a blue phosphor are employed so that the emission color of light from the light-emitting device 108 has a deviation duv from a blackbody radiation locus in a uv chromaticity diagram according to the UCS (u,v) color system (CIE 1960), the deviation duv satisfying $-0.02 \leq duv \leq 0.02$.

The fluorescence emitted by a red phosphor suitable for the invention, for example, has the following wavelength range. The main emission peak wavelength is generally 570 nm or more, preferably 580 nm or more, especially preferably 610 nm or more, and is generally 700 nm or less, preferably 680 nm or less, especially preferably 660 nm or less. The half-width of the main emission peak is generally 1 nm or more, preferably 10 nm or more, especially preferably 30 nm or more, and is generally 120 nm or less, preferably 110 nm or less, especially preferably 100 nm or less. Usable red phosphors are as shown above with regard to the first embodiment. It should, however, be noted that those red phosphors are mere examples, and other red phosphors can be employed so long as preferred properties are obtained therewith.

The fluorescence emitted by a green phosphor suitable for the invention, for example, has the following wavelength range. The main emission peak wavelength is generally 500 nm or more, preferably 510 nm or more, especially preferably 520 nm or more, and is generally 580 nm or less, preferably 570 nm or less, especially preferably 560 nm or less. The half-width of the main emission peak is generally 1 nm or more, preferably 10 nm or more, especially preferably 30 nm or more, and is generally 120 nm or less, preferably 90 nm or less, especially preferably 60 nm or less. Usable green phosphors are as shown above with regard to the first embodiment. It should, however, be noted that those green phosphors are mere examples, and other green phosphors can be employed so long as preferred properties are obtained therewith.

The fluorescence emitted by a blue phosphor suitable for the invention, for example, has the following wavelength range. The main emission peak wavelength is generally 430 nm or more, preferably 440 nm or more, and is generally 500 nm or less, preferably 480 nm or less, especially preferably 460 nm or less. The half-width of the main emission peak is generally 1 nm or more, preferably 10 nm or more, especially preferably 30 nm or more, and is generally 100 nm or less, preferably 80 nm or less, especially preferably 70 nm or less. Usable blue phosphors are as shown above with regard to the first embodiment. It should, however, be noted that those blue phosphors are mere examples, and other blue phosphors can be employed so long as preferred properties are obtained therewith.

The red, green, and blue phosphors described above may be used in a suitable combination according to a desired emission spectrum, color temperature, chromaticity coordinates, color rendering properties, emission efficiency, etc.

So long as the light-emitting device 108 of the invention comprises the near-ultraviolet semiconductor light-emitting elements 103 and the fluorescent part 114 comprising phosphors described above, other configuration thereof is not particularly limited. Usually, the near-ultraviolet semiconductor light-emitting elements 103 and the fluorescent part 114 are arranged so that the phosphors are excited by an emission from the near-ultraviolet semiconductor light-emitting elements 103 and thereby emit light and this light is extracted outward. In the case where the light-emitting device 108 has such structure, the near-ultraviolet semiconductor light-emitting elements 103 and phosphors described above are usually encapsulated and protected with a light-transmitting material (encapsulating material). Specifically, this encapsulating material is employed for the purposes of dispersing the phosphors therein to constitute a light-emitting part after incorporated into the fluorescent part 114 and of bonding the near-ultraviolet semiconductor light-emitting elements 103, phosphors, and substrate 102 together.

Examples of the light-transmitting material to be used usually include thermoplastic resins, thermocurable resins, and photocurable resins. However, since the near-ultraviolet semiconductor light-emitting elements 103 output light having a peak wavelength in the near-ultraviolet region from 350 nm to 430 nm, resins which are sufficiently transparent and resistant to the outputted light are preferred as the encapsulating material. Specific examples of the encapsulating material are as shown above with regard to the first embodiment described above.

<Production Processes>

Processes for producing the light-emitting device 108 described above are explained below as a third example of the invention on the basis of FIG. 17 and FIG. 18. First, a reflector 110 is arranged on a substrate 102 as shown in FIG. 17 (*a*). The position in which the reflector 110 is to be attached has been determined so that near-ultraviolet semiconductor light-emitting elements 103 to be arranged later will have a proper positional relationship with the reflector 110, that is, an emission from the near-ultraviolet semiconductor light-emitting elements 103 excites the fluorescent part 14 and the resultant outputted light is properly emitted outward. Subsequently, a partition 111 is arranged in the reflector 110 attached to the substrate 102. This partition 111 is arranged in such a position that the reflector 110 is equally divided. The disposition demarcates two divided regions 112A and 112B.

A reflector 110 which has been provided with a partition 111 beforehand may be attached to the substrate 102. The reflector 110 may be made of a metal or of a molded resin or ceramic having a metallized surface. The attachment of the reflector 110 to the substrate 102 may be accomplished by silver brazing in the case of a metal, or accomplished by bonding with an adhesive in the case of a resin, etc. Especially in the case of a metal, care should be taken not to short-circuit the paired wiring 120. In this case, it is preferred to form an insulating resist on the wiring 120. Parts for the silver brazing are formed by disposing beforehand metallic parts on the substrate 102 separately from the wiring 120.

Subsequently, near-ultraviolet semiconductor light-emitting elements 103A and near-ultraviolet semiconductor light-emitting elements 103B are mounted respectively in the divided regions 112A and 112B, which have been formed by dividing by the partition 111, so that the light-emitting elements come to have the above-described connection relationship with the wiring 120 arranged on the substrate 102. Thereafter, pasty materials for light-emitting-part formation are poured respectively into the divided regions with a dispenser 140, the pasty materials each being constituted of a corresponding mixture of light-emitting substances and an encapsulating material. The pasty materials are then hardened. Through this step, a light-emitting device 108 is produced.

FIG. 18 diagrammatically illustrates a process for producing a light-emitting device 108 different from that shown in FIG. 17. First, an annular sidewall 200 which corresponds to a reflector is drawn on a substrate with a dispenser 140 as shown in FIG. 18 (*a*). The material discharged from the dispenser 140 in this step is a pasty resinous material which is thermocurable or UV-curable. Suitable is a silicone resin containing an inorganic filler. This pasty resinous material has relatively high viscosity and, hence, the sidewall 200 has a height of about 0.5-1 mm immediately after discharge from the dispenser 140. Incidentally, the position of the annular sidewall 200 on the substrate is as stated above.

Subsequently, as shown in FIG. 18 (*b*), a partitioning part 210 which corresponds to a partition is drawn with the dispenser 140 in such a position that the annular sidewall 200 is equally divided into two parts therewith. The material to be used for drawing the partitioning part 210 is the same as the resinous material used for drawing the sidewall 200. After completion of the drawing of the partitioning part 210, this part 210 is heated together with the sidewall 200. The resinous material used for the sidewall 200 and partitioning part 210 is thereby cured. As a result, two of a region surrounded by the sidewall 200 and partitioning part 210, i.e., divided regions 112A and 112B, are demarcated.

Thereafter, near-ultraviolet semiconductor light-emitting elements 103A and near-ultraviolet semiconductor light-emitting elements 103B are mounted respectively in the divided regions 112A and 112B, which have been formed by dividing by the partitioning part 210, so that the light-emitting elements come to have the above-described connection relationship with the wiring arranged on the substrate. Thereafter, pasty materials for light-emitting-part formation are poured respectively into the divided regions with a dispenser 140, the pasty materials each being constituted of a corresponding mixture of light-emitting substances and an encapsulating material. The pasty materials are then hardened. Through this step, a light-emitting device 108 is produced.

<Power Supply Control 1>

The control of power supply to the near-ultraviolet semiconductor light-emitting elements 103 of a light-emitting device 108 is explained here. In the case where the configuration of wiring shown in FIG. 14B is employed in the light-emitting device 108, electric power is supplied through the wiring 120A and the wiring 120B to the semiconductor light-emitting elements 103A and the semiconductor light-emitting elements 103B arranged respectively in the two divided regions 112. The intensity of the emission color of light from each divided region is thereby regulated, and the correlated color temperature of light emitted from the light-emitting device 108 is finally controlled. Namely, the correlated color temperature of light emitted from the light-emitting device 108 can be controlled at will by regulating the proportion of the electric power being supplied through the wiring 120A to the electric power being supplied through the wiring 120B.

Figure 19:
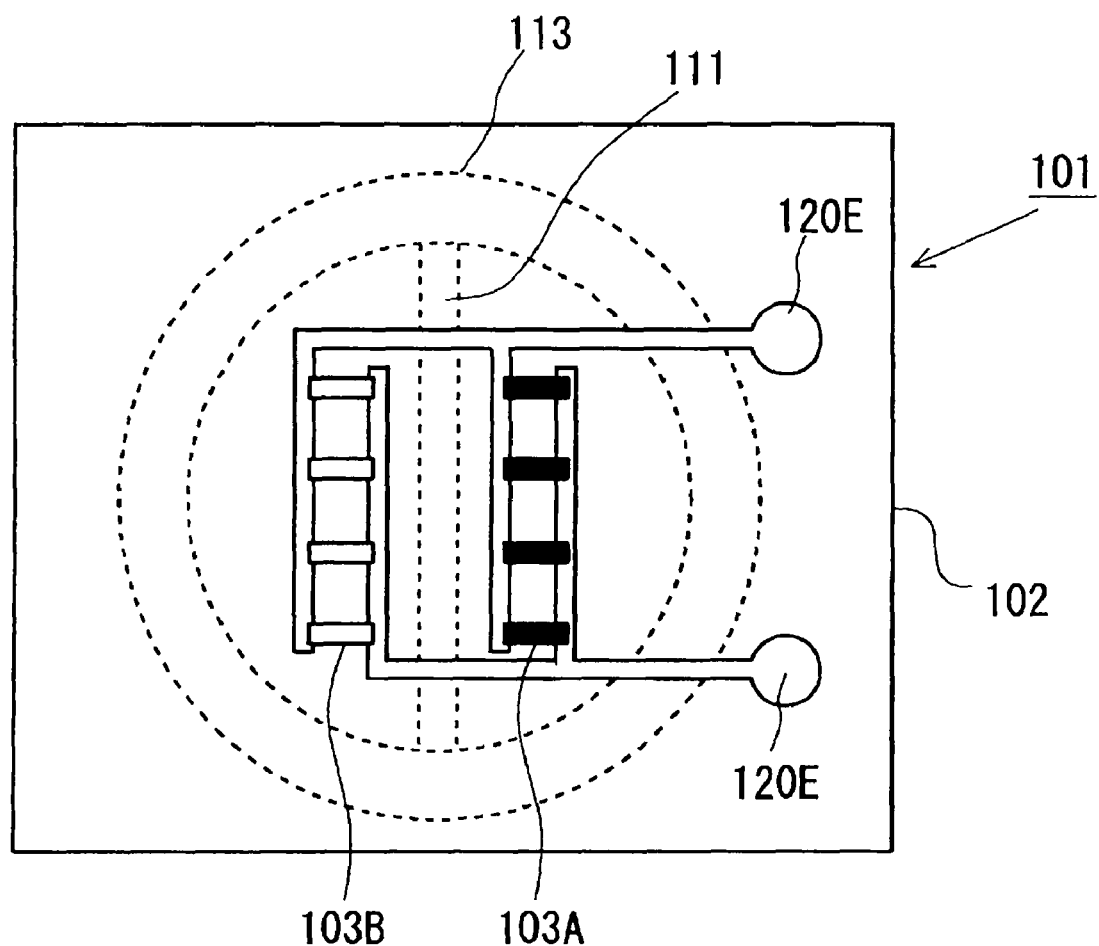
FIG. 19 is a second view illustrating a configuration of wiring for supplying electric power to the semiconductor light-emitting elements in a package.

Another embodiment of power supply to a light-emitting device 108 is explained next on the basis of FIG. 19 to FIG. 21. The package 101 to which this embodiment of power supply control is applied is a package configured as shown in FIG. 19. Like FIG. 14B, FIG. 19 is a view illustrating a configuration of wiring 120A and 120B for supplying electric power to semiconductor light-emitting elements 103A and 103B arranged in the package 101. In the package 101 shown in FIG. 19, parts or members having the same constitutions as in FIG. 14A, FIG. 14B, and FIG. 15 are indicated by like reference numerals or signs; a detailed explanation thereon is omitted. In the package 101 shown in FIG. 19, electric power is supplied to the divided regions 112A and 112B only through wiring 120E paired with each near-ultraviolet semiconductor light-emitting element 103, i.e., only through a pair of wiring lines 120E, as different from the package 101 shown in FIG. 14A and FIG. 14B.

Figure 20:
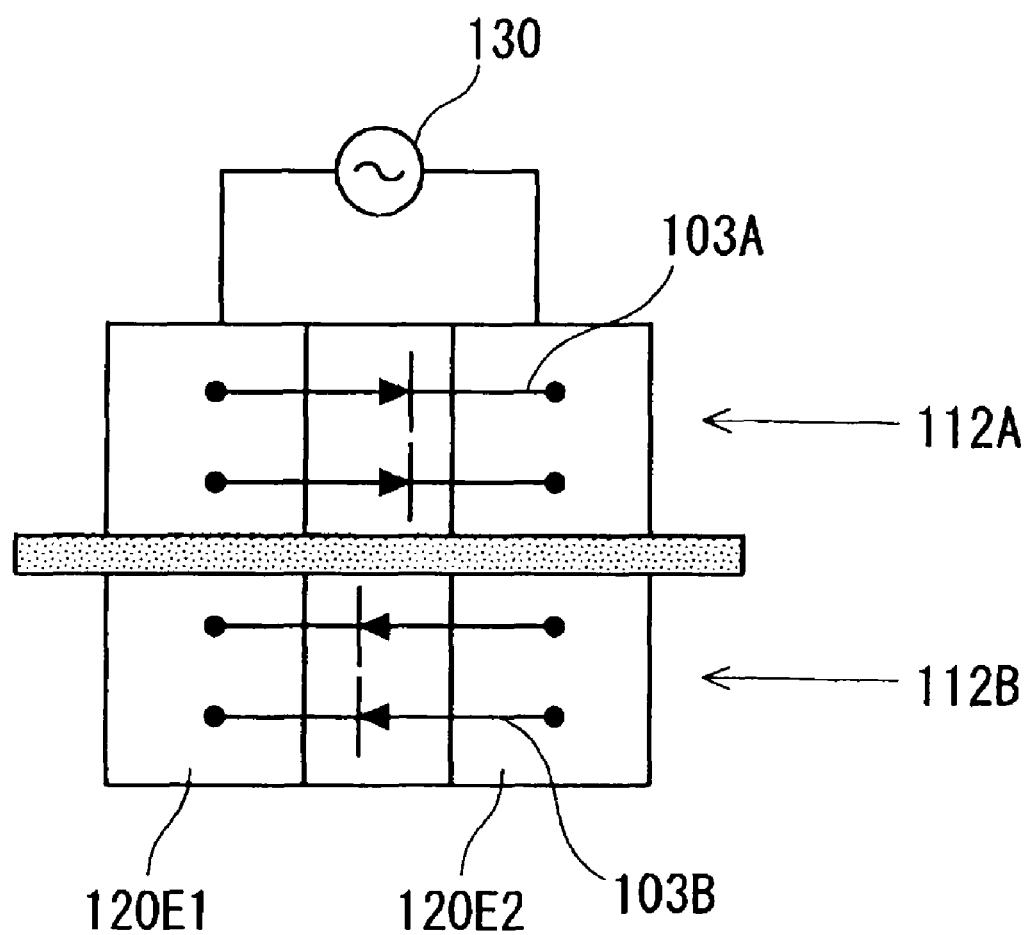
FIG. 20 is a view illustrating a connection relationship between the electrodes of each semiconductor light-emitting element and the wiring in the package shown in FIG. 19.

Connection of each near-ultraviolet semiconductor light-emitting element 103 to the wiring 120E in the package 101 shown in FIG. 19 is diagrammatically shown in FIG. 20. As described above, the wiring 120E is constituted of paired wiring lines 120E1 and 120E2, and a voltage is applied through these paired wiring lines to the p-electrode and n-electrode of each near-ultraviolet semiconductor light-emitting element 103. The p-electrodes of all near-ultraviolet semiconductor light-emitting elements 103A (in FIG. 20, two semiconductor light-emitting elements only are shown in a simplified way) arranged in the divided region 112A have been connected to the wiring 120E1, while the n-electrodes of all near-ultraviolet semiconductor light-emitting elements 103A have been connected to the wiring 120E2. Furthermore, the p-electrodes of all near-ultraviolet semiconductor light-emitting elements 103B (in FIG. 20, two semiconductor light-emitting elements only are shown in a simplified way) arranged in the divided region 112B have been connected to the wiring 120E2, while the n-electrodes of all near-ultraviolet semiconductor light-emitting elements 103B have been connected to the wiring 120E1. Namely, the state of connection of the near-ultraviolet semiconductor light-emitting elements 103 to the wiring 120E is as follows. The near-ultraviolet semiconductor light-emitting elements 103A, which belong to the divided region 112A, and the near-ultraviolet semiconductor light-emitting elements 103B, which belong to the divided region 112B, are in a polarity-inverted state regarding the polarity of the electrodes of the semiconductor light-emitting elements.

In the case where the near-ultraviolet semiconductor light-emitting elements 103A and 103B have been connected to the wiring 120E so as to result in the state described above, the near-ultraviolet semiconductor light-emitting elements 103A and the near-ultraviolet semiconductor light-emitting elements 103B emit light alternately when an alternating-current square wave voltage is applied to the wiring 120E from a power source 130. In general, when a constant current of from 10 mA to 40 mA per element flows through semiconductor light-emitting elements in the forward direction, a forward-voltage drop of about from 3 V to 4 V occurs. It is therefore preferred to apply a square wave voltage which exceeds the forward-voltage drop, as shown in FIG. 21(a). In this embodiment, a forward voltage is applied to the near-ultraviolet semiconductor light-emitting elements 103A when the applied voltage is H1, while a forward voltage is applied to the near-ultraviolet semiconductor light-emitting elements 103B when the applied voltage is L1.

When the applied voltage has the square waveform shown in FIG. 21(a), the ratio between the duration of applied-voltage H1 and the duration of applied-voltage L1 (duty ratio) is 50:50. Because of this, the near-ultraviolet semiconductor light-emitting elements 103A and the near-ultraviolet semiconductor light-emitting elements 103B have approximately the same emission time. Consequently, the divided regions 112A and 112B are substantially equal in the quantity of light outputted thereby. As a result, the light-emitting device 108 can be regulated so as to output light which has a color temperature that is intermediate between 2,600K and 9,000K shown in FIG. 8 (about 5,800K) and which has a deviation duv from a blackbody radiation locus BBL within the range shown above.

Meanwhile, when the applied voltage has the square waveform shown in FIG. 21(b), the duty ratio is 80:20. Because of this, the emission time ratio between the near-ultraviolet semiconductor light-emitting elements 103A and the near-ultraviolet semiconductor light-emitting elements 103B is 4:1. Consequently, the ratio of the intensity of light outputted per unit time period from the divided regions 112A to the intensity of light outputted per unit time period from the divided region 112B is also 4:1. As a result, the light-emitting device 108 can be regulated so as to output light which has a color temperature that is located between 2,600K and 9,000K shown in FIG. 8 and is determined from the proportion of 4:1 (about 3,900K) and which has a deviation duv from a blackbody radiation locus BBL within the range shown above.

As described above, in the light-emitting device 108 according to this embodiment, the color temperature of outputted light from the light-emitting device 108 can be regulated at will by applying a square wave voltage to the wiring 120E and controlling the duty ratio thereof. Because this outputted light is outputted by the light-emitting device 108 having the configuration shown in, e.g., FIG. 19, the outputted light from each divided region can be stably synthesized together.

<Power Supply Control 2>

Another embodiment of power supply to a light-emitting device 108 is explained next on the basis of FIG. 22. The package 101 to which this mode of power supply is applied may be a package having the configuration shown in either FIG. 14B or FIG. 19.

The correlated color temperature of the emission color of light from each divided region 112 is determined by a relationship between the semiconductor light-emitting elements 113A or 113B arranged therein and the fluorescent part 114A or 114B arranged therein. As described above, the correlated color temperature of light emitted from the light-emitting device 108 is determined by the proportion of electric power supplied to the semiconductor light-emitting elements corresponding to each divided region 112. The correlated color temperature of emitted light is generally expressed using a unit of K (Kelvin). Even when the value of this correlated color temperature varies, a stimulus is not given to human vision in proportion to the variation. Namely, when a variation in correlated color temperature of 500K has occurred, for example, from a correlated color temperature of 2,800K, as in incandescent lamp color, and from a correlated color temperature of 6,500K, as in neutral-white color, then the variations in the respective cases are not perceived by human vision to be substantially the same, i.e., to be proportional. There is a general tendency that a variation from a relatively high correlated color temperature state is perceived by human vision to be smaller than a variation from a relatively low correlated color temperature state.

Reciprocal correlated color temperature is utilized as a parameter for compensating for such a difference between a variation in correlated color temperature and a resultant variation in human visual perception, and power supply to the light-emitting device 108 is controlled using the parameter. As a result, the correlated color temperature of the emission color of light from the light-emitting device 108 can be easily controlled in accordance with human vision. The reciprocal correlated color temperature is defined as $MK^-$ (per mega-Kelvin) obtained by multiplying the reciprocal of the correlated color temperature of emission color by 1,000,000. Variations in the reciprocal correlated color temperature of emission color are roughly proportional to the resultant variations in human visual perception. For example, in order that approximately the same variation might be perceived by human vision at a correlated color temperature of 3,000K and at a correlated color temperature of 6,000K, it is necessary to change the correlated color temperature in the latter case by an amount about two times the amount in the former case.

Figure 22:
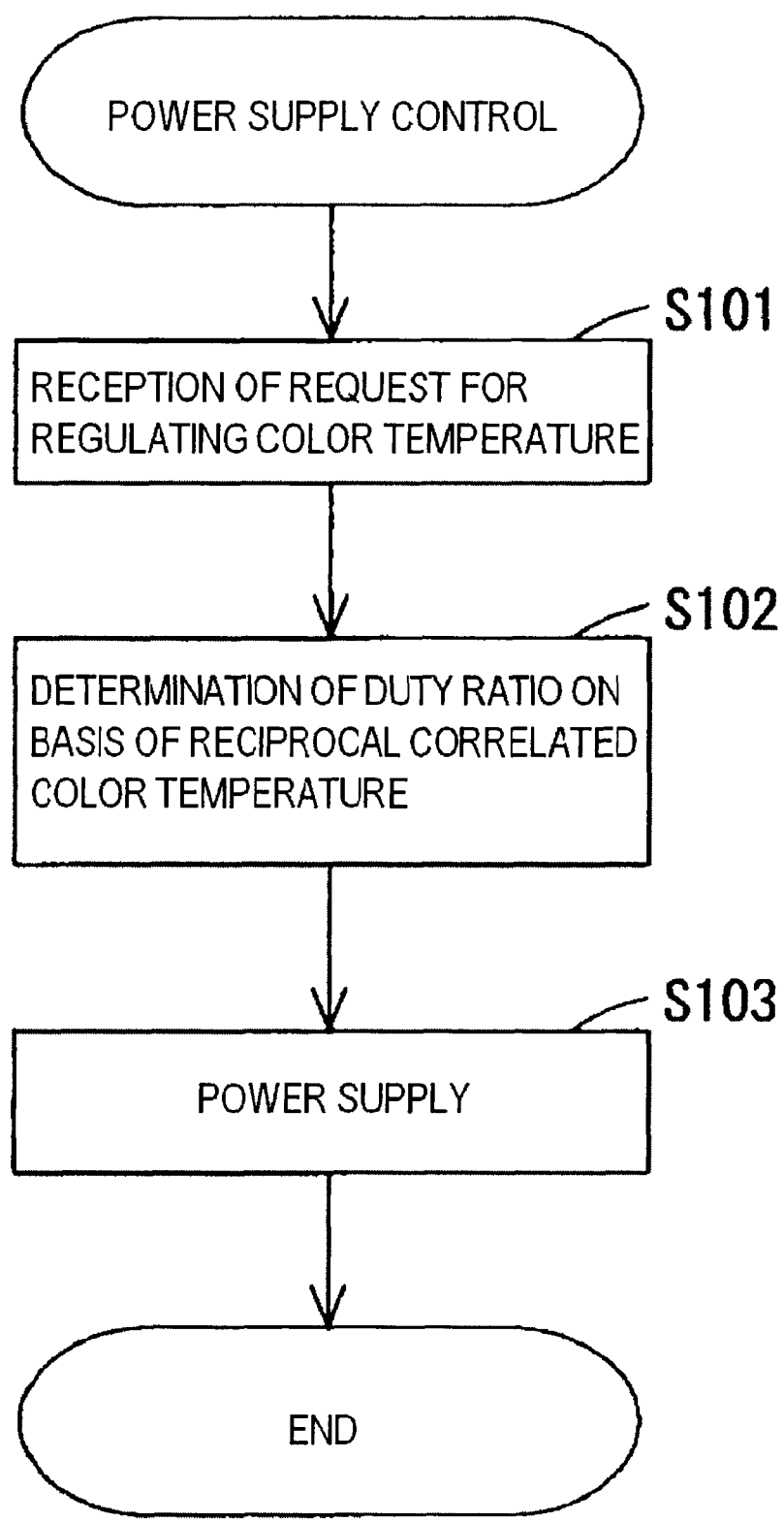
FIG. 22 is a flowchart showing control of power supply to a semiconductor light-emitting device.

The control of power supply to a light-emitting device 108 according to the reciprocal correlated color temperature is explained here based on FIG. 22. In S101, a request from a user for regulation of the correlated color temperature of an emission color is received. This request can be received in various modes. Subsequently, in S102, a duty ratio, which governs the proportions of the amounts of electric power to be supplied to the semiconductor light-emitting elements 103A and 103B, is determined on the basis of reciprocal correlated color temperature according to the request received in S101. For example, when instructions for a change in correlated color temperature are given by a user, the duty ratio is determined so that the higher the value of correlated color temperature before the change, the larger the increase in the electric power to be supplied to the semiconductor light-emitting elements in the divided region which is relatively high in correlated color temperature. The reason for this is as follows. That the value of correlated color temperature before the change is high means that the reciprocal correlated color temperature is low. Because of this, the correlated color temperature is changed by a larger amount than in the case where the value of correlated color temperature before the change is relatively low. As a result, a stimulus substantially the same as in that case where the value of correlated color temperature before the change is relatively low can be given to the vision of the user. The processing in S102 is followed by S103, in which electric power is supplied to each semiconductor light-emitting element in accordance with the duty ratio determined.

For regulating the emission color of the light-emitting device 108, use may be made of a method in which the reciprocal correlated color temperature is used as a measure and electric power is supplied to each semiconductor light-emitting element so that the value changes by a given amount. In this case, the correlated color temperature itself of the emission color of light from each divided region does not vary proportionally. However, the reciprocal correlated color temperature varies proportionally, whereby a stimulus corresponding to the same change in color temperature is given to human vision.

In the method of regulating the emission color of the light-emitting device 108 on the basis of reciprocal correlated color temperature, the reciprocal correlated color temperature may be regulated to a value within a set range so that the change in supplied electric power results in a change in correlated color temperature which is not smaller than a given amount, that is, the change in supplied electric power results in a change in color temperature which can be perceived by human vision. Since small changes in correlated color temperature do not make human vision perceive the resultant changes in color temperature, the technique is useful in which electric power is supplied on the basis of reciprocal correlated color temperature in order to make the user perceive the effect of the power supply to the light-emitting device 108.

EXAMPLE

An Example concerning the irradiation of white light by a light-emitting device 108 configured in the manner described above is explained below. The light-emitting device 108 has two divided regions 112A and 112B divided by a partition 111, and comprises a fluorescent part 114 arranged in each region 112A or 112B. Each fluorescent part 114 is excited by near-ultraviolet light emitted from four near-ultraviolet semiconductor light-emitting elements 103 as light sources. The two divided regions 112A and 112B have been integrated inside a reflector 110 so that the exits for outputted light, i.e., the divided openings 113A and 113B, have been arranged side by side. The white light as outputted light from the fluorescent parts 114A and 114B is emitted outward respectively through the divided openings 113A and 113B. Each white light emitted from the divided opening is obtained through the fluorescent part 114, which contains phosphors. Because of this, the outputted light from the near-ultraviolet semiconductor light-emitting elements 103A and 103B is sufficiently scattered and the emitted light exhibits a Lambertian-like luminous intensity distribution. As a result, the primary light from the three kinds of phosphors can be synthesized into white and, simultaneously therewith, an even white color is obtained. Consequently, the synthesized light emitted from the light-emitting device 108 is obtained as even white light and an even illuminance is obtained therewith.

Figure 23:
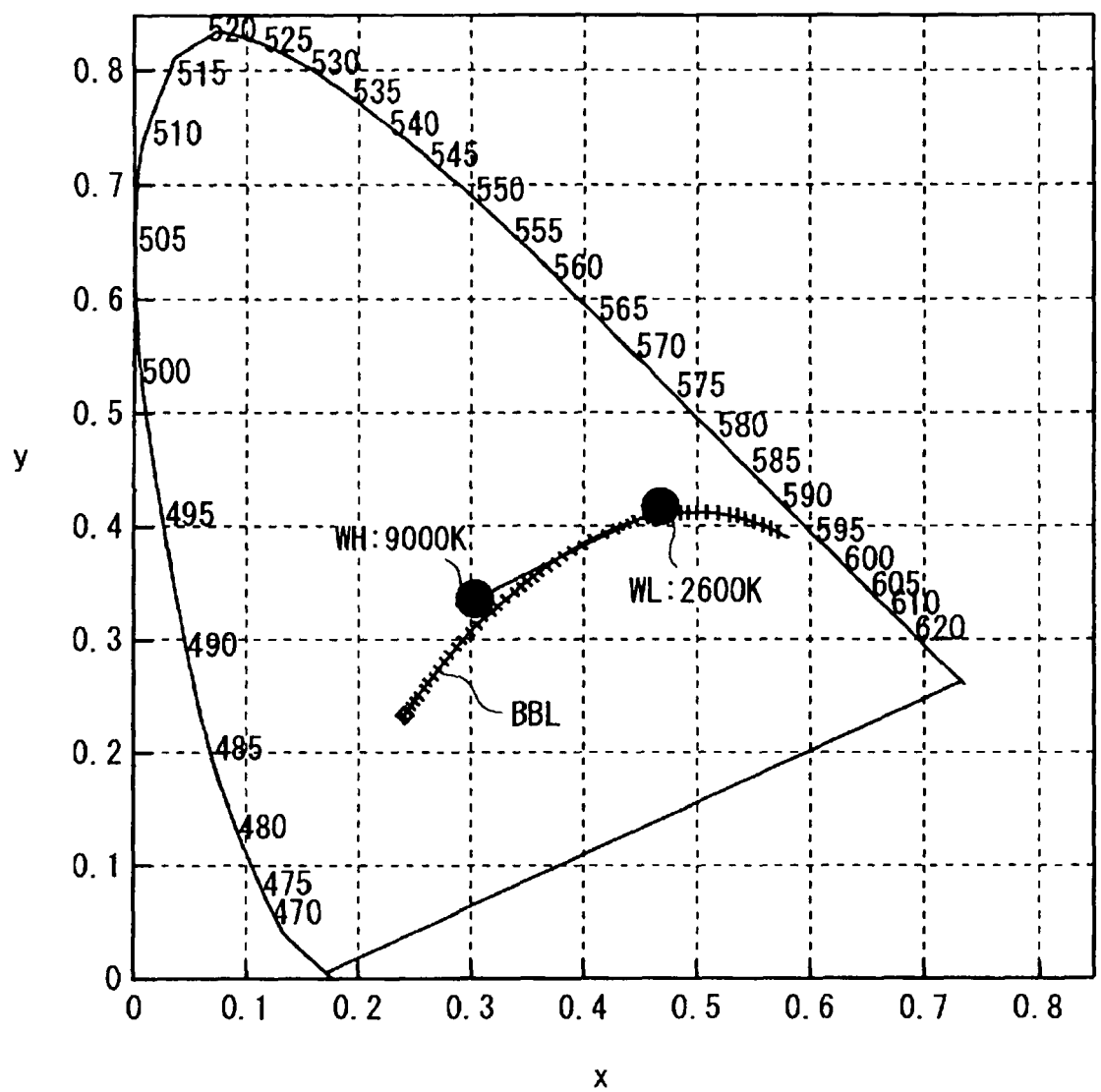
FIG. 23 is a diagram showing a relationship between blackbody radiation locus and the white light chromaticity point set for the outputted light from each of the divided regions in a semiconductor light-emitting device according to an Example of the invention.
Figure 24:
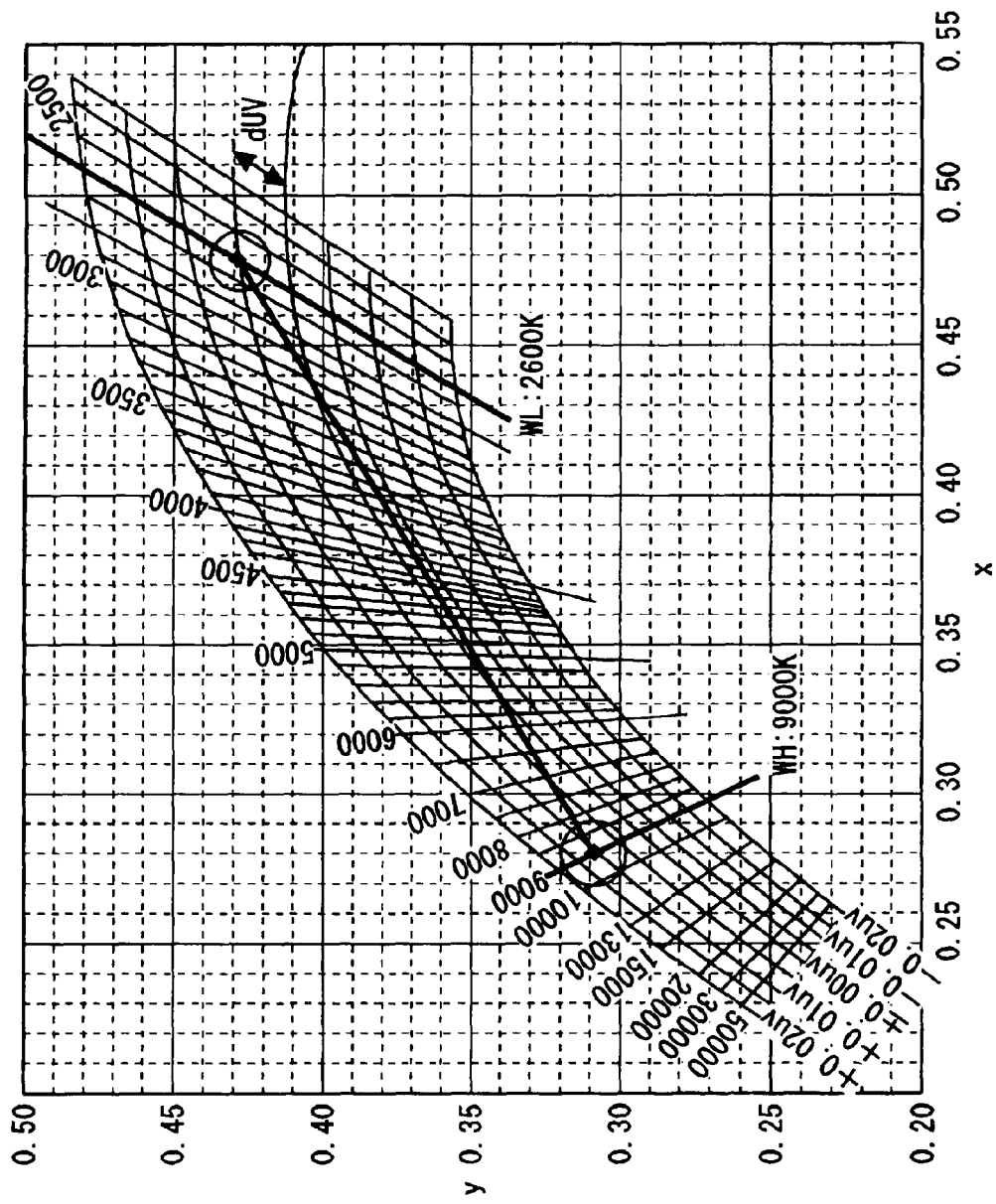
FIG. 24 is an enlarged diagram showing an important part of FIG. 23 showing the relationship between the chromaticity point of white light and blackbody radiation locus.

Phosphors to be contained in the fluorescent part 114A and phosphors to be contained in the fluorescent part 114B are suitably selected so that white light outputted from the divided region 112A (hereinafter referred to as "white light A") and white light outputted from the divided region 112B (hereinafter referred to as "white light B") differ in spectrum from each other. When the chromaticity points on an xy chromaticity diagram (CIE 1931) which correspond to white light A and B are expressed by $W_L$ and $W_H$, then the correlated color temperature of the chromaticity point $W_L$ and the correlated color temperature of the chromaticity point $W_H$ are taken as 2,600K and 9,000K, respectively, as shown in FIG. 23 and FIG. 24. It is further assumed that the chromaticity point $W_L$ has a deviation duv from the blackbody radiation locus BBL of +0.005 and the chromaticity point $W_H$ has a deviation duv from the blackbody radiation locus BBL of +0.01. Incidentally, FIG. 24 is an enlarged view of an important part of FIG. 23. The range of deviations $-0.02 \leq duv \leq 0.02$ from the blackbody radiation locus, which is shown in the figure, is one obtained by conversion from the UCS color system (CIE 1960) to an xy chromaticity diagram (CIE 1931).

In the case shown above, the light-emitting device 108 is set so that white light A from the divided region 112A and white light B from the divided region 112B differ in correlated color temperature, and the chromaticity points corresponding to white light A and B each are regulated so as to have a deviation duv from the blackbody radiation locus BBL within the range of $-0.02 \leq duv \leq 0.02$. As a result, outputted light from the light-emitting device 108 can be considered to be located substantially along the blackbody radiation locus BBL. In addition, by controlling operating conditions, such as emission time, operating current, or electric power amount, for the near-ultraviolet semiconductor light-emitting elements 103A or 103B arranged in each divided region, an energy ratio between the white light A and the white light B can be freely changed and the chromaticity point of the synthesized light as final outputted light from the light-emitting device 108 can be regulated so as to have the correlated color temperature corresponding to any desired chromaticity point located on the straight line connecting between the chromaticity point $W_L$ and the chromaticity point $W_H$. Namely, in the light-emitting device 108, electric power to be supplied to the near-ultraviolet semiconductor light-emitting elements 103 arranged in the divided regions 112A and 112B is regulated through the corresponding wiring lines 120A and 120B. As a result, the correlated color temperature of the synthesized light as outputted light from the light-emitting device 108 can be regulated to any desired value from 2,600K to 9,000K, and this synthesized light has a chromaticity point which is located substantially along the blackbody radiation locus BBL. Because of these, white light which is exceedingly natural for human vision can be provided and color temperature can be freely changed over the range from 2,600K to 9,000K.

One example of the operation control of near-ultraviolet semiconductor light-emitting elements 103A and 103B employs two lines of a variable-current constant-current power source. In this example, electric power is supplied independently to the near-ultraviolet semiconductor light-emitting elements 103A and the near-ultraviolet semiconductor light-emitting elements 103B, and the electric current to be inputted to each group of semiconductor light-emitting elements is thereby controlled. Color temperature is thus rendered variable. Specifically, when electric power is supplied to the 2,600K side only and the 9,000K side is turned off, then light of 2,600K only is emitted from the light-emitting device 108. Conversely, when the 9,000K side is turned on and the 2,600K side is turned off, then light of 9,000K is emitted from the light-emitting device 108. When light having a correlated color temperature between 9,000K and 2,600K is to be emitted from the light-emitting device 108, this can be attained by suitably regulating the current to be supplied to each side.

In the Example described above, near-ultraviolet semiconductor light-emitting elements 103 were used in combination with red, green, and blue phosphors and they were arranged in the divided regions 112 as shown in, e.g., FIG. 14A in order to make the light-emitting device 108 output white light as synthesized light. It is a matter of course that other combinations of semiconductor light-emitting elements and a phosphor may be employed and arranged in the divided regions 112 in order to output white light. The combinations of near-ultraviolet semiconductor light-emitting elements 103 and red, green, and blue phosphors as described above are referred to as combination A. Other combinations capable of giving white light include a combination of blue semiconductor light-emitting elements and red and green phosphors (combination B) and a combination of blue semiconductor light-emitting elements and a yellow phosphor (combination C), and these combinations also can be arranged in the divided regions 112 shown in, e.g., FIG. 14A. The techniques themselves for outputting white light with the combinations B and C are known, and detailed explanations thereon are hence omitted.

Figure 25:
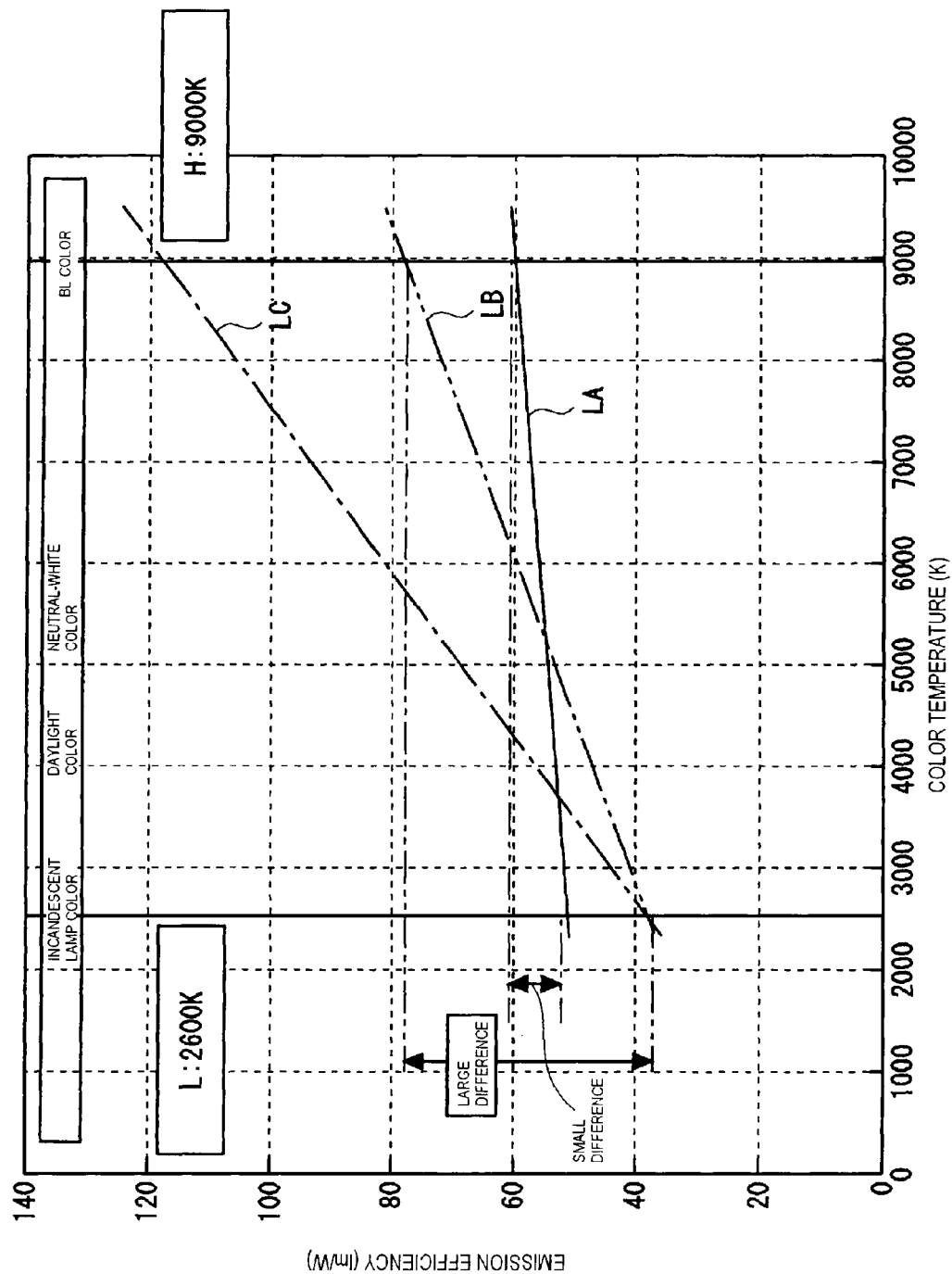
FIG. 25 is a diagram showing relationships between the color temperature of outputted light and emission efficiency with respect to various semiconductor light-emitting element/phosphor combinations which can be employed in a semiconductor light-emitting device according to an Example of the invention.

Relationships between the color temperature of white light obtained by regulating phosphor concentration and the emission efficiency thereof in the combinations of A, B, and C are shown in FIG. 25. In FIG. 25, the abscissa indicates color temperature (K) and the ordinate indicates emission efficiency (lm/W). In the figure, line LA corresponds to the combination A, line LB corresponds to the combination B, and line LC corresponds to the combination C. As can be seen from FIG. 25, line LA, which corresponds to the combination A among the three combinations, is inclined most slightly and is an approximately horizontal straight line, whereas line LC, which corresponds to the combination C, is inclined most steeply. The larger the inclination of each straight line is, the larger the change in emission efficiency of the light-emitting device is when the color temperature is changed.

Consequently, an increase in the inclination of the straight line means that a change in color temperature results in a large change in the luminance of the semiconductor light-emitting elements when the electric power being supplied to the semiconductor light-emitting elements is kept constant. In other words, when the straight line has a relatively large inclination, it is highly necessary to control, without fail, power supply to the semiconductor light-emitting elements in order to stabilize luminance and, as a result, there is a high possibility that the operation control of the light-emitting device 108 might become complicated as a whole. Consequently, from the standpoint of configuring a light-emitting device 108 having stable luminance, it is preferred to employ a combination which is as small as possible in the inclination of the straight line shown in FIG. 25, i.e., to employ the combination A comprising near-ultraviolet semiconductor light-emitting elements 103 and corresponding phosphors of the three colors. This, however, does not exclude application of the combination B or C or another combination of semiconductor light-emitting elements and phosphors to a light-emitting device 108 according to the invention.

In the combinations B and C, light from the blue semiconductor light-emitting elements, which are a phosphor excitation source, is in itself utilized as blue light for color mixing for outputting white light. Because of this, for outputting light belonging to a low-color-temperature region, it is necessary to increase the amount of the red, green, or yellow phosphor to reduce the proportion of blue light. Furthermore, the blue light has a higher efficiency than light obtained through phosphor conversion. Consequently, the lower the proportion of blue light, the lower the efficiency. On the other hand, in the case where near-ultraviolet semiconductor light-emitting elements are used as in the combination A, the near-ultraviolet light makes substantially no contribution to white output and is mostly used for excitation of the phosphors. In this case, white light is obtained exclusively from the light generated through conversion by the blue, green, and red phosphors. Consequently, even when the proportions of the phosphors are changed in order to change color temperature, this does not considerably affect emission efficiency.

As described above, the light-emitting device 108 according to this Example can readily output white light having a color temperature between 2,600K and 9,000K. Furthermore, by employing the structure shown in, e.g., FIG. 15, synthesized light composed of outputted light from the divided regions 112 can be sufficiently inhibited from separating on illuminated surfaces.

In the Example described above, an annular reflector 110 was divided into two divided regions. However, the reflector may be divided into three or more parts. In this case, it is necessary that the divided opening of each divided region should be open in any position within the opening of the reflector 110. It is not always necessary to make the divided regions have the same size, and the size of each divided region may be suitably regulated according to the specifications required of outputted light from the light-emitting device. When outputted light from each divided region is regulated so as to be white light, it is preferred that the deviation duv of the chromaticity point of the outputted light from each divided region from a blackbody radiation locus BBL should be within the range of $-0.02 \leq duv \leq 0.02$, as in the Example given above. This renders color-temperature control possible along the blackbody radiation locus BBL.

When the number of divided regions is 3 or more, the electric power to be supplied to each divided region is controlled. As a result, the light-emitting device 108 can output light having a correlated color temperature corresponding to any desired chromaticity point which, on the xy chromaticity diagram shown in FIG. 24, is located within the triangular region surrounded by a plurality of straight lines connecting the chromaticity points corresponding to outputted lights from the respective divided regions.

In the Example described above, the light-emitting device 108 was intended to output white light. However, the outputted light is not limited to white light, and the semiconductor light-emitting elements and phosphors to be arranged in the divided regions can be suitably selected in order to configure the light-emitting device 108 so as to output light of various colors, e.g., red, blue, etc., according to purposes.

<Illuminating Device>

Figure 26:
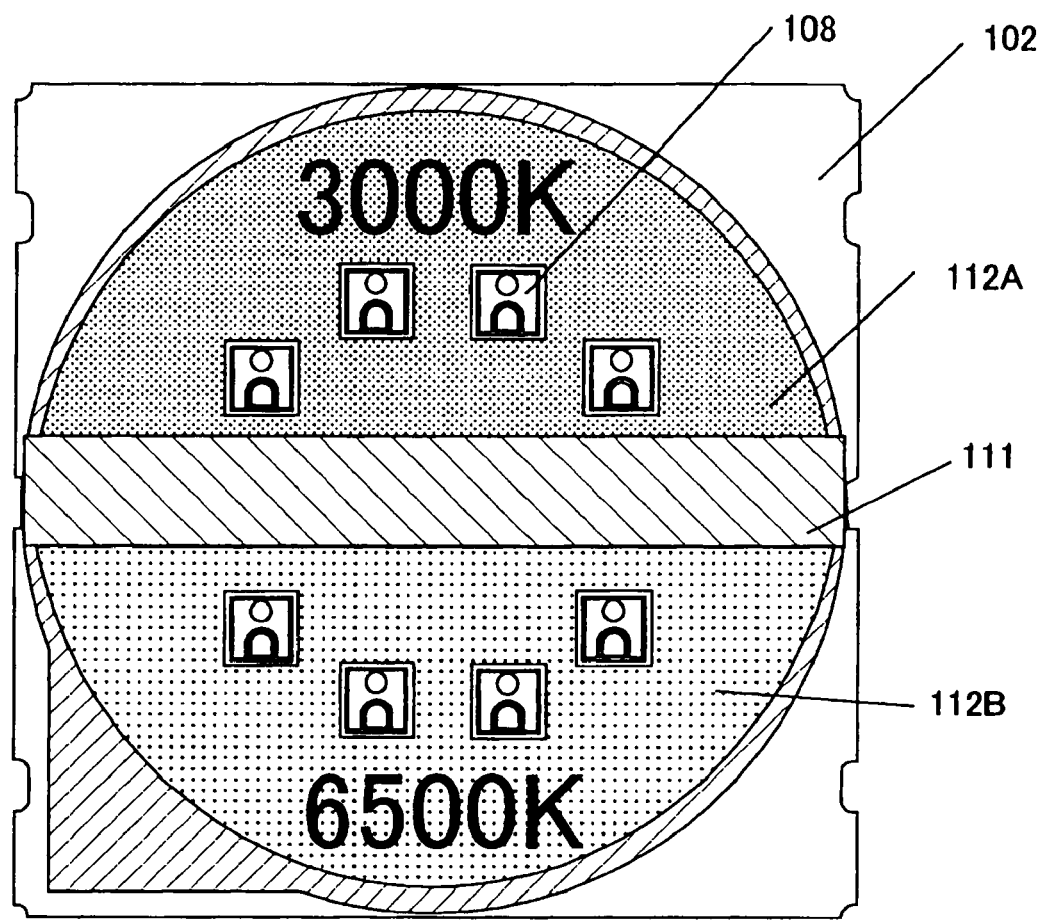
FIG. 26 is a view illustrating a rough configuration of a light-emitting module constituted of a semiconductor light-emitting device according to an Example of the invention.
Figure 27:
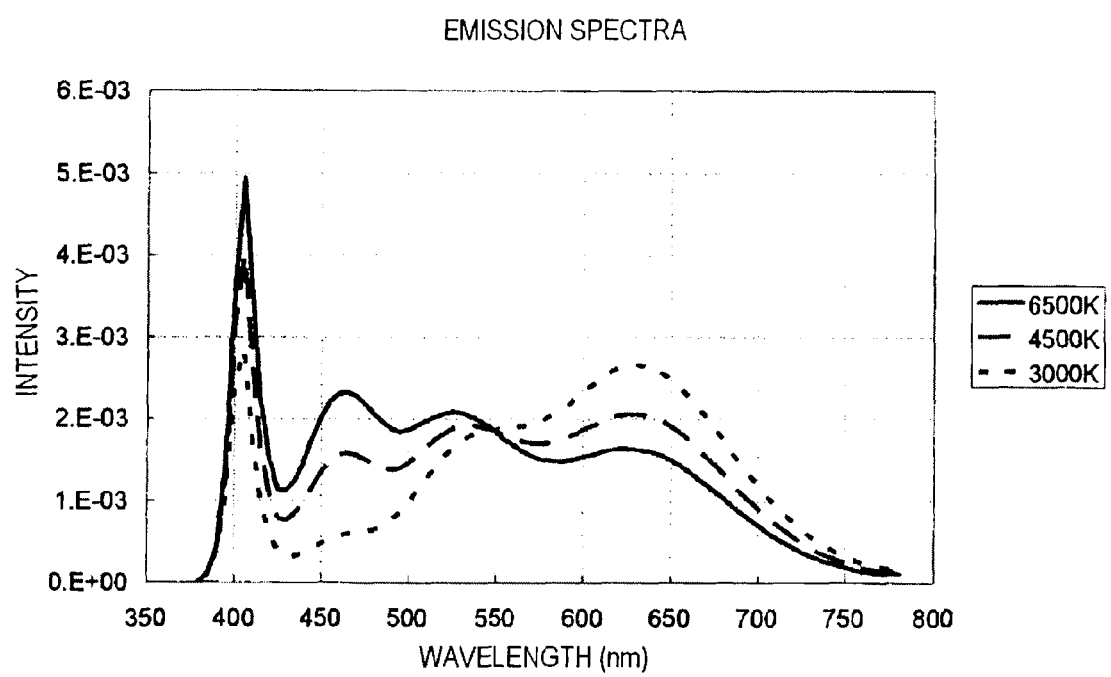
FIG. 27 is a diagram showing the measurement results of an emission spectrum of the light-emitting module shown in FIG. 26.

The light-emitting device 108 described above may be used to configure an illuminating device which illuminates an object. For example, a plurality of light-emitting devices 108 may be arranged over a certain area so that the emission direction of outputted light from each light-emitting device 108 is directed to an object to be illuminated. An example thereof is shown in FIG. 26 to FIG. 28. By configuring the illuminating device shown in these figures, the illuminating light emitted therefrom can be inhibited from separating on illuminated surfaces.

FIG. 26 shows a rough configuration of a light-emitting module corresponding to the light-emitting device 108. For the light-emitting module, use was made of a surface-mount-device type package made of ceramic which had external dimensions of 8 mm by 8 mm by 1.5 mm (thickness) and the inside of which had been divided into two. The two divided regions in this package correspond to the divided regions 112. The semiconductor light-emitting elements, phosphors, and encapsulating material (light-transmitting material) used in this light-emitting module are as follows.

<Semiconductor Light-Emitting Elements>

GaN-based light-emitting diodes (LEDs) having a peak wavelength of 405 nm, half-width of 30 nm, and size of 350 μm×350 μm and produced on a sapphire substrate were used.

<Phosphors>

Use was made of:

blue phosphor: $Ba_{0.7}Eu_{0.3}MgAl_{10}O_{17}$; peak wavelength of main emission peak, 457 nm; weight median diameter, 11 μm, green phosphor: $Ba_{1.39}Sr_{0.46}Eu_{0.15}SiO_4$; peak wavelength of main emission peak, 525 nm; weight median diameter, 20 μm, and red phosphor: $(1-x)Ca_{0.9925}Eu_{0.0075}AlSiN_3 \cdot xSi_2N_2O$ (x=0.09-0.12); peak wavelength of main emission peak, 638 nm; weight median diameter, 13 μm.

<Encapsulating Member>

A one-pack type transparent silicone resin was used as an encapsulating member for dispersing the phosphors therein.

Four light-emitting devices (108) comprising the near-ultraviolet LEDs were mounted in each of the two divided regions formed in the package shown in FIG. 26. Numeral 102 denotes a substrate, and 111 denotes a partition. In the package, the four light-emitting devices in each region have been connected in parallel so that a voltage can be separately applied to the two divided regions (112A and 112B). The encapsulating member containing dispersed therein the phosphors mixed together in a regulated proportion so as to result in a low color temperature (3,000K) having a deviation duv from a blackbody radiation locus BBL within the range of −0.02≦duv≦0.02 was introduced into one of the two divided regions of the package, and the encapsulating member containing dispersed therein the phosphors mixed together in a regulated proportion so as to result in a high color temperature (6,500K) having a deviation duv from a blackbody radiation locus BBL within the range of −0.02≦duv≦0.02 was introduced into the other divided region. The encapsulating member was cured by heating.

With respect to the illuminating module shown in FIG. 26, data on total luminous flux, color rendering properties (Ra), color temperature, etc. were acquired. In examining the illuminating module, a large integrating sphere was used for the whole module. The emission spectrum was spectroscopically analyzed with a multi-channel spectroscope to acquire data on total luminous flux, color rendering properties (Ra), color temperature, etc. With respect to voltage application to the LED light sources, the module as a whole was kept at a constant current value and the current was distributed between the two divided regions to thereby change the emission power of the low-color-temperature region and that of the high-color-temperature region. The illuminating module was thus regulated so as to output light having color temperatures in the range from 3,000K to 6,500K.

The results of the measurement are shown in the following Table 2 and in FIG. 27 and FIG. 28. At representative color temperatures of 3,000K, 4,500K, and 6,500K, the module had total luminous fluxes of 136 lm, 131 lm, and 128 lm, respectively. The total luminous fluxes were constant throughout the whole color temperature range. At color temperatures of 3,000K, 4,500K, and 6,500K, the module had color rendering indexes Ra of 94, 98, and 97, respectively. The module retained high color rendering properties throughout the whole color temperature range. As shown in Table 2, the illuminating module employing LED light sources, which had been configured using near-ultraviolet LEDs in combination with R, G, and B phosphors as described above, scarcely changed in total luminous flux (emission efficiency) and were stably high in color rendering index Ra in the color temperature range from 3,000K to 6,500K. The module was found to be an excellent illuminating device.

TABLE 2

|  | 6500 K | 6000 K | 5500 K | 5000 K | 4500 K | 4000 K | 3500 K | 3000 K |
| --- | --- | --- | --- | --- | --- | --- | --- | --- |
| Chromaticity x | 0.310 | 0.321 | 0.331 | 0.346 | 0.361 | 0.381 | 0.408 | 0.443 |
| Chromaticity y | 0.332 | 0.340 | 0.347 | 0.357 | 0.368 | 0.382 | 0.401 | 0.425 |
| Total luminous flux (lm) | 128 | 127 | 128 | 129 | 130 | 132 | 133 | 136 |
| Color rendering index Ra | 97 | 97 | 97 | 97 | 98 | 98 | 97 | 94 |

Figure 3:
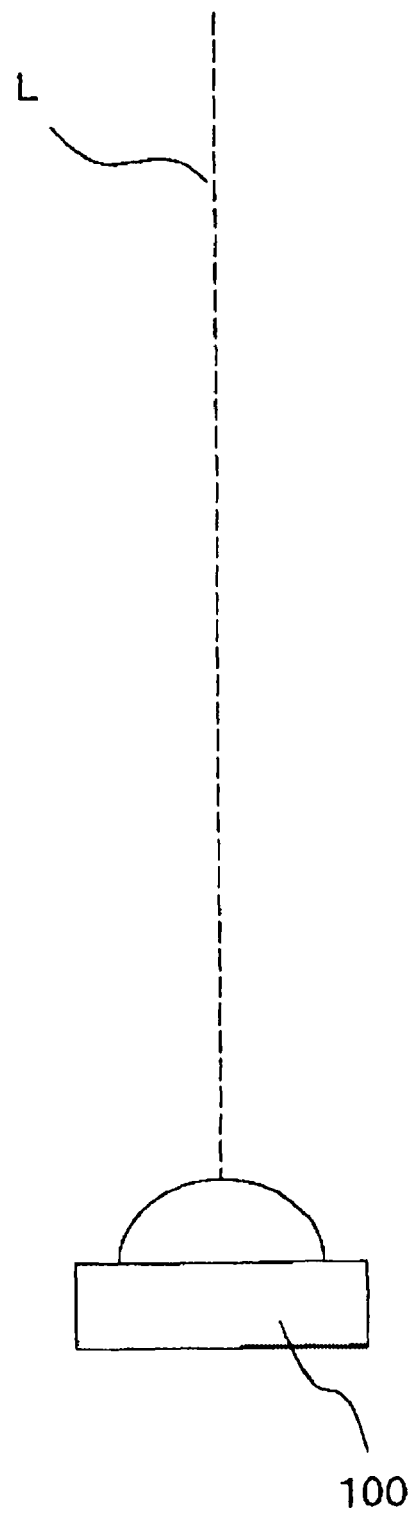
FIG. 3 is a view illustrating the structural axis of an LED.

Table 3 shows, in terms of numerical value, correlations between wavelength and emission intensity in emission spectra when the correlated color temperature of light emitted from the semiconductor light-emitting device is changed in the range from 3,000K to 6,500K. The numerical values show relative emission intensities measured under respective conditions, when the value of emission intensity measured at a correlated color temperature of 4,500K and an emission spectrum wavelength of 550 nm is taken as a reference value (=1.00). As shown in FIG. 3, when the correlated color temperature of light emitted from the semiconductor light-emitting device changes in the range from 3,000K to 6,500K, the absolute values of the resultant changes in the intensity of the emitted light is within the range of 10%. Namely, by suitably combining semiconductor light-emitting elements, phosphors, an encapsulating member, and a package, a semiconductor light-emitting device can be obtained in which the absolute values of changes in emission intensity observed under those conditions is within the range of 10% when the emission spectrum wavelengths are in the range of from 540 nm to 560 nm. Besides combinations of the phosphors shown above, i.e., blue phosphor $Ba_{0.7}Eu_{0.3}MgAl_{10}O_{17}$, green phosphor $Ba_{1.39}Sr_{0.46}Eu_{0.15}SiO_4$, and red phosphor $(1-x)Ca_{0.9925}Eu_{0.0075}AlSiN_3 \cdot xSi_2N_2O$ (x=0.09-0.12), examples of combinations of phosphors include combinations which include $Ba_3Si_6O_{12}N_2$:Eu or the like as a green phosphor and $Sr_{0.792}Ca_{0.2}AlSiEu_{0.008}N_3$, $CaAlSiN_3$:Eu, or the like as a red phosphor.

As described above, a semiconductor light-emitting device is regulated so that when the correlated color temperature of light emitted from the semiconductor light-emitting device changes from 3,000K to 6,500K, the absolute values of the resultant changes in emission intensity are within the range of 10% when the emission spectrum wavelengths are in the range of 540-560 nm. As a result, the semiconductor light-emitting elements can be inhibited from changing in luminance as shown in FIG. 25, even when the electric current supplied to the semiconductor light-emitting elements is constant. This semiconductor light-emitting device can have enhanced luminance stability. Emitted light having the wavelength range of from 540 nm to 560 nm gives a greatest luminous stimulus to human vision. It can hence be understood that luminance stability within that wavelength range is exceedingly useful.

TABLE 3

| 550 nm @ 4500 K reference (1.00) | 6500 K | 6000 K | 5500 K | 5000 K | 4500 K | 4000 K | 3500 K | 3000 K |
|---|---|---|---|---|---|---|---|---|
| 510 nm | 1.07 | 1.02 | 0.99 | 0.95 | 0.90 | 0.84 | 0.76 | 0.69 |
| 515 nm | 1.10 | 1.05 | 1.03 | 0.99 | 0.95 | 0.90 | 0.83 | 0.76 |
| 520 nm | 1.12 | 1.07 | 1.05 | 1.02 | 0.99 | 0.94 | 0.89 | 0.83 |
| 525 nm | 1.14 | 1.10 | 1.08 | 1.05 | 1.02 | 0.99 | 0.94 | 0.90 |
| 530 nm | 1.13 | 1.10 | 1.08 | 1.06 | 1.04 | 1.01 | 0.97 | 0.94 |
| 535 nm | 1.11 | 1.08 | 1.07 | 1.06 | 1.05 | 1.03 | 1.00 | 0.98 |
| 540 nm | 1.08 | 1.06 | 1.05 | 1.05 | 1.04 | 1.03 | 1.01 | 1.00 |
| 545 nm | 1.05 | 1.03 | 1.03 | 1.03 | 1.02 | 1.02 | 1.01 | 1.01 |
| 550 nm | 1.00 | 0.98 | 0.99 | 1.00 | 1.00 | 1.00 | 1.00 | 1.02 |
| 555 nm | 0.95 | 0.95 | 0.96 | 0.97 | 0.98 | 0.98 | 0.99 | 1.02 |
| 560 nm | 0.92 | 0.92 | 0.93 | 0.94 | 0.96 | 0.98 | 0.99 | 1.03 |
| 565 nm | 0.88 | 0.88 | 0.90 | 0.92 | 0.94 | 0.96 | 0.99 | 1.04 |
| 570 nm | 0.85 | 0.86 | 0.88 | 0.90 | 0.93 | 0.96 | 0.99 | 1.05 |
| 575 nm | 0.83 | 0.84 | 0.86 | 0.89 | 0.93 | 0.96 | 1.00 | 1.07 |
| 580 nm | 0.81 | 0.83 | 0.86 | 0.89 | 0.93 | 0.97 | 1.02 | 1.10 |
| 585 nm | 0.81 | 0.83 | 0.86 | 0.90 | 0.94 | 0.99 | 1.05 | 1.14 |
| 590 nm | 0.81 | 0.83 | 0.86 | 0.91 | 0.96 | 1.01 | 1.07 | 1.17 |

While the invention has been described in detail and with reference to specific embodiments thereof, it will be apparent to one skilled in the art that various changes and modifications can be made therein without departing from the spirit and scope thereof.

This application is based on a Japanese patent application filed on Nov. 12, 2007 (Application No. 2007-293602) and a Japanese patent application filed on Mar. 6, 2008 (Application No. 2008-056336), the contents thereof being herein incorporated by reference.

Industrial Applicability

The invention can provide an illuminating device comprising semiconductor light-emitting devices employing a semiconductor light-emitting element and in which outputted light is stably combined to inhibit light separation, color tone is changeable, and control for operating the light-emitting devices is as simple as possible.

The invention claimed is:

1. An illuminating device comprising: a first to an Nth solid-state light-emitting device, wherein:
   N is an integer equal to or greater than two;
   first to Nth solid-state light-emitting devices differ in emission color, and each comprises a semiconductor light-emitting element having an emission peak wavelength in a range of 350 nm to 430 nm and having an emission region belonging to near-ultraviolet region or ultraviolet region; and a phosphor and emits a primary light on the basis of an emission from the semiconductor light-emitting element and an emission from the phosphor which is excited by said emission from the semiconductor light-emitting element to fluoresce, or on the basis of an emission from the phosphor which is excited by an emission from the semiconductor light-emitting element to fluoresce;
   the first to Nth solid-state light-emitting devices each have an emission color, the deviation duv of which from a blackbody radiation locus being within a range of $-0.02 \leq duv \leq 0.02$, in the uv chromaticity diagram according to USC (u,v) color system (CIE 1960); and
   a synthesized light which is synthesized from primary lights emitted by the first to Nth solid-state light-emitting devices is emitted outward.

2. The illuminating device according to claim 1, wherein at least one solid-state light-emitting device among the first to Nth solid-state light-emitting devices has a positive value of the deviation duv of an emission color.

3. The illuminating device according to claim 1, further comprising an emission intensity control part which controls electric power supplied to each of the first to Nth solid-state light-emitting devices and thereby controls a color of the synthesized light.

4. The illuminating device according to claim 3, wherein the emission intensity control part controls a correlated color temperature of the synthesized light by controlling electrical power supplied to the first to Nth solid-state light-emitting devices in order to change a predetermined amount of a reciprocal correlated color temperature of the synthesized light.

5. The illuminating device according to claim 3, wherein the emission intensity control part controls the electric power supplied to the first to Nth solid-state light-emitting devices by reciprocal correlated color temperature of the synthesized light.

6. The illuminating device according to claim 5, further comprising a request reception part, which receives a request from a user for regulation of correlated color temperatures of the synthesized light through a change in a given parameter amount associated with the correlated color temperatures, and wherein
   the emission intensity control part controls the electric power supplied to the first to Nth solid-state light-emitting devices by reciprocal correlated color temperatures so that the given parameter in the request for regulation received by the request reception part changes in proportion to a change in the correlated color temperature of the synthesized light.

7. The illuminating device according to claim 3, wherein N is two, and the emission intensity control part controls each the first to Nth solid-state light-emitting devices to regulate the emission color of the synthesized light so as to result in a chromaticity point, which is located on straight lines connecting two chromaticity points respectively corresponding to the emission colors of the lights from the first to Nth solid-state light-emitting devices.

8. The illuminating device according to claim 3, wherein the emission intensity control part supplies the electric power to the first to Nth solid-state light-emitting devices with a PWM control to control correlated color temperature of the synthesized light.

9. The illuminating device according to claim 3, further comprising a circuit in which n1th and n2th solid-state light-emitting devices, which are selected from the first to Nth solid-state light-emitting devices are parallel-connected so as to have forward bias directions opposite from each other, wherein n1 and n2 are integers of 1 or more and N or less, respectively, and n1 is not equal to n2, and the emission intensity control part applies an alternating-current voltage having a square waveform to the circuit and controls a duty ratio of the alternating-current voltage having a square waveform.

10. The illuminating device according to claim 3, wherein N is three or more, and the emission intensity control part controls each of the first to Nth solid-state light-emitting devices to regulate the color of the synthesized light so as to result in a chromaticity point, which is located within a polygon formed by the straight lines connecting a plurality of chromaticity points respectively corresponding to emission colors of lights from the first to Nth solid-state light-emitting devices.

11. The illuminating device according to claim 1, wherein the first to Nth solid-state light-emitting devices comprises, as the phosphor, a blue phosphor, which emits a blue florescence upon excitation by an emission from the semiconductor light-emitting element, a green phosphor, which emits a green florescence upon excitation by an emission from the semiconductor light-emitting element, and a red phosphor, which emits a red florescence upon excitation by an emission from the semiconductor light-emitting element.

12. The illuminating device according to claim 1, wherein the first to Nth light-emitting devices further comprise a light-transmitting material which encapsulates the semiconductor light-emitting element and the phosphor.

13. The illuminating device according to claim 12, wherein the light-transmitting material is a silicon-comprising compound.

14. The illuminating device according to claim 1, wherein the emission color of the first to Nth light-emitting devices has a correlated color temperature in a range of 2,000K to 50,000K.

15. The illuminating device according to claim 1, wherein the correlated color temperature of the synthesized light is variable within a range of 3,000K to 6,500K, and when the correlated color temperature is changed from 3,000K to 6,500K, an absolute value of a percentage change in the emission intensity is 10% or less in the wavelength range of the wavelength of a spectrum of the synthesized light of 540 to 560 nm.

16. The illuminating device according to claim 1, wherein the phosphors comprise a blue phosphor, a green phosphor and a red phosphor.

17. An illuminating device comprising a light-emitting module comprising:

at least a package;

a semiconductor light-emitting element having an emission peak wavelength in the range of 350 nm or more to 430 nm or less; and a phosphor, wherein the light-emitting module emits light outward on the basis of an emission from the semiconductor light-emitting element and an emission from the phosphor, which is excited by said emission from the semiconductor light-emitting element to fluoresce, or on the basis of an emission from the phosphor which is excited by an emission from the semiconductor light-emitting element to fluoresce, wherein the package has an opening which is open in an emission direction for the light-emitting module and a plurality of divided regions demarcated by partitioning the inside of the package, each of the divided regions being open at a divided opening which is a part of said opening, wherein each of the plurality of the divided regions comprises:

one or more of the semiconductor light-emitting elements;

a power supply part which supplies electric power to the semiconductor light-emitting element; and a fluorescent part comprising the phosphor and a light-transmitting material, which fills up the divided region, and wherein, among the plurality of the divided regions, at least one divided region is different from at least one other divided region in a spectrum of a primary light from the fluorescent part, wherein each of the-primary light has an emission color, the deviation duv of which from a blackbody radiation locus is within a range of $-0.02 \leqq duv \leqq 0.02$, in the uv chromaticity diagram according to UCS (u,v) color system (CIE 1960), and wherein a synthesized light which is synthesized from each of the primary light from said at least one divided region and the primary light from said at least one other divided region is emitted outward.

18. The illuminating device according to claim 17, which further comprises an emission intensity control part which controls, through the power supply part, the electric power supplied to the semiconductor light-emitting element in each of the plurality of the divided regions and thereby independently controls the emission intensity of the primary light from each of the divided regions.

19. The illuminating device according to claim 18, wherein the emission intensity control part controls the electric power supplied to the semiconductor light-emitting element in each of the plurality of the divided regions in order to change a predetermined amount of a reciprocal correlated color temperature of the synthesized light.

20. The illuminating device according to claim 18, which comprises a request reception part which receives a request from a user for regulation of the correlated color temperatures of the synthesized light through a change in a given parameter amount associated with the correlated color temperatures, and wherein the emission intensity control part controls the electric power supplied to the semiconductor light-emitting element in each of the plurality of the divided regions on the basis of the reciprocal correlated color temperatures so that the given parameter in the request for regulation received by the request reception part changes in proportion to a change in the correlated color temperature of the synthesized light.

21. The illuminating device according to claim 18, wherein the power supply part comprises a plurality of wiring lines for supplying the electric power to the semiconductor light-emitting elements included in the plurality of the divided regions, and wherein the emission intensity control part controls, through the plurality of the wiring lines, the electric power supplied to the semiconductor light-emitting elements, the power supply for each of the divided regions being independently controlled.

22. The illuminating device according to claim 18, wherein the semiconductor light-emitting element comprises paired input electrodes having a polarity in the electric power supplied, the power supply part comprises a pair of wiring lines to which the paired input electrodes are respectively connected, the connection of the semiconductor light-emitting element in a part of the divided regions, which comprise said at least one divided region, to the wiring lines is in a polarity-inverted state with respect to the connection of the semiconductor light-emitting element in the remaining part of the divided regions, which comprises at least one other divided region to the wiring lines, and wherein the emission intensity control part supplies an alternating-current power to the pair of wiring lines.

23. The illuminating device according to claim 22, wherein the emission intensity control part applies an alternating-current voltage having a square waveform to the pair of wiring lines and controls a duty ratio of the alternating-current voltage having a square waveform.

24. The illuminating device according to claim 18, wherein the emission intensity control part controls each of the plurality of the divided regions to regulate the emission color of the synthesized light so as to result in a chromaticity point, which is located on straight lines connecting a plurality of chromaticity points respectively corresponding to the emission colors of the lights from the plurality of the divided regions, or which is located within a polygon formed by the straight lines.

25. The illuminating device according to claim 17, wherein the light-transmitting material is a silicon-comprising compound.

26. The illuminating device according to claim 17, wherein the emission color of the divided region has a correlated color temperature in a range of 2,000K to 50,000K.

\* \* \* \* \*